(12) United States Patent
Yamamoto et al.

(10) Patent No.: US 10,361,724 B2
(45) Date of Patent: Jul. 23, 2019

(54) DATA PROCESSING DEVICE AND DATA PROCESSING METHOD FOR IMPROVING RESISTANCE TO ERROR OF DATA

(71) Applicant: SATURN LICENSING LLC, New York, NY (US)

(72) Inventors: Makiko Yamamoto, Tokyo (JP); Yuji Shinohara, Kanagawa (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 15/971,706

(22) Filed: May 4, 2018

(65) Prior Publication Data
US 2018/0254783 A1 Sep. 6, 2018

Related U.S. Application Data

(63) Continuation of application No. 13/996,108, filed as application No. PCT/JP2011/079928 on Dec. 22, 2011, now abandoned.

(30) Foreign Application Priority Data

Dec. 28, 2010 (JP) .................................. 2010-292210
Jan. 13, 2011 (JP) .................................. 2011-005189

(51) Int. Cl.
*H03M 13/13* (2006.01)
*H03M 13/27* (2006.01)
(Continued)

(52) U.S. Cl.
CPC ....... *H03M 13/13* (2013.01); *H03M 13/1165* (2013.01); *H03M 13/255* (2013.01);
(Continued)

(58) Field of Classification Search
None
See application file for complete search history.

(56) References Cited

U.S. PATENT DOCUMENTS 8,261,152 B2 9/2012 Myung et al.
8,402,337 B2 3/2013 Yokokawa et al.
(Continued)

FOREIGN PATENT DOCUMENTS

CN 101874350 A 8/2009
CN 101911504 A 12/2010
(Continued)

OTHER PUBLICATIONS

Xi Huang, et al., "Girth 4 and Low Minimum Weights' Problems of LDPC Codes in DVB-S2 and Solutions", Proceedings of the 5$^{th}$ International Conference on Wireless Communications, Networking and Mobile Computing, IEEE, 2009, 4 pages.
(Continued)

*Primary Examiner* — Justin R Knapp
(74) *Attorney, Agent, or Firm* — Oblon, McClelland, Maier & Neustadt, L.L.P.

(57) ABSTRACT

A data processing device and a data processing method capable of improving resistance to error of data. An LDPC encoder encodes by an LDPC code whose code length is 16200 bits and code rate is 4/15, 7/15, or 8/15. A parity check matrix of the LDPC code is composed by arrangement of an element of an information matrix determined by a parity check matrix initial value table indicating a position of the element of the information matrix corresponding to an information length corresponding to the code length and the code rate for each 360 columns of the parity check matrix with a period of 360 columns in a column direction. The parity check matrix initial value table is for digital broadcasting for a mobile terminal, for example. This technology
(Continued)

may be applied to a case in which LDPC encoding and LDPC decoding are performed.

17 Claims, 58 Drawing Sheets

(51) Int. Cl.
    *H03M 13/11* (2006.01)
    *H03M 13/25* (2006.01)
    *H03M 13/00* (2006.01)
    *H03M 13/29* (2006.01)
    *H03M 13/15* (2006.01)

(52) U.S. Cl.
    CPC ..... *H03M 13/271* (2013.01); *H03M 13/2707* (2013.01); *H03M 13/2906* (2013.01); *H03M 13/6552* (2013.01); *H03M 13/152* (2013.01)

(56) References Cited

U.S. PATENT DOCUMENTS

| | | | |
|---|---|---|---|
| 8,489,956 | B2 | 7/2013 | Yokokawa et al. |
| 2009/0210767 | A1 | 8/2009 | Myung et al. |
| 2010/0325512 | A1 | 12/2010 | Yokokawa et al. |
| 2013/0227378 | A1 | 8/2013 | Yamamoto et al. |
| 2013/0254617 | A1 | 9/2013 | Shinohara et al. |
| 2013/0290816 | A1 | 10/2013 | Shinohara et al. |
| 2013/0305113 | A1 | 11/2013 | Shinohara et al. |
| 2014/0040707 | A1 | 2/2014 | Shinohara et al. |
| 2014/0047295 | A1 | 2/2014 | Shinohara et al. |
| 2014/0082452 | A1 | 3/2014 | Shinohara et al. |

FOREIGN PATENT DOCUMENTS

| | | |
|---|---|---|
| EP | 2 214 319 A1 | 8/2010 |
| JP | 2009-224320 A | 10/2009 |
| JP | 2012-124623 A | 6/2012 |
| JP | 2012-151653 A | 8/2012 |
| JP | 2012-151654 A | 8/2012 |
| JP | 2012-151655 A | 8/2012 |
| JP | 2012-151656 A | 8/2012 |
| TW | 201010295 A | 11/2005 |
| WO | 2009/104319 A1 | 8/2009 |
| WO | 2009/104898 A2 | 8/2009 |
| WO | 2009/116204 A1 | 9/2009 |
| WO | 2009/069627 A1 | 8/2012 |

OTHER PUBLICATIONS

ETSI EN 302 307 V1.1.2 (Jun. 2006), Digital Video Broadcasting (DVB); Second generation framing structure, channel coding and modulation systems for Broadcasting, Interactive Services, News Gathering and other broadband satellite applications, European Standard (Telecommunications series), ETSI, 2006, 74 pages.
Office Action issued in Chinese Patent Application No. 201180066767.9 dated Aug. 31, 2015 (with English translation).
International Search Report issued in PCT/JP2011/079928 dated Jan. 24, 2012 (with English translation).
Written Opinion of the international Searching Authority issued in PCT/JP2011/079928 dated Jan. 24, 2012 (with English translation).
Notice of Grant issued in Japanese Application No. 2011-005189 dated Sep. 9, 2014.
Extended European Search Report dated Feb. 10, 2016 in corresponding European Patent Application No. 11852947.8, 7 pages.
Makiko Kan,"New 16k LDPC Codes for DVB-NGH", DVB-NGH, XP017832619, Dec. 12, 2010, pp. 1-27.
Makiko Kan, "Updated Data for New 16k LDPC Codes", DVB-NGH, XP017834323, Feb. 16, 2011, 6 pages.
DVB Organization: "Final Draft ETSI EN 302 755 V. 1.1.1; Digital Video Broadcasting (DVB); Frame Structure Channel Coding and Modulation for a Second Generation Digital Terrestrial Television Broadcasting System (DVB-T2)", European Standard (Telecommunicati0ns Series), XP14044393, Jul. 2009, pp. 1-167.

BACKGROUND ART
*FIG. 3*

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

CHECK NODE

VARIABLE NODE

PARITY MATRIX $H_T$

BACKGROUND ART
FIG. 13

| Nominal CODE RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

NUMBER OF COLUMNS OF EACH COLUMN WEIGHT

FIG. 25

| REQUIRED NUMBER OF MEMORY COLUMNS mb | b=1 (FIRST TO THIRD INTERCHANGING SCHEMES) | b=2 (FOURTH INTERCHANGING SCHEME) | WRITING START POSITION OF EACH OF mb COLUMNS |||||||||||||||||||||||
|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 22 | 23 | 23 | 26 | 37 | 39 | 40 | 41 | 41 | 41 |

FIG. 26

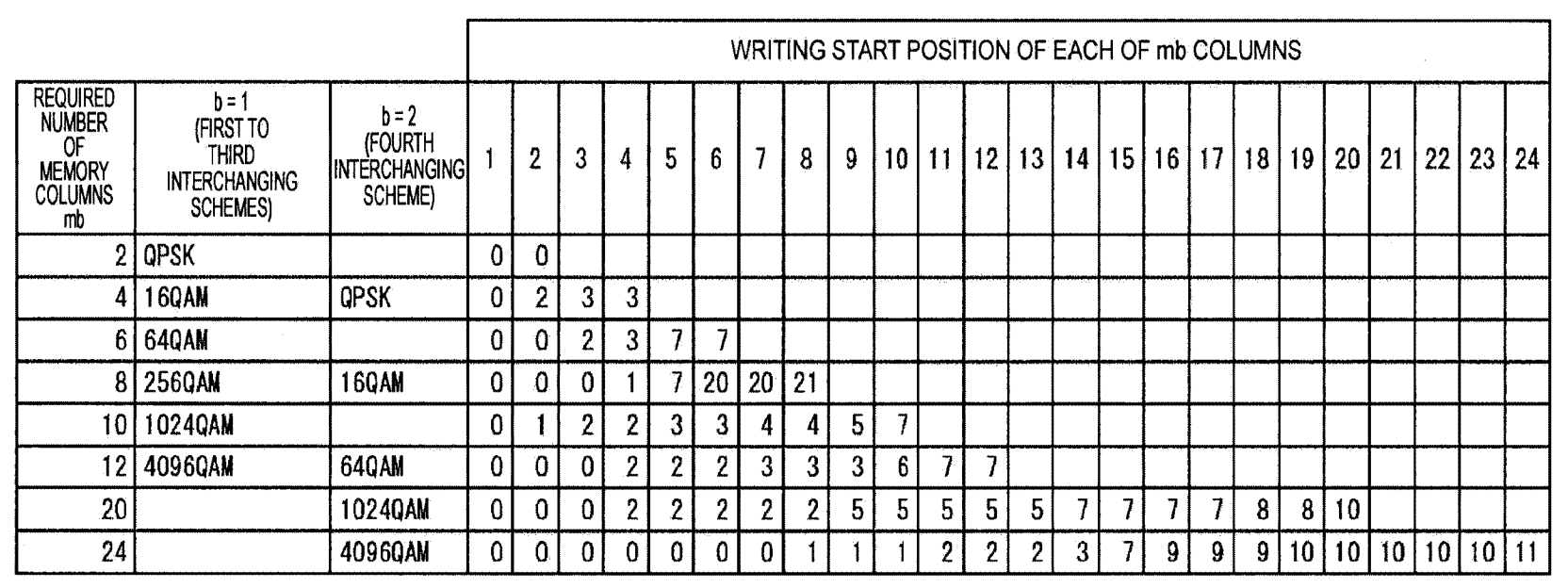

| REQUIRED NUMBER OF MEMORY COLUMNS mb | b=1 (FIRST TO THIRD INTERCHANGING SCHEMES) | b=2 (FOURTH INTERCHANGING SCHEME) | WRITING START POSITION OF EACH OF mb COLUMNS |||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

PARITY CHECK MATRIX INITIAL VALUE
TABLE IN WHICH N = 16200 AND r = 1/5

PARITY CHECK MATRIX INITIAL VALUE TABLE
IN WHICH N = 16200 AND r = 4/15

PARITY CHECK MATRIX INITIAL VALUE
TABLE IN WHICH N = 16200 AND r = 1/3

PARITY CHECK MATRIX INITIAL VALUE
TABLE IN WHICH N = 16200 AND r = 2/5

```
PARITY CHECK MATRIX INITIAL VALUE
TABLE IN WHICH N = 16200 AND r = 4/9

PARITY CHECK MATRIX INITIAL VALUE
TABLE IN WHICH N = 16200 AND r = 7/15

PARITY CHECK MATRIX INITIAL VALUE TABLE
IN WHICH N = 16200 AND r = 8/15

```
PARITY CHECK MATRIX INITIAL VALUE TABLE
IN WHICH N = 16200 AND r = 3/5

PARITY CHECK MATRIX INITIAL VALUE
TABLE IN WHICH N = 16200 AND r = 2/3

76 545 1005 1029 1390 1970 2525 2971 3448 3845 4088 4114 4163 4373 4640 4705 4970 5094
14 463 600 1676 2239 2319 2326 2815 2887 4278 4457 4493 4597 4918 4989 5038 5261 5384
451 632 829 1006 1530 1723 2205 2587 2801 3041 3849 4382 4595 4727 5006 5156 5224 5286
211 265 1293 1777 1926 2214 2909 2957 3178 3278 3771 4547 4563 4737 4879 5068 5232 5344
6 2901 3925 5384
2858 4152 5006 5202
9 1232 2063 2768
7 11 2781 3871
12 2161 2820 4078
3 3510 4668 5323
253 411 3215 5241
3919 4789 5040 5302
12 5113 5256 5352
9 1461 4004 5241
1688 3585 4480 5394
8 2127 3469 4360
2827 4049 5084 5379
1770 3331 5315 5386
1885 2817 4900 5088
2568 3854 4660
1604 3565 5373
2317 4636 5156
2480 2816 4094
14 4518 4826
127 1192 3872
93 2282 3663
2962 5085 5314
2078 4277 5089
9 5280 5292
50 2847 4742

| CODE RATE | MINIMAL CYCLE LENGTH | PERFORMANCE THRESHOLD (Eb/No) |
|---|---|---|
| 1/5 | 8 | 0.15 |
| 4/15 | 8 | −0.21 |
| 1/3 | 6 | −0.01 |
| 2/5 | 6 | 0.01 |
| 4/9 | 6 | 0.17 |
| 7/15 | 6 | 0.36 |
| 8/15 | 6 | 0.64 |
| 3/5 | 8 | 1.00 |
| 2/3 | 6 | 1.35 |

FIG. 48

| rate | X | KX | Y1 | KY1 | Y2 | KY2 | M |
|---|---|---|---|---|---|---|---|
| 1/5 | 36 | 720 | 5 | 360 | 4 | 2160 | 12960 |
| 4/15 | 21 | 1080 | 4 | 2160 | 3 | 1080 | 11880 |
| 1/3 | 30 | 1080 | 4 | 2880 | 3 | 1440 | 10800 |
| 2/5 | 32 | 1080 | 4 | 3240 | 3 | 2160 | 9720 |
| 4/9 | 25 | 1440 | 4 | 1440 | 3 | 4320 | 9000 |
| 7/15 | 24 | 1440 | 4 | 2880 | 3 | 3240 | 8640 |
| 8/15 | 21 | 1800 | 4 | 1800 | 3 | 5040 | 7560 |
| 3/5 | 13 | 2520 | 3 | 7200 | — | 0 | 6480 |
| 2/3 | 18 | 1440 | 4 | 5400 | 3 | 3960 | 5400 |

DATA PROCESSING DEVICE AND DATA PROCESSING METHOD FOR IMPROVING RESISTANCE TO ERROR OF DATA

CROSS-REFERENCE TO RELATED APPLICATIONS

This application is a continuation of U.S. application Ser. No. 13/996,108, filed Jun. 20, 2013, which is a U.S. National Stage application of International Application No. PCT/JP2011/079928, filed Dec. 22, 2011, which claims priority to Japanese Application Nos. 2011-005189, filed Jan. 13, 2011, and 2010-292210, filed Dec. 28, 2010, the entire contents of which are incorporated herein by reference.

TECHNICAL FIELD

This technology relates to a data processing device and a data processing method and especially relates to the data processing device and the data processing method capable of improving resistance to error of data, for example.

BACKGROUND ART

An LDPC (low density parity check) code has high error correcting capability and recently, this begins to be widely adopted as a transmission scheme including digital satellite broadcasting such as DVB (digital video broadcasting)-S.2 used in Europe, for example (for example, refer to Non-Patent Document 1). Adoption of the LDPC code to next-generation digital terrestrial broadcasting is also considered.

Recent studies is proving that the LDPC code may obtain performance close to Shannon limit as a code length thereof is made longer as well as a turbo code and the like. The LDPC code characteristically has an advantage that a block error probability characteristic thereof is excellent and that a so-called error floor phenomenon observed in a decoding characteristic of the turbo code and the like scarcely occurs by its feature that a minimum distance is proportional to the code length.

Such LDPC code is hereinafter specifically described. Meanwhile, the LDPC code is a linear code and is not necessarily required to be a binary code; however, it is herein described supposing that this is the binary code.

The greatest characteristic of the LDPC code is that a parity check matrix defining the LDPC code is sparse. Herein, the sparse matrix is the matrix in which the number of elements "1" of the matrix is very small (most of elements are 0).

FIG. 1 illustrates an example of a parity check matrix H of the LDPC code.

In the parity check matrix H in FIG. 1, a weight of each column (column weight) (the number of "1") is "3" and the weight of each row (row weight) is "6".

In encoding by the LDPC code (LDPC encoding), a code word (LDPC code) is generated by generation of a generator matrix G based on the parity check matrix H and multiplication of the generator matrix G by a binary information bit, for example.

Specifically, an encoding device, which performs the LDPC encoding, first calculates the generator matrix G satisfying an equation $GH^T=0$ between the same and a transposed matrix $H^T$ of the parity check matrix H. Herein, when the generator matrix G is a K×N matrix, the encoding device multiplies a bit column (vector u) of K information bits by the generator matrix G to generate a code word c (=uG) composed of N bits. The code word (LDPC code) generated by the encoding device is received on a receiving side through a predetermined communication channel.

Decoding of the LDPC code may be performed by an algorithm suggested by Gallager as probabilistic decoding being a message passing algorithm by belief propagation on a so-called Tanner graph composed of a variable node (also referred to as a message node) and a check node. Hereinafter, the variable node and the check node are appropriately and simply referred to as a node.

FIG. 2 illustrates a procedure of the decoding of the LDPC code.

Meanwhile, a real value (received LLR) representing likelihood of a value to be "0" of an i-th code bit of the LDPC code (one cord word) received on the receiving side by a log likelihood ratio is hereinafter appropriately referred to as a received value $u_{0i}$. A message output from the check node is set to $u_j$ and the message output from the variable node is set to $v_i$.

First, in the decoding of the LDPC code, as illustrated in FIG. 2, the LDPC code is received, the message (check node message) $u_j$ is initialized to "0", and a variable k being an integer as a counter of a repetitive process is initialized to "0" at step S11 and the procedure shifts to step S12. At step S12, the message (variable node message) $v_i$ is obtained by an operation (variable node operation) represented in equation (1) based on the received value $u_{0i}$ obtained by receiving the LDPC code and the message $u_j$ is obtained by an operation (check node operation) represented in equation (2) based on the message $v_i$.

[Equation 1]
$$v_i = u_{0i} + \sum_{i=1}^{d_v-1} u_j \quad (1)$$

[Equation 2]
$$\tanh\left(\frac{u_j}{2}\right) = \prod_{i=1}^{d_c-1} \tanh\left(\frac{v_i}{2}\right) \quad (2)$$

Herein, $d_v$ and $d_c$ in equations (1) and (2) are parameters indicating the numbers of "1" in a vertical direction (column) and a horizontal direction (row) of the parity check matrix H, which may be optionally selected, and it is set that $d_v=3$ and $d_c=6$ in a case of a (3, 6) code, for example.

Meanwhile, in the variable node operation in equation (1) and the check node operation in equation (2), the message input from an edge (line connecting the variable node and the check node to each other) from which the message is to be output is not a target of the operation, so that a range of the operation is 1 to $d_v-1$ or 1 to $d_c-1$. Also, a table of a function $R(v_1, v_2)$ represented in equation (3) defined by one output with respect to two inputs $v_1$ and $v_2$ is created in advance and this is continuously (recursively) used as represented in equation (4) for actually performing the check node operation in equation (2).

[Equation 3]
$$x = 2 \tan h^{-1}\{\tan h(v_1/2)\tan h(v_2/2)\} = R(v_1, v_2) \quad (3)$$

[Equation 4]
$$u_j = R(v_1, R(v_2, R(v_3, \ldots R(v_{d_c-2}, v_{d_c-1})))) \quad (4)$$

At step S12, the variable k is incremented by 1 and the procedure shifts to step S13. At step S13, it is judged whether the variable k is larger than a predetermined number of times of repetitive decoding C. When it is judged that the variable k is not larger than C at step S13, the procedure returns to step S12 and a similar process is hereinafter repeatedly performed.

Also, when it is judged that the variable k is larger than C at step S13, the procedure shifts to step S14 to perform an operation represented in equation (5), so that the message $v_i$ as a decoding result to be finally output is obtained to be output and a decoding process of the LDPC code is finished.

[Equation 5]

$$v_i = u_{0i} + \sum_{j=1}^{d_y} u_j \quad (5)$$

Herein, different from the variable node operation in equation (1), the operation in equation (5) is performed using the messages $u_j$ from all the edges connected to the variable node.

FIG. 3 illustrates an example of the parity check matrix H of the (3, 6) LDPC code (code rate 1/2 and code length 12).

In the parity check matrix H in FIG. 3, the weight of the column is 3 and the weight of the row is 6 as in FIG. 1.

FIG. 4 illustrates the Tanner graph of the parity check matrix H in FIG. 3.

Herein, in FIG. 4, the check node is represented by plus "+" and the variable node is represented by equal "=". The check node and the variable node correspond to the row and the column of the parity check matrix H, respectively. A connection between the check node and the variable node is the edge, which corresponds to the element "1" of the parity check matrix.

That is to say, when a j-th row i-th column element of the parity check matrix is 1, in FIG. 4, an i-th variable node (node of "=") from the top and a j-th check node (node of "+") from the top are connected to each other by the edge. The edge indicates that the code bit corresponding to the variable node has a constraint condition corresponding to the check node.

In a sum product algorithm being the decoding method of the LDPC code, the variable node operation and the check node operation are repeatedly performed.

FIG. 5 illustrates the variable node operation performed in the variable node.

In the variable node, the message $v_i$ corresponding to the edge to be calculated is obtained by the variable node operation in equation (1) using the messages $u_1$ and $u_2$ from other edges connected to the variable node and the received value $u_{01}$. The message corresponding to another edge is similarly obtained.

FIG. 6 illustrates the check node operation performed in the check node.

Herein, the check node operation in equation (2) may be rewritten as equation (6) using relationship of an equation a×b=exp{ln(|a|)+ln(|b|)}×sign(a)×sign(b). Sign(x) is 1 when x≥0 is satisfied and −1 when x<0 is satisfied.

[Equation 6]

$$u_j = 2\tanh^{-1}\left(\prod_{i=1}^{d_o-1} \tanh\left(\frac{v_i}{2}\right)\right) \quad (6)$$

$$= 2\tanh^{-1}\left[\exp\left\{\sum_{i=1}^{d_o-1} \ln\left(\left|\tanh\left(\frac{v_i}{2}\right)\right|\right)\right\} \times \prod_{i=1}^{d_o-1} sign\left(\tanh\left(\frac{v_i}{2}\right)\right)\right]$$

$$= 2\tanh^{-1}\left[\exp\left\{-\left(\sum_{i=1}^{d_o-1} -\ln\left(\tanh\left(\frac{|v_i|}{2}\right)\right)\right)\right\} \times \prod_{i=1}^{d_o-1} sign(v_i)\right]$$

When a function $\phi(x)$ is defined by an equation $\phi(x)=\ln(\tan h(x/2))$ when $x \geq 0$ is satisfied, an equation $\phi^{-1}(x)=2\tan h^{-1}(e^{-x})$ is satisfied, so that equation (6) may be deformed to equation (7).

[Equation 7]

$$u_j = \phi^{-1}\left(\sum_{i=1}^{d_o-1} \phi(|v_i|)\right) \times \prod_{i=1}^{d_o-1} sign(v_i) \quad (7)$$

In the check node, the check node operation in equation (2) is performed according to equation (7).

That is to say, in the check node, the message $u_j$ corresponding to the edge to be calculated is obtained by the check node operation in equation (7) using messages $v_1$, $v_2$, $v_3$, $v_4$, and $v_5$ from other edges connected to the check node as illustrated in FIG. 6. The message corresponding to another edge is similarly obtained.

Meanwhile, the function $\phi(x)$ in equation (7) may be represented by an equation $\phi(x)=\ln((e^x+1)/(e^x-1))$ and $\phi(x)=\phi^{-1}(x)$ when $x>0$ is satisfied. When the functions $\phi(x)$ and $\phi^{-1}(x)$ are implemented in hardware, there is a case in which they are implemented using LUT (look up table), and the same LUT is used for both of them.

CITATION LIST

Non-Patent Document

Non-Patent Document 1: DVB-S.2: ETSI EN 302 307 V1.1.2 (2006-06)

SUMMARY OF THE INVENTION

Problems to be Solved by the Invention

The LDPC code is adopted in DVB-S.2 being a standard of the digital satellite broadcasting and DVB-T.2 being a standard of a next-generation digital terrestrial broadcasting. Also, adoption of the LDPC code in DVB-C.2 being a standard of next-generation digital CATV (cable television) broadcasting is scheduled.

In the digital broadcasting complying with the DVB standard such as DVB-S.2, the LDPC code is made a symbol of orthogonal modulation (digital modulation) such as QPSK (quadrature phase shift keying) (symbolized) and the symbol is mapped onto a signal point to be transmitted.

In the symbolization of the LDPC code, interchange of the code bits of the LDPC code is performed in units of two or more code bits and the code bit after the interchange is made the symbol bit.

Various schemes of interchanging the code bits for symbolizing the LDPC code are suggested and they also are specified in DVB-T.2, for example.

DVB-T.2 is the standard of the digital broadcasting for a fixed terminal such as a television receiver and the like installed in a home and the like and this might not be suitable for the digital broadcasting for a mobile terminal.

That is to say, it is required to make a circuit scale and power consumption smaller in the mobile terminal than in the fixed terminal. Therefore, in the digital broadcasting for the mobile terminal, in order to decrease a load required for the process such as the decoding of the LDPC code by the mobile terminal, there is a case in which the number of repetitions of the decoding of the LDPC code (number of times of repetitive decoding C), the code length of the LDPC code and the like are limited as compared to a case of the digital broadcasting for the fixed terminal, for example.

However, even under such limitation, it is required to maintain a certain degree of resistance to error.

This technology is realized in view of such a condition and an object thereof is to improve the resistance of the LDPC code and the like to error of the data.

Solutions to Problems

A data processing device according to a first aspect of this technology is provided with an encoder, which encodes information bits into a cord word whose code length is 16200 bits and code rate is 4/15 based on a parity check matrix of an LDPC (low density parity check) code, wherein the encoded LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 1953 2331 2545 2623 4653 5012 5700 6458 6875 7605 7694 7881
8416 8758 9181 9555 9578 9932 10068 11479 11699
514 784 2059 2129 2386 2454 3396 5184 6624 6825 7533 7861 9116
9473 9601 10432 11011 11159 11378 11528 11598
483 1303 1735 2291 3302 3648 4222 4522 5511 6626 6804 7404 7752
7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480.

A data processing method according to a first aspect of this technology is provided with an encoding step of encoding information bits into a cord word whose code length is 16200 bits and code rate is 4/15 based on a parity check matrix of an LDPC (low density parity check) code, wherein the encoded LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 1953 2331 2545 2623 4653 5012 5700 6458 6875 7605 7694 7881
8416 8758 9181 9555 9578 9932 10068 11479 11699

-continued 514 784 2059 2129 2386 2454 3396 5184 6624 6825 7533 7861 9116
9473 9601 10432 11011 11159 11378 11528 11598
483 1303 1735 2291 3302 3648 4222 4522 5511 6626 6804 7404 7752
7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480.

In the above-described first aspect, the information bits are encoded into the code word whose code length is 16200 bits and code rate is 4/15 based on the parity check matrix of the LDPC (low density parity check) code. The encoded LDPC code includes the information bit and the parity bit, the parity check matrix includes the information matrix part corresponding to the information bit and the parity matrix part corresponding to the parity bit, the information matrix part is represented by the parity check matrix initial value table, and the parity check matrix initial value table is a table indicating the position of the element 1 of the information matrix part for each 360 columns as 1953 2331 2545 2623 4653 5012 5700 6458 6875 7605 7694 7881
8416 8758 9181 9555 9578 9932 10068 11479 11699
514 784 2059 2129 2386 2454 3396 5184 6624 6825 7533 7861 9116
9473 9601 10432 11011 11159 11378 11528 11598
483 1303 1735 2291 3302 3648 4222 4522 5511 6626 6804 7404 7752
7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480.

A data processing device according to a second aspect of this technology is provided with an encoder, which encodes information bits into a cord word whose code length is 16200 bits and code rate is 7/15 based on a parity check matrix of an LDPC (low density parity check) code, wherein the encoded LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 3 137 314 327 983 1597 2028 3043 3217 4109 6020 6178 6535 6560
7146 7180 7408 7790 7893 8123 8313 8526 8616 8638
356 1197 1208 1839 1903 2712 3088 3537 4091 4301 4919 5068
6025 6195 6324 6378 6686 6829 7558 7745 8042 8382 8587 8602
18 187 1115 1417 1463 2300 2328 3502 3805 4677 4827 5551 5968
6394 6412 6753 7169 7524 7695 7976 8069 8118 8522 8582
714 2713 2726 2964 3055 3220 3334 3459 5557 5765 5841 6290
6419 6573 6856 7786 7937 8156 8286 8327 8384 8448 8539 8559
3452 7935 8092 8623
56 1955 3000 8242
1809 4094 7991 8489
2220 6455 7849 8548

1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

A data processing method according to a second aspect of this technology is provided with an encoding step of encoding information bits to a cord word whose code length is 16200 bits and code rate is 7/15 based on a parity check matrix of an LDPC (low density parity check) code, wherein the encoded LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 3 137 314 327 983 1597 2028 3043 3217 4109 6020 6178 6535 6560
7146 7180 7408 7790 7893 8123 8313 8526 8616 8638
356 1197 1208 1839 1903 2712 3088 3537 4091 4301 4919 5068
6025 6195 6324 6378 6686 6829 7558 7745 8042 8382 8587 8602
18 187 1115 1417 1463 2300 2328 3502 3805 4677 4827 5551 5968
6394 6412 6753 7169 7524 7695 7976 8069 8118 8522 8582
714 2713 2726 2964 3055 3220 3334 3459 5557 5765 5841 6290
6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

In the above-described second aspect, the information bits are encoded into the code word whose code length is 16200 bits and code rate is 7/15 based on the parity check matrix of the LDPC (low density parity check) code. The encoded LDPC code includes the information bit and the parity bit, the parity check matrix includes the information matrix part corresponding to the information bit and the parity matrix part corresponding to the parity bit, the information matrix part is represented by the parity check matrix initial value table, and the parity check matrix initial value table is the table indicating the position of the element 1 of the information matrix part for each 360 columns as 3 137 314 327 983 1597 2028 3043 3217 4109 6020 6178 6535 6560
7146 7180 7408 7790 7893 8123 8313 8526 8616 8638
356 1197 1208 1839 1903 2712 3088 3537 4091 4301 4919 5068
6025 6195 6324 6378 6686 6829 7558 7745 8042 8382 8587 8602
18 187 1115 1417 1463 2300 2328 3502 3805 4677 4827 5551 5968
6394 6412 6753 7169 7524 7695 7976 8069 8118 8522 8582
714 2713 2726 2964 3055 3220 3334 3459 5557 5765 5841 6290
6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

A data processing device according to a third aspect of this technology is provided with an encoder, which encodes information bits into a cord word whose code length is 16200 bits and code rate is 8/15 based on a parity check matrix of an LDPC (low density parity check) code, wherein the encoded LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 32 384 430 591 1296 1976 1999 2137 2175 3638 4214 4304 4486
4662 4999 5174 5700 6969 7115 7138 7189
1788 1881 1910 2724 4504 4928 4973 5616 5686 5718 5846 6523
6893 6994 7074 7100 7277 7399 7476 7480 7537
2791 2824 2927 4196 4298 4800 4948 5361 5401 5688 5818 5862
5969 6029 6244 6645 6962 7203 7302 7454 7534
574 1461 1826 2056 2069 2387 2794 3349 3366 4951 5826 5834
5903 6640 6762 6786 6859 7043 7418 7431 7554
14 178 675 823 890 930 1209 1311 2898 4339 4600 5203 6485
6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

A data processing method according to a third aspect of this technology is provided with an encoding step of encoding information bits into a cord word whose code length is 16200 bits and code rate is 8/15 based on a parity check matrix of an LDPC (low density parity check) code, wherein the encoded LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

In the above-described third aspect, the information bits are encoded into the code word whose code length is 16200 bits and code rate is 8/15 based on the parity check matrix of the LDPC (low density parity check) code. The encoded LDPC code includes the information bit and the parity bit, the parity check matrix includes the information matrix part corresponding to the information bit and the parity matrix part corresponding to the parity bit, the information matrix part is represented by the parity check matrix initial value table, and the parity check matrix initial value table is the table indicating the position of the element 1 of the information matrix part for each 360 columns as 32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

A data processing device according to a fourth aspect of this technology is provided with a decoder, which decodes an LDPC code whose code length is 16200 bits and code rate is 4/15 based on a parity check matrix of the LDPC (low density parity check) code, wherein the LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480.

A data processing method according to a fourth aspect of this technology is provided with a decoding step of decoding an LDPC code whose code length is 16200 bits and code rate is 4/15 based on a parity check matrix of the LDPC (low density parity check) code, wherein the LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480.

In the above-described fourth aspect, the LDPC code whose code length is 16200 bits and code rate is 4/15 is decoded based on the parity check matrix of the LDPC (low density parity check) code. The LDPC code includes the information bit and the parity bit, the parity check matrix includes the information matrix part corresponding to the information bit and the parity matrix part corresponding to the parity bit, the information matrix part is represented by the parity check matrix initial value table, and the parity check matrix initial value table is the table indicating the position of the element 1 of the information matrix part for each 360 columns as

---

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480.

---

A data processing device according to a fifth aspect of this technology is provided with a decoder, which decodes an LDPC cord whose code length is 16200 bits and code rate is 7/15 based on a parity check matrix of the LDPC (low density parity check) code, wherein the LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as

---

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

---

A data processing method according to a fifth aspect of this technology is provided with a decoding step of decoding an LDPC code whose code length is 16200 bits and code rate is 7/15 based on a parity check matrix of the LDPC (low density parity check) code, wherein the LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as

---

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

---

In the above-described fifth aspect, the LDPC code whose code length is 16200 bits and code rate is 7/15 is decoded based on the parity check matrix of the LDPC (low density parity check) code. The LDPC code includes the information bit and the parity bit, the parity check matrix includes the information matrix part corresponding to the information bit and the parity matrix part corresponding to the parity bit, the information matrix part is represented by the parity check matrix initial value table, and the parity check matrix initial value table is the table indicating the position of the element 1 of the information matrix part for each 360 columns as

---

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005.

A data processing device according to a sixth aspect of this technology is provided with a decoder, which decodes an LDPC code whose code length is 16200 bits and code rate is 8/15 based on a parity check matrix of an LDPC (low density parity check) code, wherein the LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 32 384 430 591 1296 1976 1999 2137 2175 3638 4214 4304 4486 4662
4999 5174 5700 6969 7115 7138 7189
1788 1881 1910 2724 4504 4928 4973 5616 5686 5718 5846 6523 6893
6994 7074 7100 7277 7399 7476 7480 7537
2791 2824 2927 4196 4298 4800 4948 5361 5401 5688 5818 5862 5969
6029 6244 6645 6962 7203 7302 7454 7534
574 1461 1826 2056 2069 2387 2794 3349 3366 4951 5826 5834 5903
6640 6762 6786 6859 7043 7418 7431 7554
14 178 675 823 890 930 1209 1311 2898 4339 4600 5203 6485 6549
6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

A data processing method according to a sixth aspect of this technology is provided with a decoding step of decoding an LDPC code whose code length is 16200 bits and code rate is 8/15 based on a parity check matrix of the LDPC (low density parity check) code, wherein the LDPC code includes an information bit and a parity bit, the parity check matrix includes an information matrix part corresponding to the information bit and a parity matrix part corresponding to the parity bit, the information matrix part is represented by a parity check matrix initial value table, and the parity check matrix initial value table is a table indicating a position of an element 1 of the information matrix part for each 360 columns as 32 384 430 591 1296 1976 1999 2137 2175 3638 4214 4304 4486 4662
4999 5174 5700 6969 7115 7138 7189
1788 1881 1910 2724 4504 4928 4973 5616 5686 5718 5846 6523 6893
6994 7074 7100 7277 7399 7476 7480 7537
2791 2824 2927 4196 4298 4800 4948 5361 5401 5688 5818 5862 5969
6029 6244 6645 6962 7203 7302 7454 7534
574 1461 1826 2056 2069 2387 2794 3349 3366 4951 5826 5834 5903
6640 6762 6786 6859 7043 7418 7431 7554
14 178 675 823 890 930 1209 1311 2898 4339 4600 5203 6485 6549
6970 7208 7218 7298 7454 7457 7462
4075 4188 7313 7553
5145 6018 7148 7507
3198 4858 6983 7033
3170 5126 5625 6901

-continued 2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

In the above-described sixth aspect, the LDPC code whose code length is 16200 bits and code rate is 8/15 is decoded based on the parity check matrix of the LDPC (low density parity check) code. The LDPC code includes the information bit and the parity bit, the parity check matrix includes the information matrix part corresponding to the information bit and the parity matrix part corresponding to the parity bit, the information matrix part is represented by the parity check matrix initial value table, and the parity check matrix initial value table is the table indicating the position of the element 1 of the information matrix part for each 360 columns as 32 384 430 591 1296 1976 1999 2137 2175 3638 4214 4304 4486 4662
4999 5174 5700 6969 7115 7138 7189
1788 1881 1910 2724 4504 4928 4973 5616 5686 5718 5846 6523 6893
6994 7074 7100 7277 7399 7476 7480 7537
2791 2824 2927 4196 4298 4800 4948 5361 5401 5688 5818 5862 5969
6029 6244 6645 6962 7203 7302 7454 7534
574 1461 1826 2056 2069 2387 2794 3349 3366 4951 5826 5834 5903
6640 6762 6786 6859 7043 7418 7431 7554
14 178 675 823 890 930 1209 1311 2898 4339 4600 5203 6485 6549
6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

Meanwhile, the data processing device may be an independent device or an internal block composing one device.

Effects of the Invention

According to the first to sixth aspects of this technology, it is possible to improve the resistance to error.

BRIEF DESCRIPTION OF DRAWINGS

FIG. 3 is a view illustrating an example of a parity check matrix of the LDPC code.

FIG. 13 is a view illustrating the parity check matrix of the LDPC code specified in the DVB-S.2 standard.

FIG. 25 is a view illustrating the number of columns of a memory 31 required for column twist interleave and an address of a writing start position.

FIG. 26 is a view illustrating the number of columns of the memory 31 required for the column twist interleave and the address of the writing start position.

FIG. 35 is a view illustrating an example of the parity check matrix initial value table in which the code rate is 1/5 and the code length is 16200.

FIG. 36 is a view illustrating an example of the parity check matrix initial value table in which the code rate is 4/15 and the code length is 16200.

FIG. 37 is a view illustrating an example of the parity check matrix initial value table in which the code rate is 1/3 and the code length is 16200.

FIG. 38 is a view illustrating an example of the parity check matrix initial value table in which the code rate is 2/5 and the code length is 16200.

FIG. 39 is a view illustrating an example of the parity check matrix initial value table in which the code rate is 4/9 and the code length is 16200.

FIG. 40 is a view illustrating an example of the parity check matrix initial value table in which the code rate is 7/15 and the code length is 16200.

FIG. 41 is a view illustrating an example of the parity check matrix initial value table in which the code rate is 8/15 and the code length is 16200.

FIG. 42 is a view illustrating an example of the parity check matrix initial value table in which the code rate is 3/5 and the code length is 16200.

FIG. 43 is a view illustrating an example of the parity check matrix initial value table in which the code rate is 2/3 and the code length is 16200.

FIG. 48 is a view illustrating the parity check matrix of the LDPC code whose code length is 16200.

FIG. 53 is a view illustrating an example of the parity check matrix of the LDPC code.

FIG. 54 is a view illustrating a matrix (conversion parity check matrix) obtained by applying row permutation and column permutation to the parity check matrix.

MODE FOR CARRYING OUT THE INVENTION

[Configuration Example of Transmission System to which this Technology is Applied]

Figure 7:
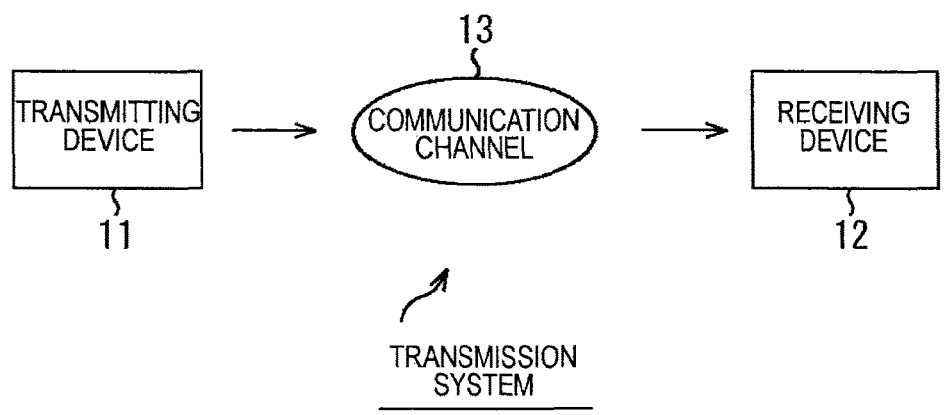
FIG. 7 is a view illustrating a configuration example of one embodiment of a transmission system to which this technology is applied.

FIG. 7 illustrates a configuration example of one embodiment of a transmission system (the term "system" is intended to mean a logical assembly of a plurality of devices and it does not matter whether the devices of each configuration are in the same housing) to which this technology is applied.

In FIG. 7, the transmission system is composed of a transmitting device 11 and a receiving device 12.

The transmitting device 11 transmits (broadcasts) (transmits) a program for a fixed terminal and a mobile terminal.

That is to say, the transmitting device 11 encodes target data to be transmitted such as image data and audio data as the program for the fixed terminal and the mobile terminal, for example, into an LDPC code and transmits the same through a communication channel 13, which is a terrestrial wave, for example.

The receiving device 12, which is the mobile terminal, for example, receives the LDPC code transmitted from the transmitting device 11 through the communication channel 13 and decodes the same to the target data to output.

Herein, it is known that the LDPC code used in the transmission system in FIG. 7 exhibits an extremely high ability in an AWGN (additive white Gaussian noise) communication channel.

However, a burst error and erasure might occur in the communication channel 13 such as the terrestrial wave. For example, in an OFDM (orthogonal frequency division multiplexing) system, there is a case in which power of a specific symbol reaches 0 (erasure) according to delay of an echo (a path other than a main path) in a multipath environment in which a D/U (desired to undesired ratio) is 0 dB (power of undesired (=echo) is equal to power of desired (=main path)).

There is a case in which the power of all the symbols of the OFDM at a specific time reaches 0 (erasure) by a Doppler frequency when the D/U is 0 dB also in a flutter (communication channel in which a Doppler frequency-shifted echo whose delay is 0 is added).

Further, the burst error might occur due to a wiring status from a receiver (not illustrated) such as an antenna, which receives a signal from the transmitting device 11, to the receiving device 12 and instability of a power supply of the receiving device 12 on a side of the receiving device 12.

Figure 1:
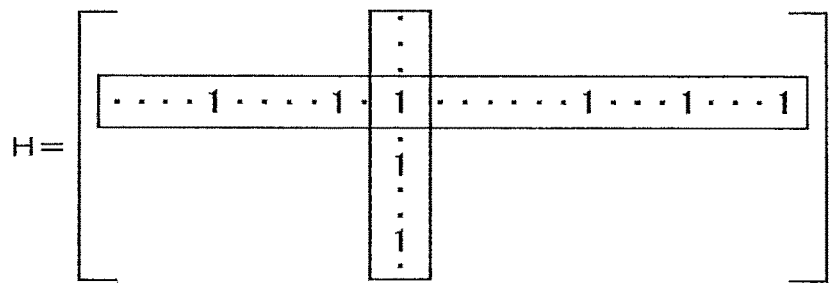
FIG. 1 is a view illustrating a parity check matrix H of an LDPC code.
Figure 2:
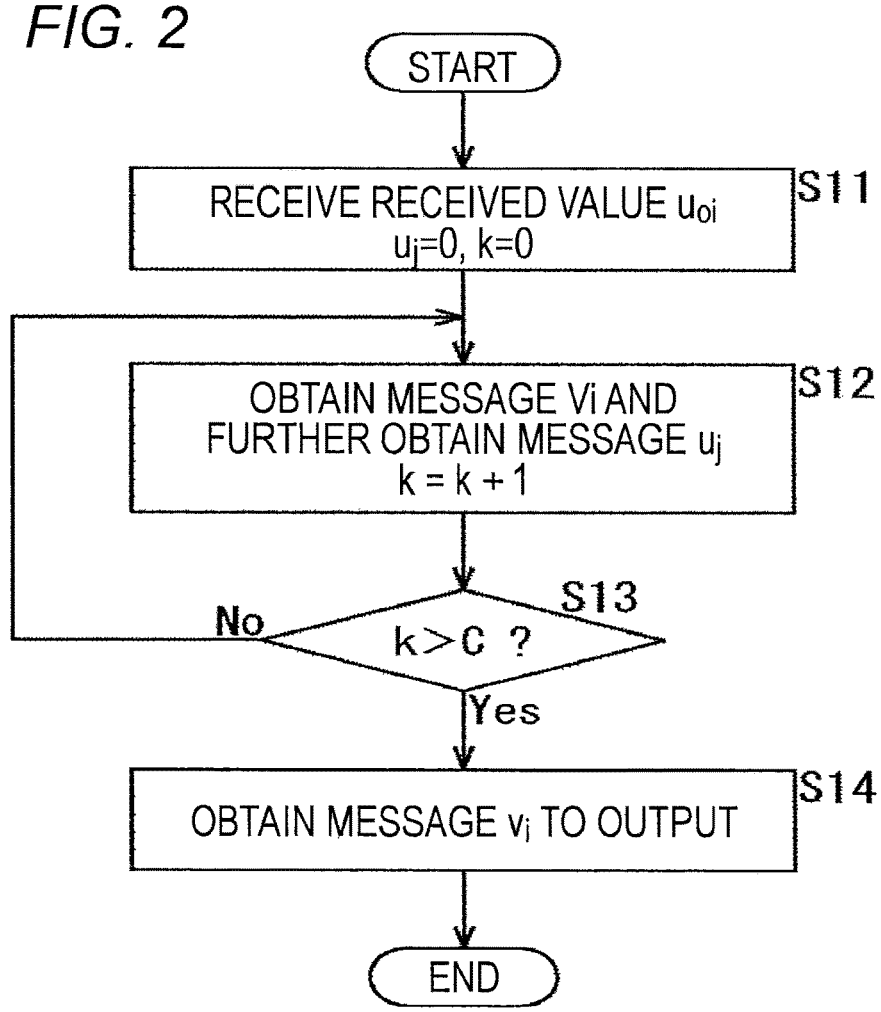
FIG. 2 is a flowchart illustrating a decoding procedure of the LDPC code.
Figure 4:
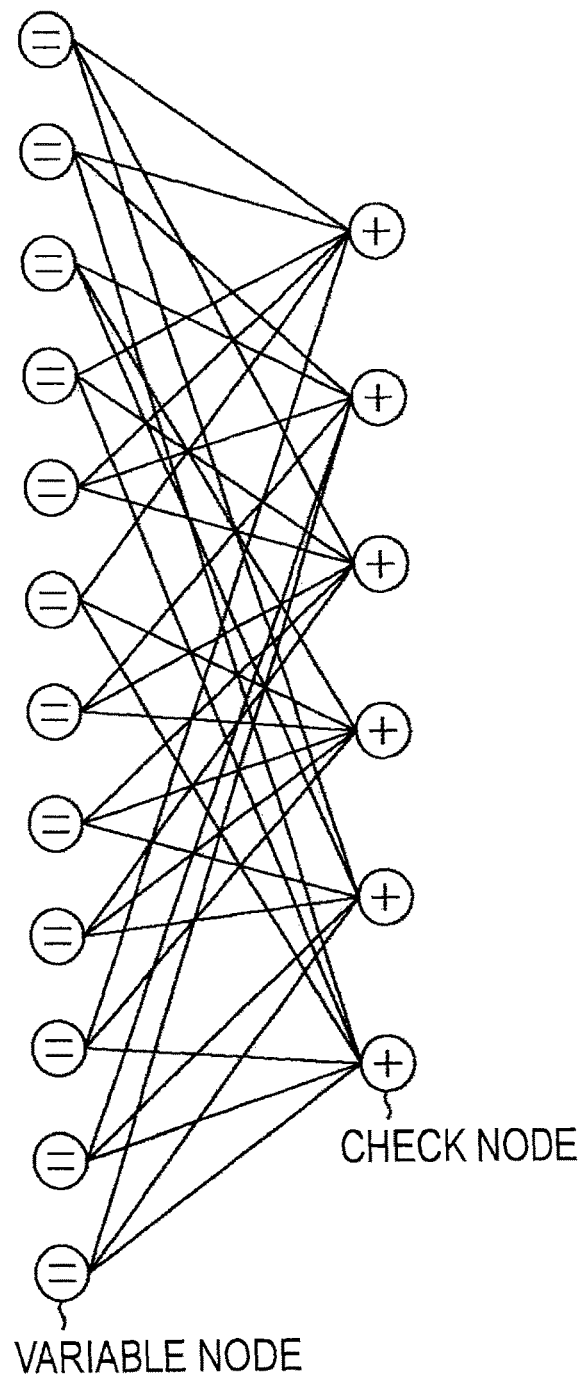
FIG. 4 is a view illustrating a Tanner graph of the parity check matrix.
Figure 5:
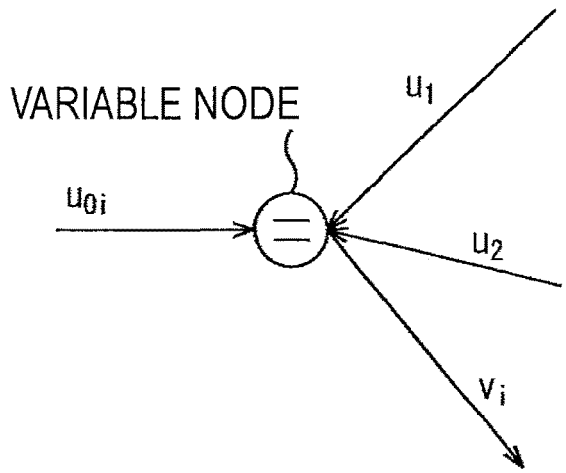
FIG. 5 is a view illustrating a variable node.
Figure 6:
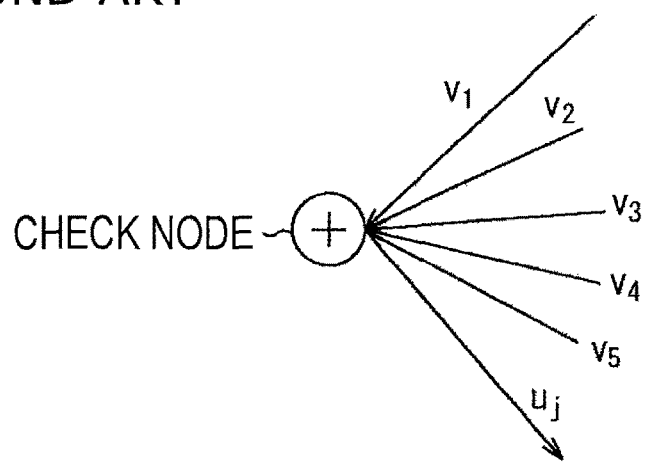
FIG. 6 is a view illustrating a check node.

On the other hand, in decoding of the LDPC code, a variable node operation in equation (1) including addition of (a received value $u_{0i}$ of) a code bit of the LDPC code is performed as illustrated above in FIG. 5 in a variable node corresponding to a column of a parity check matrix H and eventually the code bit of the LDPC code, so that, when the error occurs in the code bit used in the variable node operation, accuracy of an obtained message is deteriorated.

In the decoding of the LDPC code, a check node operation in equation (7) is performed using the message obtained in the variable node connected to the check node in the check node, so that decoding performance is deteriorated when the number of check nodes, in which (the code bits of the LDPC code corresponding to) a plurality of variable nodes connected thereto have the error (including the erasure) at the same time, increases.

That is to say, when the erasure occurs in two or more of the variable nodes connected to the check node at the same time, the check node returns the message indicating that probability that the value is 0 and the probability that the value is 1 are equal to all the variable nodes, for example. In this case, the check node, which returns the message of the equal probability, does not contribute to a single decoding process (one set of the variable node operation and the check node operation), and as a result, this requires a large number of repetitions of the decoding process, so that the decoding performance is deteriorated and further, power consumption of the receiving device 12, which decodes the LDPC code, increases.

Therefore, the transmission system in FIG. 7 is configured to improve resistance to burst error and erasure while maintaining performance in the AWGN communication channel.

[Configuration Example of Transmitting Device 11]

Figure 8:
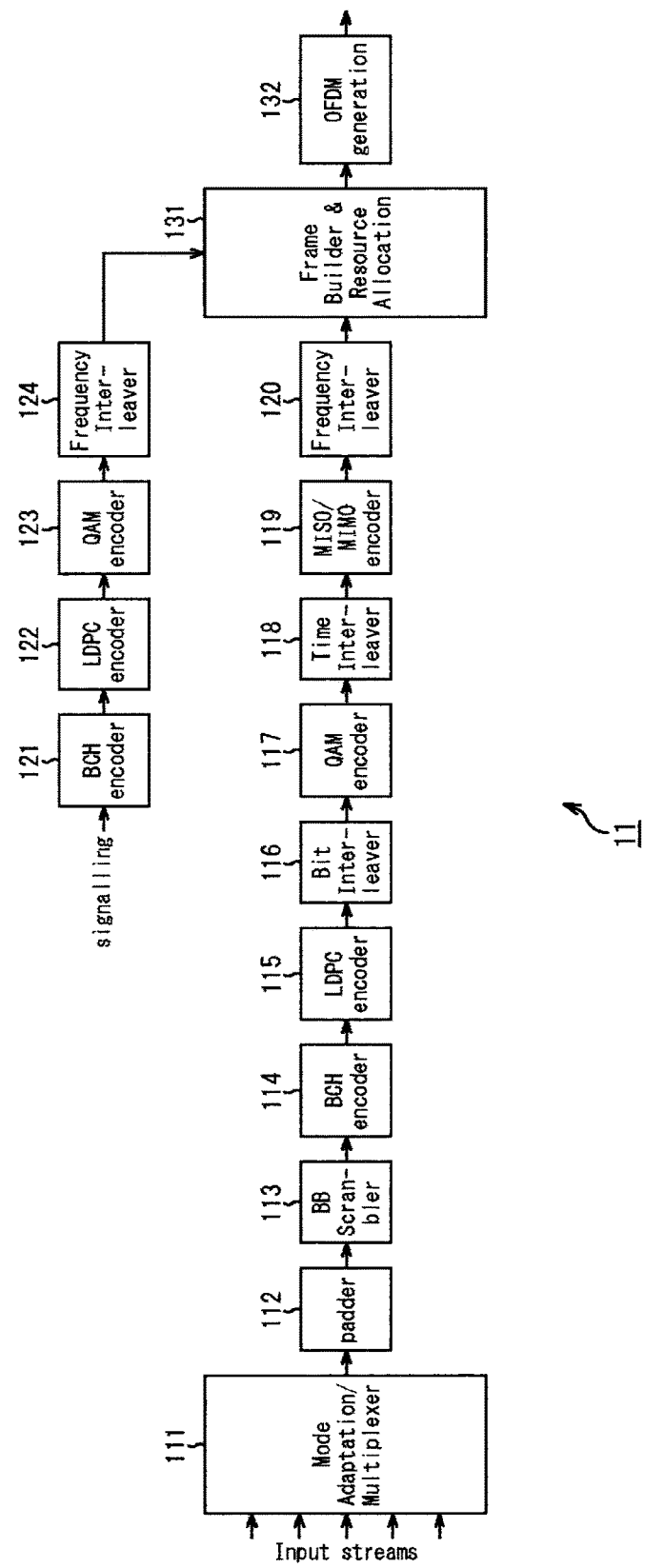
FIG. 8 is a block diagram illustrating a configuration example of a transmitting device 11.

FIG. 8 is a block diagram illustrating a configuration example of the transmitting device 11 in FIG. 7.

In the transmitting device 11, one or more input streams as the target data are supplied to a mode adaptation/multiplexer 111.

The mode adaptation/multiplexer 111 selects a mode, multiplexes the one or more input streams supplied thereto, and supplies the data obtained as a result to a padder 112.

The padder 112 performs necessary zero padding (null insertion) to the data from the mode adaptation/multiplexer 111 and supplies the data obtained as a result to a BB scrambler 113.

The BB scrambler 113 applies energy diffusion treatment to the data from the padder 112 and supplies the data obtained as a result to a BCH encoder 114.

The BCH encoder 114 performs BCH encoding of the data from the BB scrambler 113 and supplies the data obtained as a result to an LDPC encoder 115 as LDPC target data being a target of LDPC encoding.

The LDPC encoder 115 performs the LDPC encoding of the LDPC target data from the BCH encoder 114 according to a parity check matrix in which a parity matrix being a part corresponding to a parity bit of the LDPC code has a stepwise structure and outputs the LDPC code in which an information bit is the LDPC target data.

That is to say, the LDPC encoder 115 performs the LDPC encoding to encode the LDPC target data into the LDPC code such as the LDPC code specified in a DVB-T.2 standard, for example, and outputs the LDPC code obtained as a result.

In the DVB-T.2 standard, the LDPC code specified in a DVB-S.2 standard is adopted except a case in which a code length is 16200 bits and a code rate is 3/5. The LDPC code specified in the DVB-T.2 standard is an IRA (irregular repeat-accumulate) code and the parity matrix in the parity check matrix of the LDPC code has the stepwise structure. The parity matrix and the stepwise structure are described later. The IRA code is described in "Irregular Repeat-Accumulate Codes," H. Jin, A. Khandekar, and R. J. McEliece, in Proceedings of 2nd International Symposium on Turbo Codes and Related Topics, pp. 1-8, September 2000, for example.

The LDPC code output by the LDPC encoder 115 is supplied to a bit interleaver 116.

The bit interleaver 116 performs bit interleave to be described later of the LDPC code from the LDPC encoder 115 and supplies the LDPC code after the bit interleave to a QAM encoder 117.

The QAM encoder 117 maps the LDPC code from the bit interleaver 116 onto a signal point indicating one symbol of orthogonal modulation in units of one or more code bits of the LDPC code (symbol unit) to perform the orthogonal modulation (multilevel modulation).

That is to say, the QAM encoder 117 maps the LDPC code from the bit interleaver 116 onto the signal point defined by a modulation scheme for performing the orthogonal modulation of the LDPC code on an IQ plane (IQ constellation) defined by an I axis representing an I component in phase with a carrier wave and a Q axis representing a Q component orthogonal to the carrier wave and performs the orthogonal modulation.

Herein, the modulation scheme of the orthogonal modulation performed by the QAM encoder 117 includes the modulation scheme including the modulation scheme specified in a DVB-T standard, for example, that is to say, QPSK (quadrature phase shift keying), 16QAM (quadrature amplitude modulation), 64QAM, 256QAM, 1024QAM, 4096QAM and the like, for example. The modulation scheme with which the orthogonal modulation is performed by the QAM encoder 117 is set in advance according to operation of an operator of the transmitting device 11, for example. Meanwhile, in addition to this, the QAM encoder 117 may perform the orthogonal modulation such as 4PAM (pulse amplitude modulation) and the like, for example.

The data (symbol mapped onto the signal point) obtained by the process by the QAM encoder 117 is supplied to a time interleaver 118.

The time interleaver 118 performs time interleave (interleave in a time direction) in the symbol unit of the data (symbol) from the QAM encoder 117 and supplies the data obtained as a result to a MISO/MIMO encoder 119.

The MISO/MIMO encoder 119 applies time-space encoding to the data (symbol) from the time interleaver 118 to supply to a frequency interleaver 120.

The frequency interleaver 120 performs frequency interleave (interleave in a frequency direction) in the unit of the data (symbol) from the MISO/MIMO encoder 119 to supply to a frame builder & resource allocation 131.

On the other hand, control data for transmission control (signalling) such as a preamble referred to as L1 and the like is supplied to the BCH encoder 121, for example.

The BCH encoder 121 performs the BCH encoding of the control data supplied thereto in the same manner as the BCH encoder 114 and supplies the data obtained as a result to an LDPC encoder 122.

The LDPC encoder 122 performs the LDPC encoding of the data from the BCH encoder 121 as the LDPC target data in the same manner as the LDPC encoder 115 and supplies the LDPC code obtained as a result to a QAM encoder 123.

The QAM encoder 123 maps the LDPC code from the LDPC encoder 122 onto the signal point indicating one symbol of the orthogonal modulation in units of one or more code bits of the LDPC code (symbol unit) to perform the orthogonal modulation and supplies the data (symbol) obtained as a result to a frequency interleaver 124 in the same manner as the QAM encoder 117.

The frequency interleaver 124 performs the frequency interleave of the data (symbol) from the QAM encoder 123 in the symbol unit to supply to the frame builder & resource allocation 131 in the same manner as the frequency interleaver 120.

The frame builder & resource allocation 131 inserts a pilot symbol into a required position of the data (symbol) from the frequency interleavers 120 and 124 and composes a frame composed of a predetermined number of symbols from the data (symbol) obtained as a result to supply to an OFDM generation 132.

The OFDM generation 132 generates an OFDM signal corresponding to the frame from the frame from the frame builder & resource allocation 131 and transmits the same through the communication channel 13 (FIG. 7).

Figure 9:
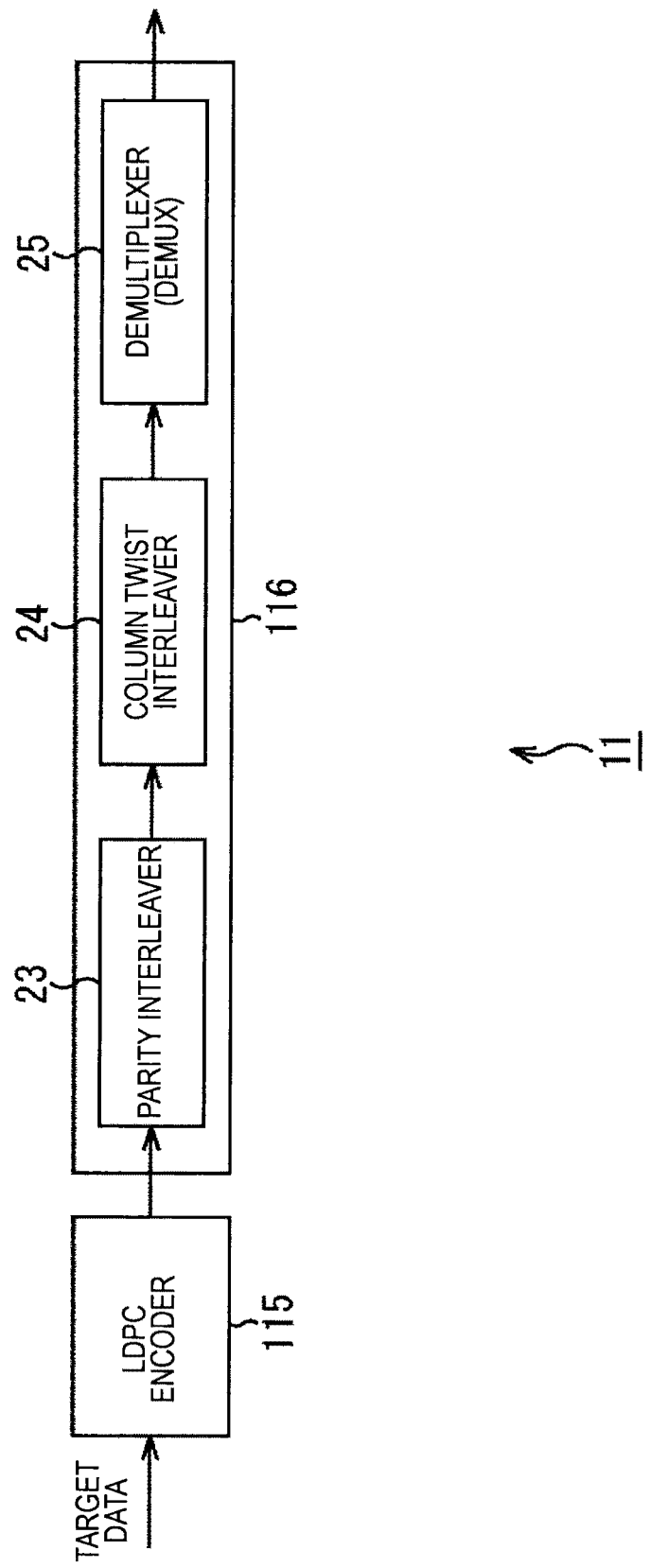
FIG. 9 is a block diagram illustrating a configuration example of a bit interleaver 116.

FIG. 9 illustrates a configuration example of the bit interleaver 116 in FIG. 8.

The bit interleaver 116 is a data processing device, which interleaves the data, composed of a parity interleaver 23, a column twist interleaver 24, and a demultiplexer (DEMUX) 25.

The parity interleaver 23 performs parity interleave to interleave the parity bit of the LDPC code from the LDPC encoder 115 to a position of another parity bit and supplies the LDPC code after the parity interleave to the column twist interleaver 24.

The column twist interleaver 24 performs column twist interleave of the LDPC code from the parity interleaver 23 and supplies the LDPC code after the column twist interleave to the demultiplexer 25.

That is to say, the QAM encoder 117 in FIG. 8 maps one or more code bits of the LDPC code onto the signal point indicating one symbol of the orthogonal modulation to transmit the LDPC code.

The column twist interleaver 24 performs the column twist interleave to be described later, for example, as a rearranging process to rearrange the code bits of the LDPC code from the parity interleaver 23 such that a plurality of code bits of the LDPC code corresponding to 1 in an optional row of the parity check matrix used by the LDPC encoder 115 is not included in one symbol.

The demultiplexer 25 obtains the LDPC code whose resistance to AWGN is reinforced by performing an interchanging process to interchange positions of two or more code bits of the LDPC code being the symbol for the LDPC code from the column twist interleaver 24. Then, the demultiplexer 25 supplies the two or more code bits of the LDPC code obtained by the interchanging process to the QAM encoder 117 (FIG. 8) as the symbol.

Figure 10:
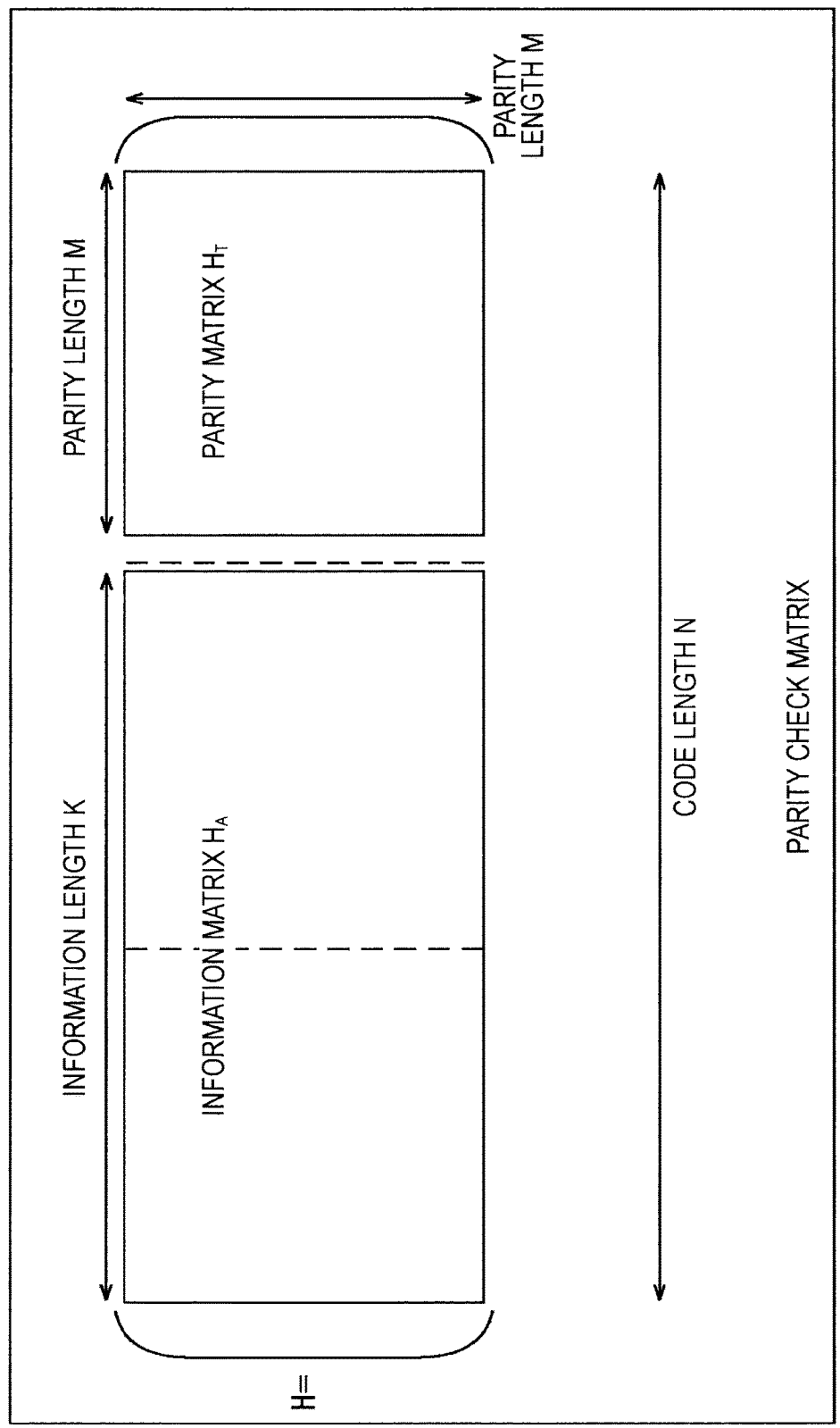
FIG. 10 is a view illustrating the parity check matrix.

Next, FIG. 10 illustrates the parity check matrix H used by the LDPC encoder 115 in FIG. 8 in the LDPC encoding.

The parity check matrix H has an LDGM (low-density generation matrix) structure and this may be represented by an equation $H=[H_A|H_T]$ (matrix in which a left element is an element of an information matrix $H_A$ and a right element is an element of a parity matrix $H_T$) by the information matrix $H_A$ of a part corresponding to the information bit and the parity matrix $H_T$ corresponding to the parity bit out of the code bits of the LDPC code.

Herein, the number of information bits and the number of parity bits out of the code bits of one LDPC code (one code word) are referred to as an information length K and a parity length M, respectively, and the number of code bits of one LDPC code is referred to as a code length N (=K+M).

The information length K and the parity length M of the LDPC code of a certain code length N are determined according to the code rate. The parity check matrix H is an M×N (row×column) matrix. The information matrix $H_A$ is an M×K matrix and the parity matrix $H_T$ is an M×M matrix.

Figure 11:
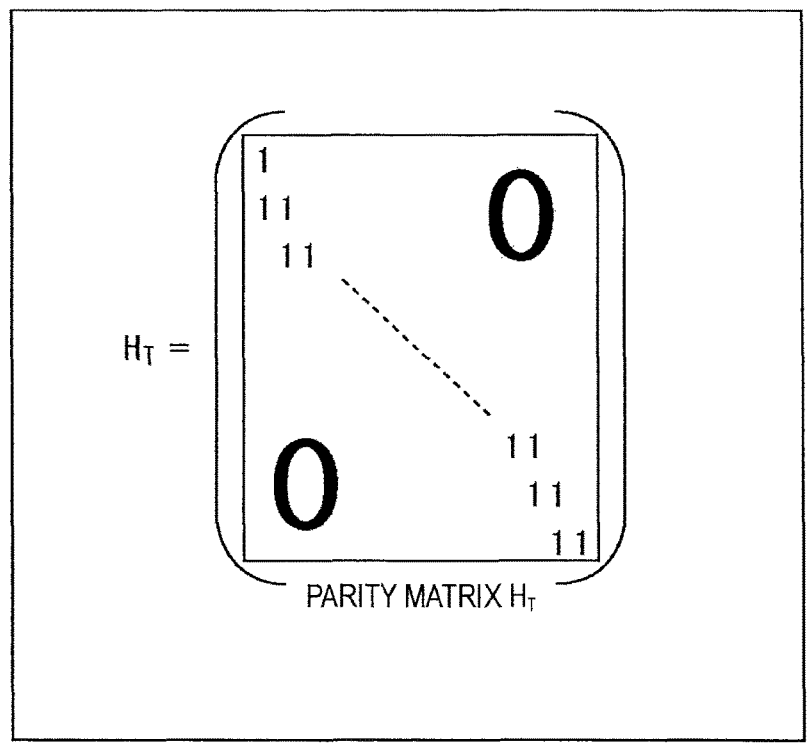
FIG. 11 is a view illustrating a parity matrix.

FIG. 11 illustrates the parity matrix $H_T$ of the parity check matrix H of the LDPC code specified in the DVB-T.2 (and DVB-S.2) standard.

The parity matrix $H_T$ of the parity check matrix H of the LDPC code specified in the DVB-T.2 standard has the stepwise structure in which elements of 1 are arranged in a so-called stepwise manner as illustrated in FIG. 11. A row weight of the parity matrix $H_T$ is 1 for a first row and 2 for all other rows. A column weight is 1 for a last column and 2 for all other columns.

As described above, the LDPC code of the parity check matrix H in which the parity matrix $H_T$ has the stepwise structure may be easily generated using the parity check matrix H.

That is to say, the LDPC code (one code word) is represented by a row vector c and a column vector obtained by transposing the row vector is represented as $c^T$. A part of the information bit of the row vector c, which is the LDPC code, is represented by a row vector A and a part of the parity bit is represented by a row vector T.

In this case, the row vector c may be represented by an equation c=[A|T] (row vector in which a left element is an element of the row vector A and a right element is an element of the row vector T) by the row vector A as the information bit and the row vector T as the parity bit.

The parity check matrix H and the row vector c=[A|T] as the LDPC code are required to satisfy an equation $Hc^T=0$ and it is possible to sequentially obtain (in order) the row vector T as the parity bit composing the row vector c=[A|T] satisfying such equation $Hc^T=0$ by setting the element of each row to 0 in order from the element of a first row of the column vector $Hc^T$ in the equation $Hc^T=0$ when the parity matrix $H_T$ of the parity check matrix $H=[H_A|H_T]$ has the stepwise structure illustrated in FIG. 11.

Figure 12:
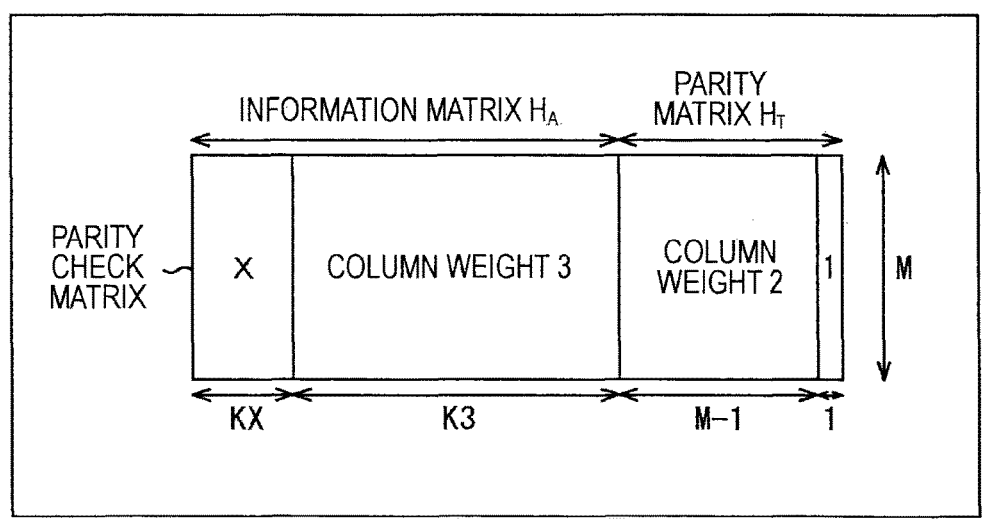
FIG. 12 is a view illustrating the parity check matrix of the LDPC code specified in a DVB-S.2 standard.

FIG. 12 is a view illustrating the parity check matrix H of the LDPC code specified in the DVB-T.2 standard.

The column weight is X for first to KX-th columns, the column weight is 3 for next K3 columns, the column weight is 2 for next M−1 columns, and the column weight is 1 for a last column in the parity check matrix H of the LDPC code specified in the DVB-T.2 standard.

Herein, KX+K3+M−1+1 equals to the code length N.

FIG. 13 is a view illustrating the numbers of columns KX, K3, and M and the column weight X for each code rate r of the LDPC code specified in the DVB-T.2 standard.

The LDPC codes whose code lengths N are 64800 bits and 16200 bits are specified in the DVB-T.2 standard.

For the LDPC code whose code length N is 64800 bits, 11 code rates (nominal rates) 1/4, 1/3, 2/5, 1/2, 3/5, 2/3, 3/4, 4/5, 5/6, 8/9, and 9/10 are specified, and for the LDPC code whose code length N is 16200 bits, 10 code rates 1/4, 1/3, 2/5, 1/2, 3/5, 2/3, 3/4, 4/5, 5/6, and 8/9 are specified.

The code length N of 64800 bits is hereinafter also referred to as 64K bits and the code length of 16200 bits is also referred to as 16 k bits.

As for the LDPC code, it is known that a bit error rate of the code bit corresponding to the column whose column weight is larger of the parity check matrix H is lower.

In the parity check matrix H specified in the DVB-T.2 standard illustrated in FIGS. 12 and 13, the column weight of the column closer to a top (leftmost) column tends to be larger, therefore, as for the LDPC code corresponding to the parity check matrix H, the code bit closer to a top code bit closer to a top code bit tends to be more tolerant to error (resistant to error) and the code bit closer to a last code bit tends to be less tolerant to error.

Figure 14:
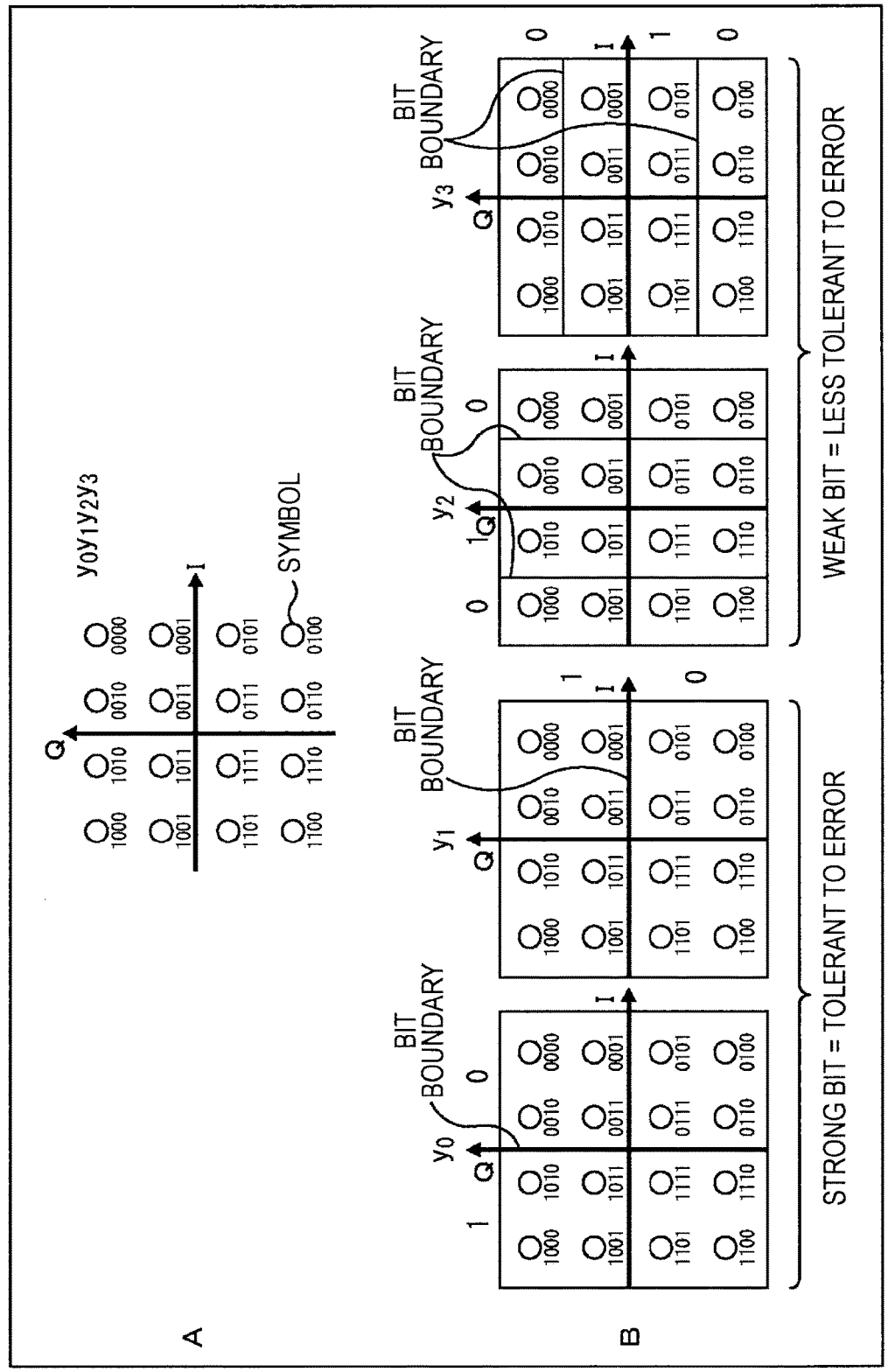
FIG. 14 is a view illustrating a signal point constellation of 16QAM.

FIG. 14 illustrates arrangement on the IQ plane of (the signal points corresponding to) 16 symbols in a case in which the 16QAM is performed by the QAM encoder 117 in FIG. 8.

That is to say, FIG. 14A illustrates the symbols of the 16QAM of DVB-T.2.

In the 16QAM, one symbol is represented by four bits and there are 16 ($=2^4$) symbols. The 16 symbols are arranged in a 4×4 square shape in I direction×Q direction around an origin of the IQ plane.

Supposing that an i+1-th bit from the highest-order bit of a bit column represented by one symbol is represented as a bit $y_i$, the four bits represented by the one symbol of the 16QAM may be sequentially represented as bits $y_0$, $y_1$, $y_2$, and $y_3$ in order from the highest-order bit. When the modulation scheme is the 16QAM, four code bits of the LDPC code are made the symbol (symbol value) of the four bits $y_0$ to $y_3$ (symbolized).

FIG. 14B illustrates a bit boundary of each of the four bits (hereinafter, also referred to as symbol bits) $y_0$ to $y_3$ represented by the symbol of the 16QAM.

Herein, the bit boundary of the symbol bit $y_i$ (i=0, 1, 2, 3 in FIG. 14) is intended to mean the boundary between the symbol whose symbol bit $y_i$ is 0 and the symbol whose symbol bit y, is 1.

As illustrated in FIG. 14B, as for the highest-order symbol bit $y_0$ out of the four symbol bits $y_0$ to $y_3$ represented by the symbol of the 16QAM, there is only one bit boundary on the Q axis of the IQ plane, and as for the second symbol bit $y_1$ (second highest-order bit), there is only one bit boundary on the I axis of the IQ plane.

As for the third symbol bit $y_2$, the bit boundaries are located on two portions, which are a portion between first and second columns from left and a portion between third and fourth columns from left of the 4×4 symbols.

Further, as for the fourth symbol bit $y_3$, the bit boundaries are located on two portions, which are a portion between first and second rows from the top and a portion between third and fourth rows from the top of the 4×4 symbols.

As the number of symbols away from the bit boundary is larger, the symbol bit $y_i$ represented by the symbol is less likely to have an error (error probability is lower), and as the number of symbols closer to the bit boundary is larger, this is likely to have an error (error probability is high).

If the bit, which is less likely to have an error (tolerant to error), is referred to as a "strong bit" and the bit, which is likely to have an error (less tolerant to error), is referred to as a "weak bit", as for the four symbol bits $y_0$ to $y_3$ of the symbol of the 16QAM, the highest-order symbol bit $y_0$ and the second symbol bit $y_1$ are the strong bits and the third symbol bit $y_2$ and the fourth symbol bit $y_3$ are the weak bits.

Figure 15:
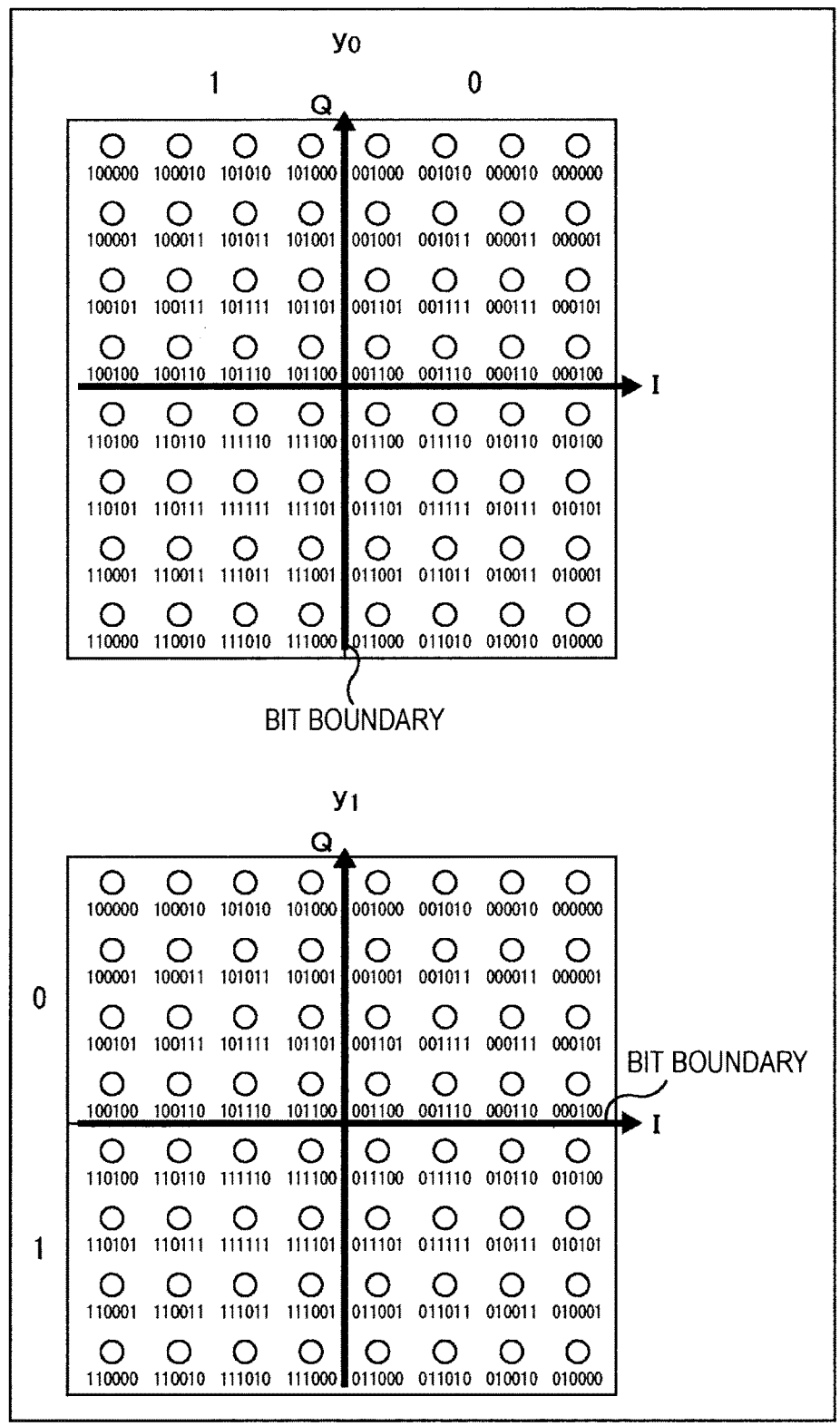
FIG. 15 is a view illustrating the signal point constellation of 64QAM.
Figure 16:
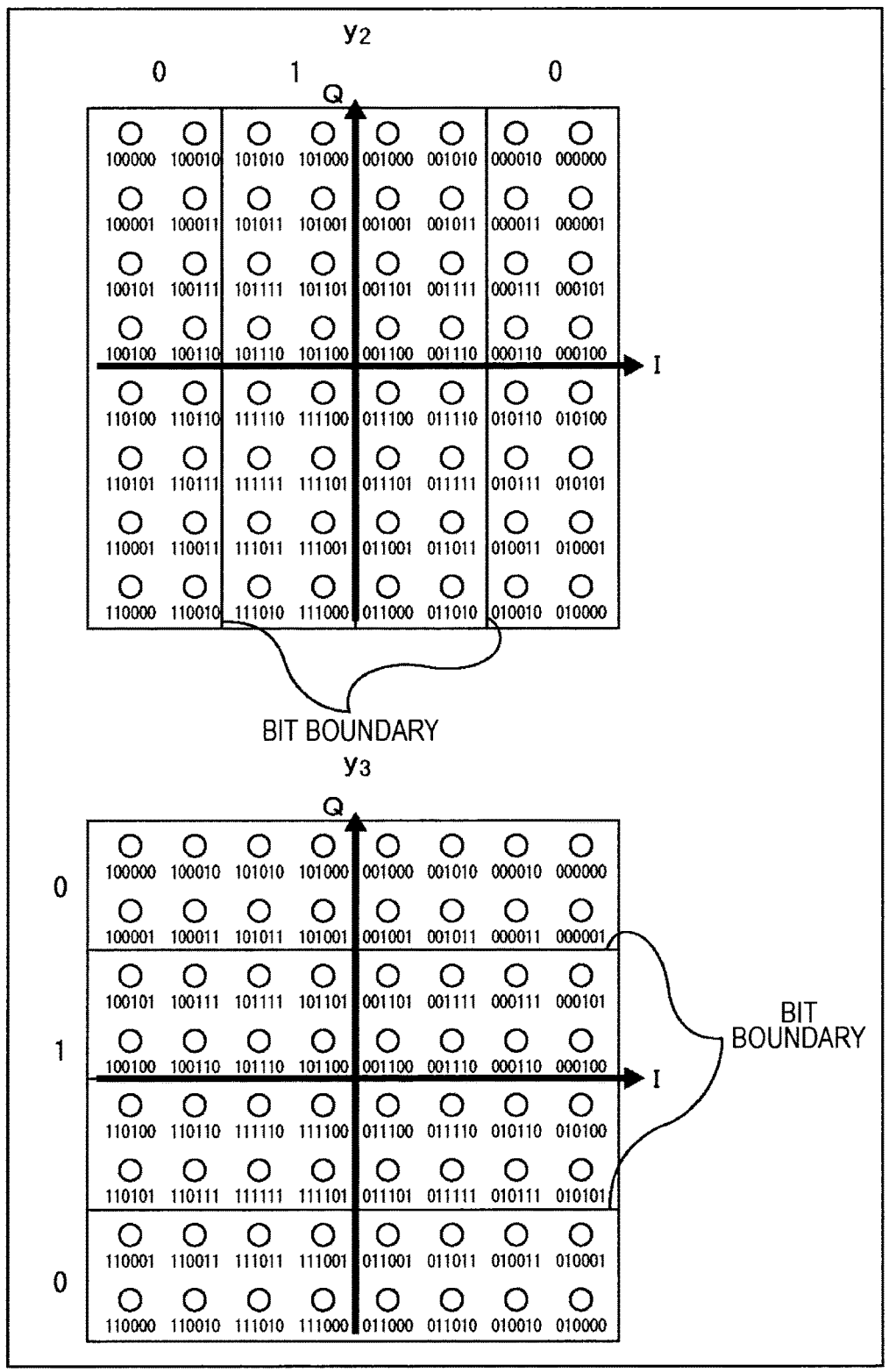
FIG. 16 is a view illustrating the signal point constellation of the 64QAM.
Figure 17:
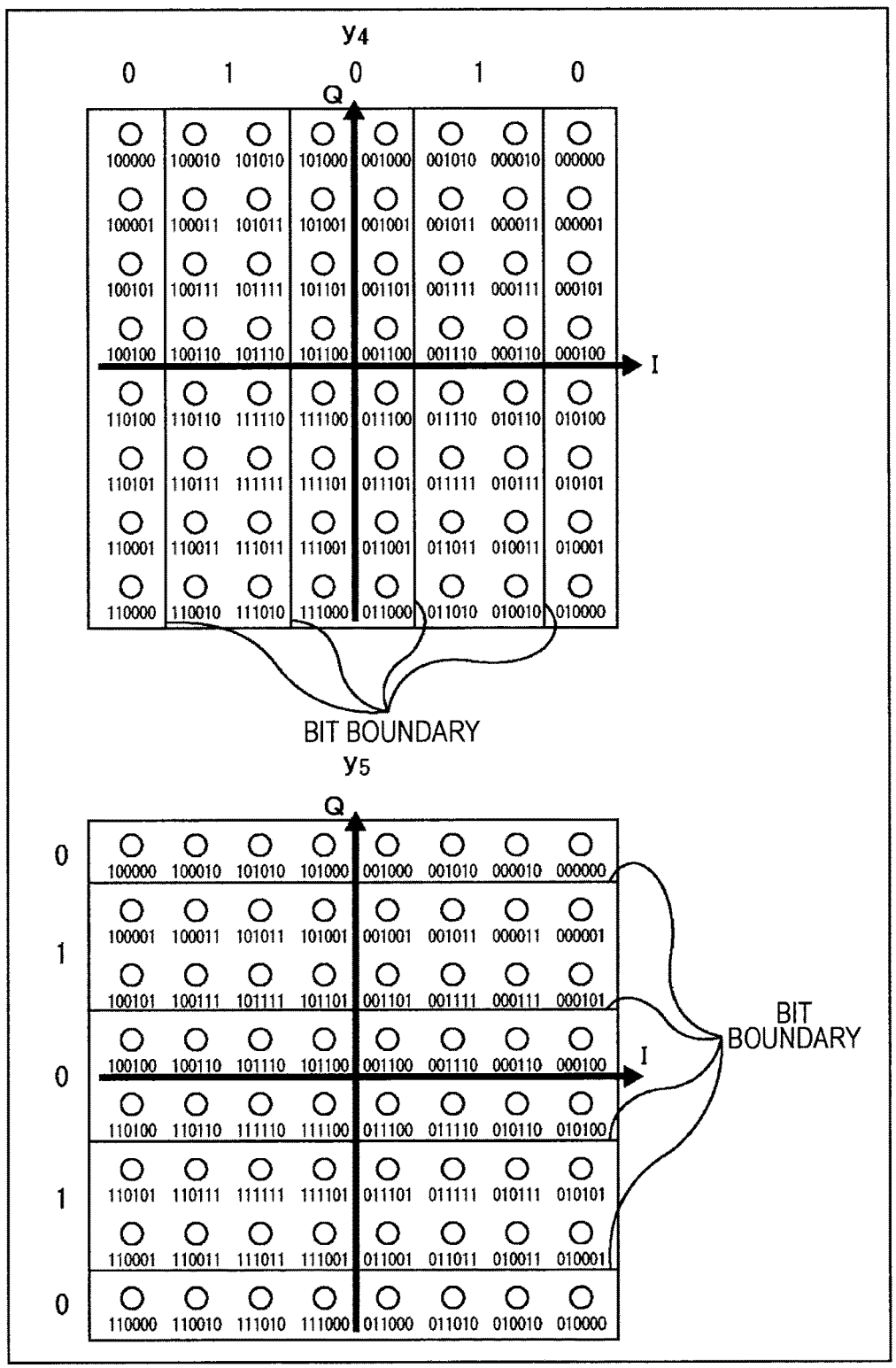
FIG. 17 is a view illustrating the signal point constellation of the 64QAM.

FIGS. 15 to 17 illustrate the arrangement on the IQ plane of (the signal points corresponding to) 64 symbols when the 64QAM is performed by the QAM encoder 117 in FIG. 8, that is to say, the symbols of the 16QAM in DVB-T.2.

In the 64QAM, 1 symbol represents six bits and there are 64 (=$2^6$) symbols. The 64 symbols are arranged in an 8×8 square shape in I direction×Q direction around the origin of the IQ plane.

The symbol bits of one symbol of the 64QAM may be represented as bits $y_0$, $y_1$, $y_2$, $y_3$, $y_4$, and $y_5$ in order from the highest-order bit. When the modulation scheme is the 64QAM, six code bits of the LDPC code are made the symbol of the six symbol bits $y_0$ to $y_5$.

Herein, FIG. 15 illustrates the bit boundary of each of the highest-order symbol bit $y_0$ and the second symbol bit $y_1$ out of the symbol bits $y_0$ to $y_5$ of the symbol of the 64QAM, FIG. 16 illustrates the bit boundary of each of the third symbol bit $y_2$ and the fourth symbol bit $y_3$, and FIG. 17 illustrates the bit boundary of each of the fifth symbol bit $y_4$ and the sixth symbol bit $y_5$, respectively.

As illustrated in FIG. 15, the bit boundary is located on one portion for the highest-order symbol bit $y_0$ and the second symbol bit $y_1$. Also, as illustrated in FIG. 16, the bit boundaries are located on two portions for the third symbol bit $y_2$ and the fourth symbol bit $y_3$, and as illustrated in FIG. 17, the bit boundaries are located on four portions for the fifth symbol bit $y_4$ and the sixth symbol bit $y_5$.

Therefore, as for the symbol bits $y_0$ to $y_5$ of the symbol of the 64QAM, the highest-order symbol bit $y_0$ and the second symbol bit $y_1$ are the strong bits and the third symbol bit $y_2$ and the fourth symbol bit $y_3$ are next strongest bits. The fifth symbol bit $y_4$ and the sixth symbol bit $y_5$ are the weak bits.

From FIG. 14 and further from FIGS. 15 to 17, it is understood that a high-order bit tends to be the strong bit and a low-order bit tends to be the weak bit as for the symbol bits of the symbol of the orthogonal modulation.

Herein, as illustrated in FIGS. 12 and 13, the LDPC code output from the LDPC encoder 115 (FIG. 8) includes the code bit tolerant to error and the code bit less tolerant to error.

Also, as illustrated in FIGS. 14 to 17, there are the strong bit and the weak bit as the symbol bit of the symbol of the orthogonal modulation performed by the QAM encoder 117.

Therefore, when the code bit less tolerant to error of the LDPC code is allocated to the weak symbol bit of the symbol of the orthogonal modulation, the resistance to error is deteriorated as a whole.

Then, the interleaver, which interleaves the code bit of the LDPC code so as to allocate the code bit less tolerant to error of the LDPC code to the strong bit (symbol bit) of the symbol of the orthogonal modulation, is suggested.

The demultiplexer 25 in FIG. 9 may perform the process of the interleaver.

Figure 18:
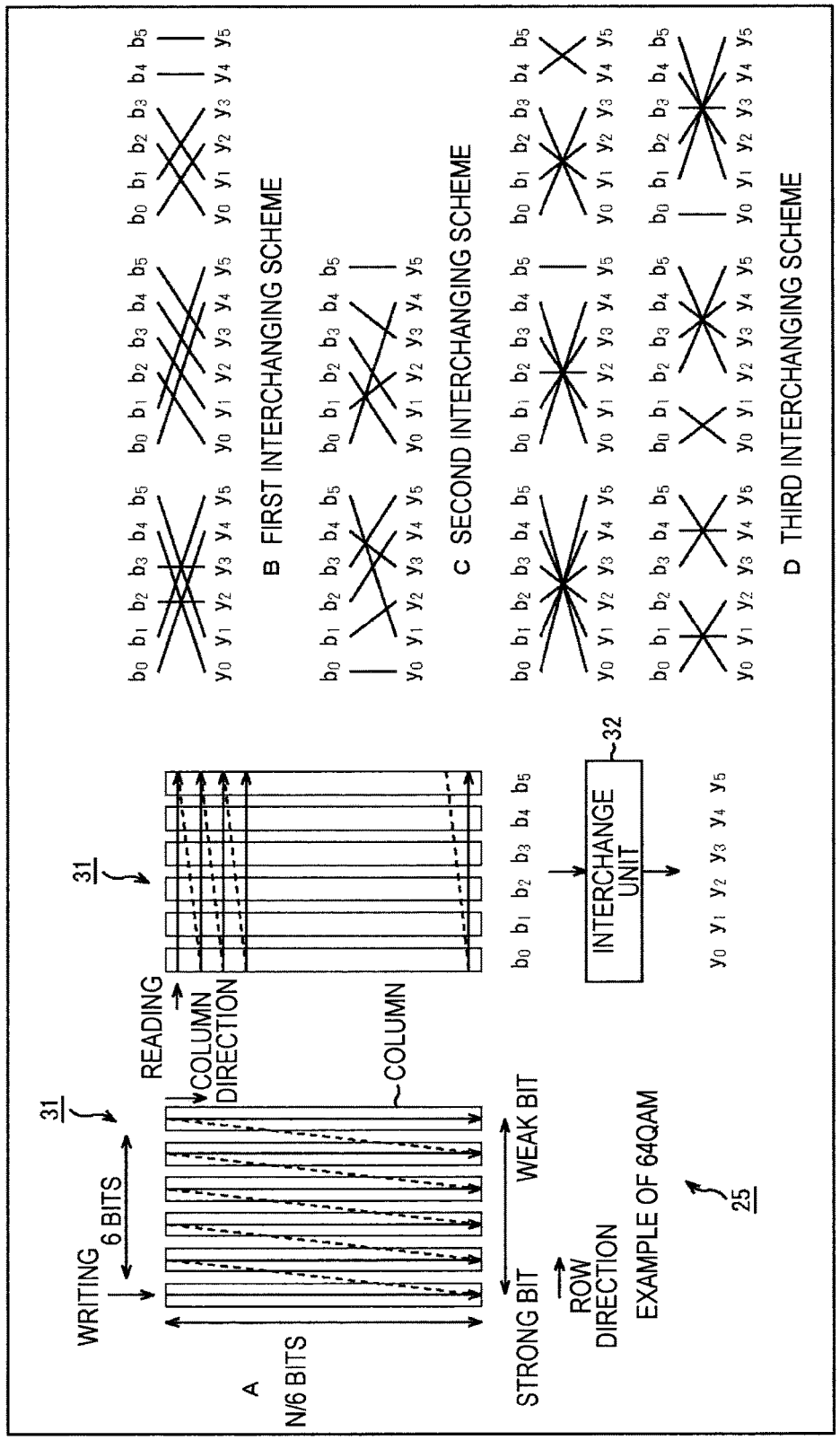
FIG. 18 is a view illustrating a process of a demultiplexer 25.

FIG. 18 is a view illustrating the process of the demultiplexer 25 in FIG. 9.

That is to say, FIG. 18A illustrates a functional configuration example of the demultiplexer 25.

The demultiplexer 25 is composed of a memory 31 and an interchange unit 32.

The LDPC code from the LDPC encoder 115 is supplied to the memory 31.

The memory 31 has a storage capacity to store mb bits in a row (horizontal) direction and store N/(mb) bits in a column (vertical) direction and writes the code bits of the LDPC code supplied thereto in the column direction and reads the same in the row direction to supply to the interchange unit 32.

Herein, N (=information length K+parity length M) represents the code length of the LDPC code as described above.

Also, m represents the number of code bits of the LDPC code to be made one symbol and b being a predetermined positive integer is a multiple number used for obtaining an integral multiple of m. The demultiplexer 25 makes the code bit of the LDPC code the symbol (symbolizes) as described above; the multiple number b represents the number of symbols obtained by so-called single symbolization by the demultiplexer 25.

FIG. 18A illustrates the configuration example of the demultiplexer 25 in a case in which the modulation scheme is the 64QAM, so that the number of code bits m of the LDPC code to be made one symbol is six.

In FIG. 18A, the multiple number b is set to 1, so that the memory 31 has the storage capacity of N/(6×1)×(6×1) bits (in column direction×row direction).

A storage region extending in the column direction with one bit in the row direction of the memory 31 is hereinafter appropriately referred to as a column. In FIG. 18A, the memory 31 is composed of six (=6×1) columns.

The demultiplexer 25 writes the code bits of the LDPC code from the top of the column composing the memory 31 downward (in the column direction) from a left column to a right column.

When the writing of the code bits is finished up to an undermost portion of a rightmost column, the code bits are read in units of six bits (mb bits) in the row direction from a first row of all the columns composing the memory 31 to be supplied to the interchange unit 32.

The interchange unit 32 performs the interchanging process to interchange the positions of the six code bits from the memory 31 and outputs the six bits obtained as a result as the six symbol bits $y_0$, $y_1$, $y_2$, $y_3$, $y_4$, and $y_5$ representing one symbol of the 64QAM.

That is to say, the mb (herein, six) code bits are read from the memory 31 in the row direction, and when an i-th bit (i=0, 1, . . . , mb−1) from the highest-order bit of the mb code bits read from the memory 31 is represented as a bit bi, the six code bits read from the memory 31 in the row direction may be represented as bits $b_0$, $b_1$, $b_2$, $b_3$, $b_4$, and $b_5$ in order from the highest-order bit.

According to relationship of the column weight as illustrated in FIGS. 12 and 13, the code bit in a direction of the bit $b_0$ is the code bit tolerant to error and the code bit in a direction of the bit $b_5$ is the code bit less tolerant to error.

The interchange unit 32 may perform the interchanging process to interchange positions of the six code bits $b_0$ to $b_5$ from the memory 31 such that the code bit less tolerant to error out of the six code bits $b_0$ to $b_5$ from the memory 31 is allocated to the strong bit out of the symbol bits $y_0$ to $y_5$ of one symbol of the 64QAM.

Herein, various schemes are suggested by many companies as an interchanging scheme of interchanging the six code bits $b_0$ to $b_5$ from the memory 31 and allocating the same to the six symbol bits $y_0$ to $y_5$ representing one symbol of the 64QAM.

FIG. 18B illustrates a first interchanging scheme, FIG. 18C illustrates a second interchanging scheme, and FIG. 18D illustrates a third interchanging scheme, respectively.

In FIGS. 18B to 18D (also in FIG. 19 to be illustrated later), a line segment connecting the bits $b_i$ and $y_j$ indicates that the code bit $b_i$ is allocated to the symbol bit $y_j$ of the symbol (interchanged to a position of the symbol bit $y_j$).

As the first interchanging scheme in FIG. 18B, it is suggested to adopt any one of three interchanging methods and as the second interchanging scheme in FIG. 18C, it is suggested to adopt any one of two interchanging methods.

As the third interchanging scheme in FIG. 18D, it is suggested to sequentially select from six interchanging methods to use.

Figure 19:
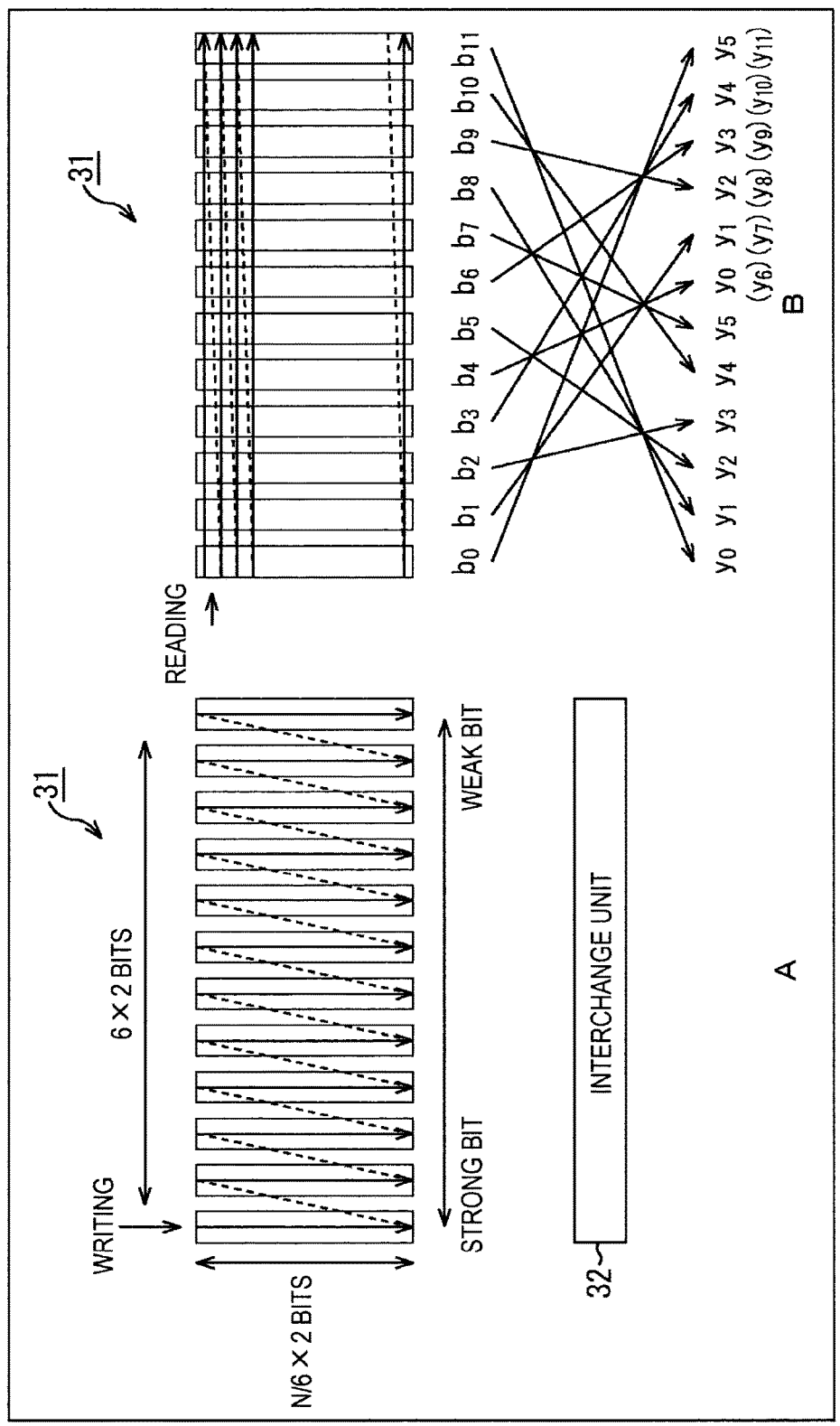
FIG. 19 is a view illustrating the process of the demultiplexer 25.

FIG. 19 illustrates the configuration example of the demultiplexer 25 in a case in which the modulation scheme is the 64QAM (therefore, the number of code bits m of the LDPC code mapped onto one symbol is six as in FIG. 18) and the multiple number b is set to 2, and a fourth interchanging scheme.

When the multiple number b is set to 2, the memory 31 has the storage capacity of N/(6×2)×(6×2) bits (in column direction×row direction) and is composed of 12 (=6×2) columns.

FIG. 19A illustrates the order of writing of the LDPC code to the memory 31.

The demultiplexer 25 writes the code bits of the LDPC code from the top of the column composing the memory 31 downward (in the column direction) from the left column to the right column as illustrated in FIG. 18.

When the writing of the code bits is finished up to the undermost portion of the rightmost column, the code bits are read in units of 12 bits (mb bits) in the row direction from the first row of all the columns composing the memory 31 to be supplied to the interchange unit 32.

The interchange unit 32 performs the interchanging process to interchange the positions of the 12 code bits from the memory 31 by the fourth interchanging scheme and outputs the 12 bits obtained as a result as the 12 bits representing two symbols (b symbols) of the 64QAM, that is to say, the six symbol bits $y_0, y_1, y_2, y_3, y_4$, and $y_5$ representing one symbol of the 64QAM and the six symbol bits $y_0, y_1, y_2, y_3, y_4$, and $y_5$ representing next one symbol.

Herein, FIG. 19B illustrates the fourth interchanging scheme of the interchanging process by the interchange unit 32 in FIG. 19A.

Meanwhile, when the multiple number b is set to 2 (also when this is set to 3), the mb code bits are allocated to mb symbol bits of successive b symbols in the interchanging process. Hereinafter, also in FIG. 19, the i+1-th bit from the highest-order bit of the mb symbol bits of the successive b symbols is represented as the bit (symbol bit) $y_i$ for convenience of description.

An appropriate interchanging method, that is to say, the method of further improving the bit error rate in the AWGN communication channel is different according to the code rate, the code length, the modulation scheme and the like of the LDPC code.

[Parity Interleave]

Next, the parity interleave by the parity interleaver 23 in FIG. 9 is described with reference to FIGS. 20 to 22.

Figure 20:
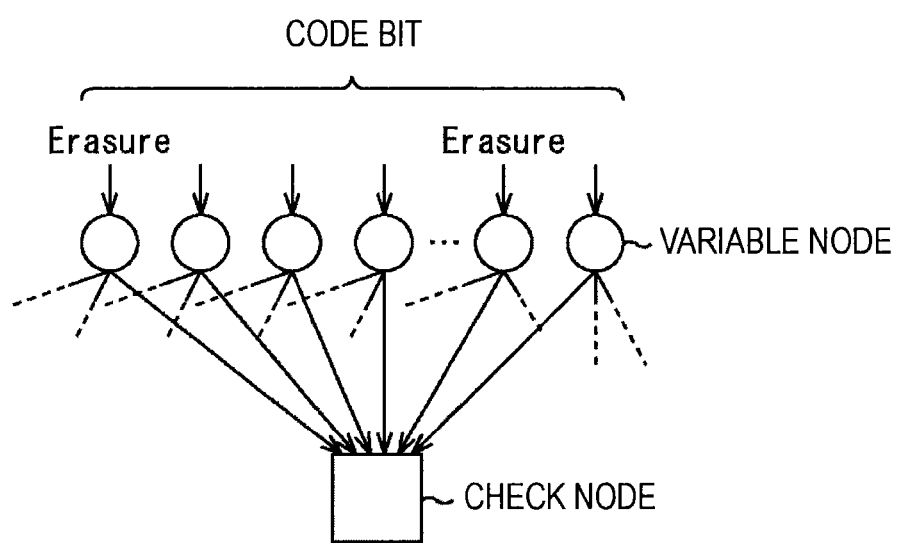
FIG. 20 is a view illustrating the Tanner graph for decoding of the LDPC code.

FIG. 20 illustrates (a part of) a Tanner graph of the parity check matrix of the LDPC code.

The check node returns the message indicating that the probability that the value is 0 and the probability that the value is 1 are equal to all the variable nodes connected to the check node when the error such as the erasure occurs in a plurality (for example, two) of (code bits corresponding to the) variable nodes connected to the check node at the same time as illustrated in FIG. 20. Therefore, when the erasure and the like occur at the same time in a plurality of variable nodes connected to the same check node, the decoding performance is deteriorated.

The LDPC code specified in the DVB-T.2 standard output by the LDPC encoder 115 in FIG. 8 is the IRA code and the parity matrix $H_T$ of the parity check matrix H has the stepwise structure as illustrated in FIG. 11.

Figure 21:
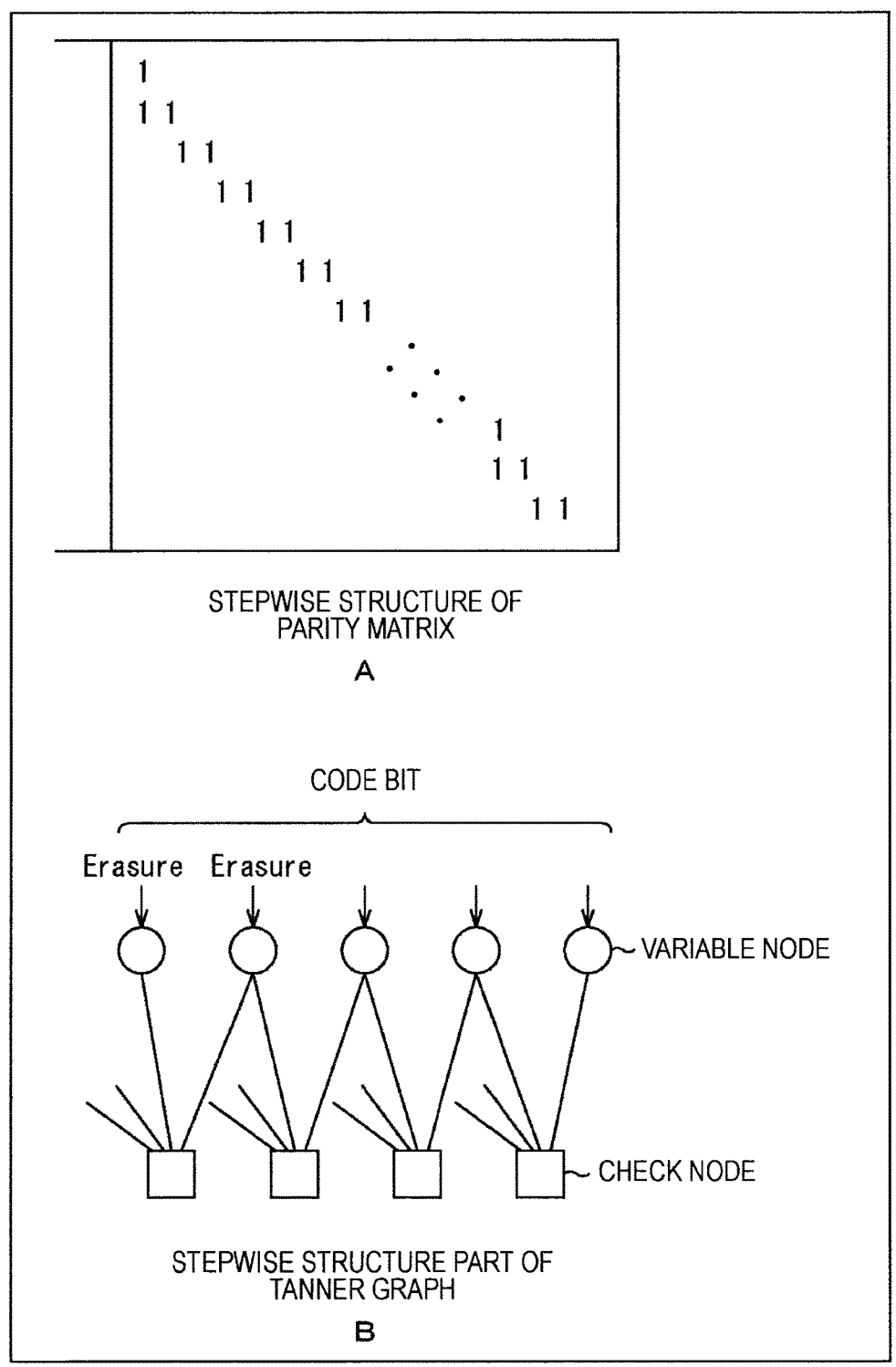
FIG. 21 is a view illustrating a parity matrix $H_T$ having a stepwise structure and the Tanner graph corresponding to the parity matrix $H_T$.

FIG. 21 illustrates the parity matrix $H_T$ having the stepwise structure and the Tanner graph corresponding to the parity matrix $H_T$.

That is to say, FIG. 21A illustrates the parity matrix $H_T$ having the stepwise structure and FIG. 21B illustrates the Tanner graph corresponding to the parity matrix $H_T$ in FIG. 21A.

In the parity matrix $H_T$ having the stepwise structure, the elements of 1 are adjacent to each other in each row (except the first row). Therefore, in the Tanner graph of the parity matrix $H_T$, two adjacent variable nodes corresponding to the columns of the two adjacent elements whose value is 1 of the parity matrix $H_T$ are connected to the same check node.

Therefore, when the error occurs in the parity bits corresponding to the above-described adjacent two variable nodes at the same time due to the burst error, the erasure and the like, the check node connected to the two variable nodes (the variable nodes, which obtain the message using the parity bits) corresponding to the two parity bits in which the error occurs returns the message indicating that the probability that the value is 0 and the probability that the value is 1 are equal to the variable nodes connected to the check node, so that the decoding performance is deteriorated. When a burst length (the number of parity bits in which the error is successively occurs) increases, the number of check nodes, which return the message of the equal probability, increases and the decoding performance is further deteriorated.

Then, the parity interleaver 23 (FIG. 9) performs the parity interleave to interleave the parity bit of the LDPC code from the LDPC encoder 115 to the position of another parity bit in order to prevent the above-described deterioration in decoding performance.

Figure 22:
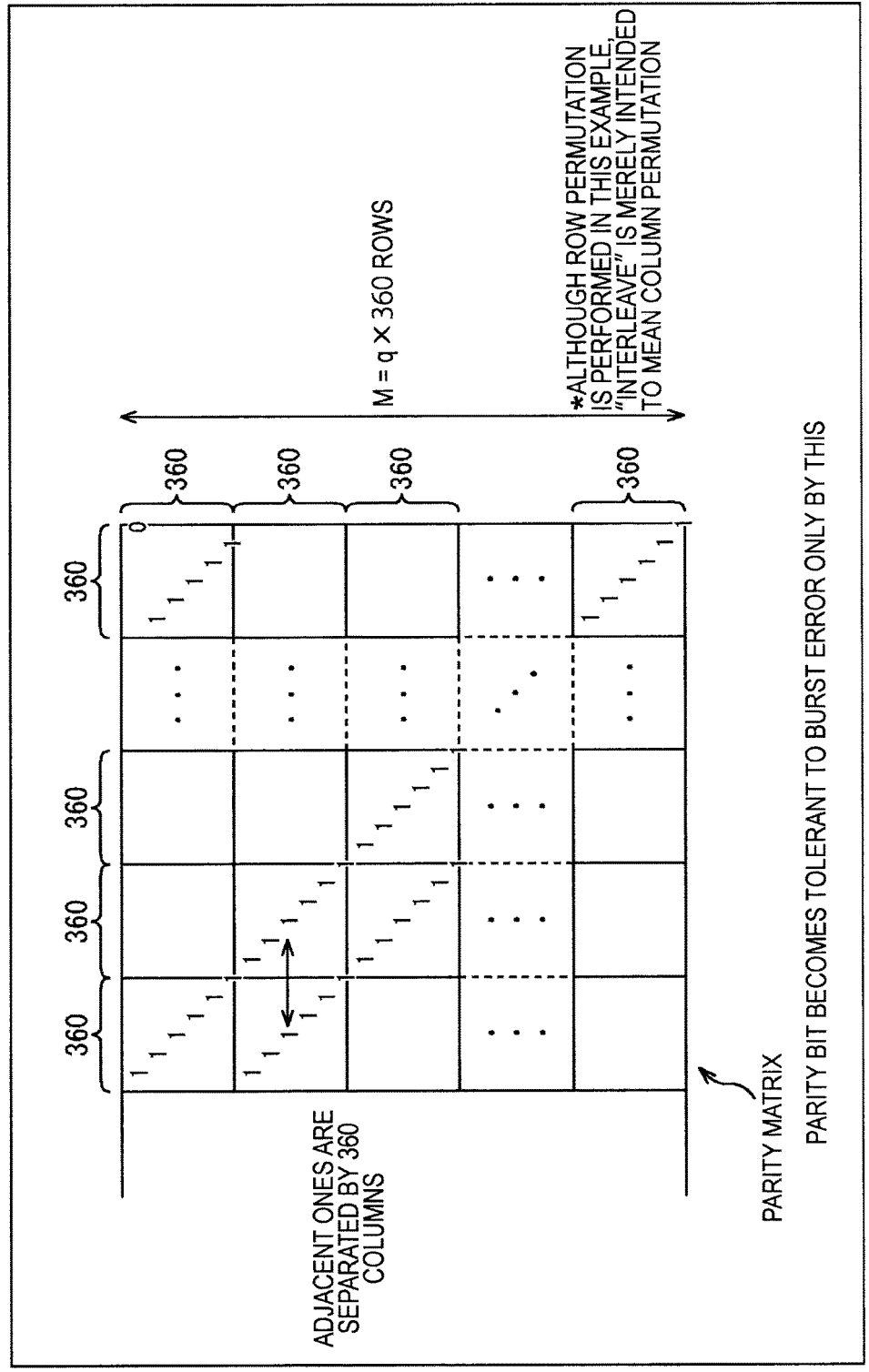
FIG. 22 is a view illustrating the parity matrix $H_T$ of the parity check matrix H corresponding to the LDPC code after parity interleave.

FIG. 22 illustrates the parity matrix $H_T$ of the parity check matrix H corresponding to the LDPC code after the parity interleave performed by the parity interleaver 23 in FIG. 9.

Herein, the information matrix $H_A$ of the parity check matrix H corresponding to the LDPC code specified in the DVB-T.2 standard output by the LDPC encoder 115 has a cyclic structure.

The term "cyclic structure" is intended to mean a structure in which a certain column is identical to a column obtained by a cyclic shift of another column including a structure in which a position of 1 in each row of P columns is set to a position obtained by the cyclic shift of a first column of the P columns in the column direction by a value proportional to a value q obtained by dividing the parity length M for each P columns, for example. Hereinafter, P in the cyclic structure is appropriately referred to as the number of columns being a unit of the cyclic structure.

There are two types of LDPC codes whose code lengths N are 64800 bits and 16200 bits as the LDPC code specified in the DVB-T.2 standard as illustrated in FIGS. 12 and 13, and the number of columns P being the unit of the cyclic structure is set to 360, which is one of submultiples other than 1 and M out of the submultiples of the parity length M for both of the two LDPC codes.

The parity length M is set to a value other than a prime number represented by an equation $M = q \times P = q \times 360$ using the value q different according to the code rate. Therefore, as the number of columns P being the unit of the cyclic structure, the value q also is another submultiple other than 1 and M out of the submultiples of the parity length M and this may be obtained by dividing the parity length M by the number of columns P being the unit of the cyclic structure (a product of P and q being the submultiples of the parity length M is the parity length M).

When the information length is K, an integer not smaller than 0 and smaller than P is x, and an integer not smaller than 0 and smaller than q is y, the parity interleaver 23 interleaves a K+qx+y+1-th code bit out of the code bits of the N-bit LDPC code to a position of a K+Py+x+1-th code bit as the parity interleave as described above.

Both the K+qx+y+1-th code bit and the K+Py+x+1-th code bit are the code bits after a K+1-th code bit, so that they are the parity bits, therefore, the position of the parity bit of the LDPC code is moved by the parity interleave.

According to such parity interleave, (the parity bits corresponding to) the variable nodes connected to the same check node are apart from each other by the number of columns P being the unit of the cyclic structure, that is to say, herein 360 bits, so that a situation in which the error occurs in a plurality of variable nodes connected to the same check node at the same time may be avoided in a case in which the burst length is shorter than 360 bits, and as a result, the resistance to burst error may be improved.

Meanwhile, the LDPC code after the parity interleave to interleave the K+qx+y+1-th code bit to the position of the K+Py+x+1-th code bit is identical to the LDPC code of the parity check matrix obtained by performing column permutation to change the K+qx+y+1-th column of the original parity check matrix H to the K+qx+x+1-th column (hereinafter, also referred to as a conversion parity check matrix).

Also, a quasi-cyclic structure in units of P columns (360 columns in FIG. 22) appears in the parity matrix of the conversion parity check matrix as illustrated in FIG. 22.

Herein, the term "quasi-cyclic structure" is intended to mean a structure in which a portion except a part has the cyclic structure. In the conversion parity check matrix obtained by applying the column permutation corresponding to the parity interleave to the parity check matrix of the LDPC code specified in the DVB-T.2 standard, one element 1 is lacking (there is an element 0) in a portion of 360 rows×360 columns in a right corner thereof (a shift matrix to be described later), so that this does not have the (complete) cyclic structure and has the so-called quasi-cyclic structure in this point.

Meanwhile, the conversion parity check matrix in FIG. 22 is the matrix obtained by applying permutation of the row (row permutation) for allowing the conversion parity check matrix to be composed of a constitutive matrix to be described later to the original parity check matrix H in addition to the column permutation corresponding to the parity interleave.

[Column Twist Interleave]

Next, the column twist interleave as the rearranging process by the column twist interleaver 24 in FIG. 9 is described with reference to FIGS. 23 to 26.

The transmitting device 11 in FIG. 8 transmits one or more code bits of the LDPC code as one symbol. That is to say, when two code bits are made one symbol, for example, the QPSK is used as the modulation scheme, for example, and when four code bits are made one symbol, the 16QAM is used as the modulation scheme, for example.

In a case in which two or more code bits are transmitted as one symbol, when the erasure and the like occurs in a certain symbol, the error (erasure) occurs in all of the code bits of the symbol.

Therefore, it is required to prevent the variable nodes corresponding to the code bits of one symbol from being connected to the same check node in order to decrease the probability that the erasure occurs in a plurality of (code bits corresponding to the) variable nodes connected to the same check node at the same time in order to improve the decoding performance.

On the other hand, as described above, in the parity check matrix H of the LDPC code specified in the DVB-T.2 standard output by the LDPC encoder 115, the information matrix $H_A$ has the cyclic structure and the parity matrix $H_T$ has the stepwise structure. As illustrated in FIG. 22, in the conversion parity check matrix being the parity check matrix of the LDPC code after the parity interleave, the cyclic structure (correctly, the quasi-cyclic structure as described above) also appears in the parity matrix.

Figure 23:
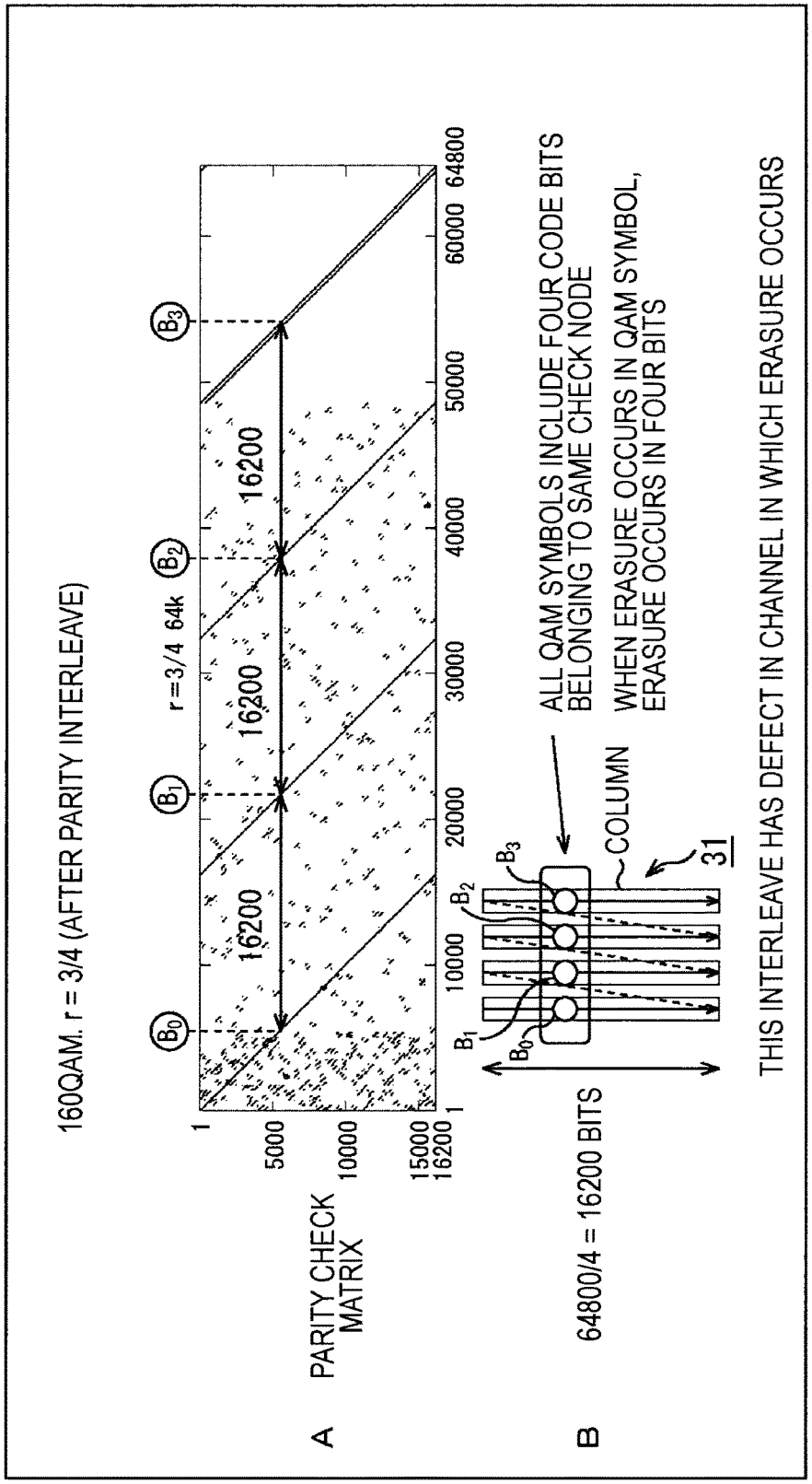
FIG. 23 is a view illustrating a conversion parity check matrix.

FIG. 23 illustrates the conversion parity check matrix.

That is to say, FIG. 23A illustrates the conversion parity check matrix of the parity check matrix H of the LDPC code whose code length N is 64800 bits and code rate (r) is 3/4.

In FIG. 23A, in the conversion parity check matrix, a position of the element whose value is 1 is indicated by a dot (·).

FIG. 23B illustrates the process performed by the demultiplexer 25 (FIG. 9) to the LDPC code of the conversion parity check matrix in FIG. 23A, that is to say, the LDPC code after the parity interleave.

In FIG. 23B, the code bits of the LDPC code after the parity interleave are written in the column direction to four columns composing the memory 31 of the demultiplexer 25 with the 16QAM as the modulation scheme.

The code bits written in the column direction to the four columns composing the memory 31 are read in units of four bits in the row direction to be made one symbol.

In this case, four code bits $B_0$, $B_1$, $B_2$, and $B_3$, which are made one symbol, might be the code bits corresponding to 1 in an optional row of the conversion parity check matrix in FIG. 23A, and in this case, the variable nodes corresponding to the code bits $B_0$, $B_1$, $B_2$, and $B_3$ are connected to the same check node.

Therefore, when the four code bits $B_0$, $B_1$, $B_2$, and $B_3$ of one symbol are the code bits corresponding to 1 in an optional row of the conversion parity check matrix, if the erasure occurs in the symbol, an appropriate message cannot be obtained in the check node to which the variable nodes corresponding to the code bits $B_0$, $B_1$, $B_2$, and $B_3$ are connected, and as a result, the decoding performance is deteriorated.

As for the code rate other than 3/4, similarly, there is a case in which a plurality of code bits corresponding to a plurality of variable nodes connected to the same check node is made one symbol of the 16QAM.

Therefore, the column twist interleaver 24 performs the column twist interleave to interleave the code bit of the LDPC code after the parity interleave from the parity interleaver 23 such that a plurality of code bits corresponding to 1 in an optional row of the conversion parity check matrix is not included in one symbol.

Figure 24:
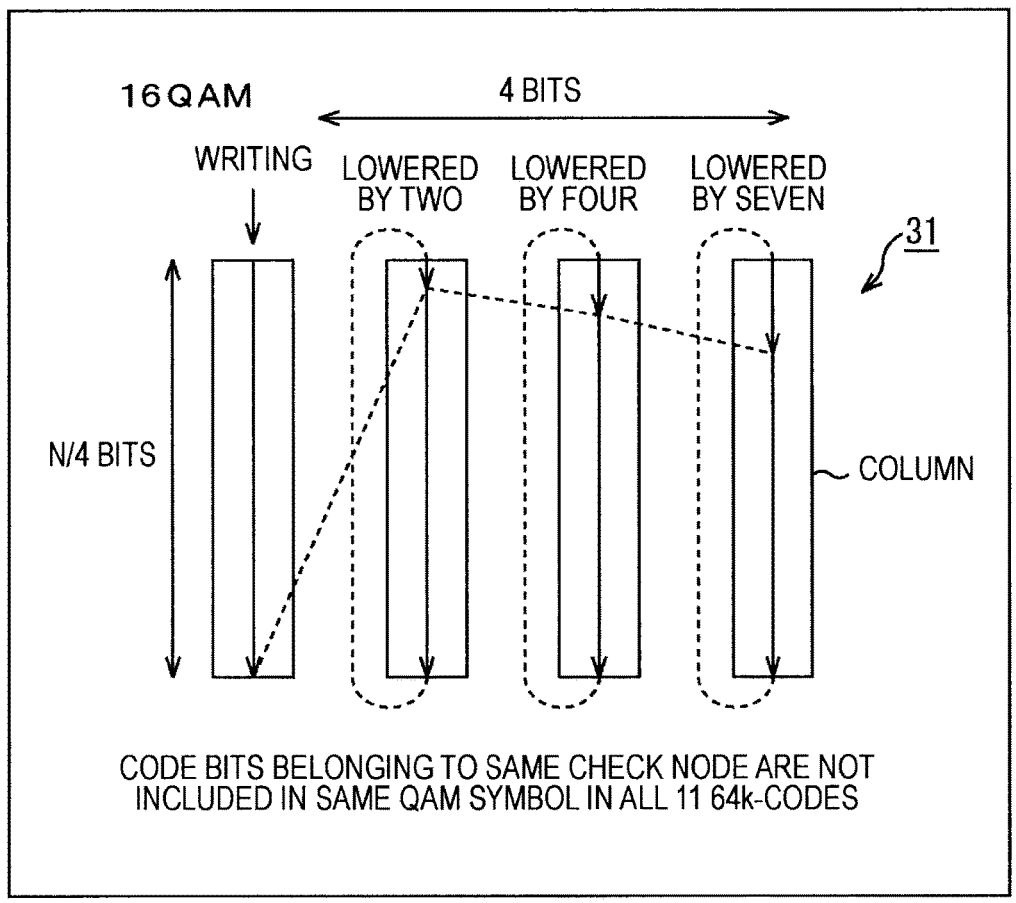
FIG. 24 is a view illustrating a process of a column twist interleaver 24.

FIG. 24 is a view illustrating the column twist interleave.

That is to say, FIG. 24 illustrates the memory 31 of the demultiplexer 25 (FIGS. 18 and 19).

The memory 31 has the storage capacity to store the mb bits in the column (vertical) direction and the N/(mb) bits in the row (horizontal) direction and is composed of mb columns as illustrated in FIG. 18. Then, the column twist interleaver 24 performs the column twist interleave by controlling a writing start position when the code bits of the LDPC code are written in the column direction and read in the row direction to/from the memory 31.

That is to say, the column twist interleaver 24 prevents a plurality of code bits, which is made one symbol, read in the row direction from being the code bits corresponding to 1 in an optional row of the conversion parity check matrix (rearranges the code bits of the LDPC code such that a plurality of code bits corresponding to 1 in an optional row of the parity check matrix is not included in the same symbol) by appropriately changing the writing start position at which the writing of the code bit is started for each of a plurality of columns.

Herein, FIG. 24 illustrates a configuration example of the memory 31 in a case in which the modulation scheme is the 16QAM and the multiple number b illustrated in FIG. 18 is set to 1. Therefore, the number of code bits m of the LDPC code, which are made one symbol, is four and the memory 31 is composed of four (=mb) columns.

The column twist interleaver 24 writes the code bits of the LDPC code (in place of the demultiplexer 25 in FIG. 18) from the top of the four columns composing the memory 31 downward (in the column direction) from a left column to a right column.

When the writing of the code bits is finished up to a rightmost column, the column twist interleaver 24 reads the code bits in units of four bits (mb bits) in the row direction from a first row of all the columns composing the memory 31 and outputs the same to the interchange unit 32 of the demultiplexer 25 (FIGS. 18 and 19) as the LDPC code after the column twist interleave.

In the column twist interleaver 24, when an address of each position in the column direction is represented by an integer in ascending order while setting the address of a top (uppermost) position of each column to 0, the writing start position is set to a position whose address is 0 for a leftmost column, the writing start position is set to a position whose address is 2 for a second column (from left), the writing start position is set to a position whose address is 4 for a third column, and the writing start position is set to a position whose address is 7 for a fourth column.

Meanwhile, as for the column in which the writing start position is located on a position other than the position whose address is 0, when the code bits are written up to the undermost position, it is returned to the top (position whose address is 0) and the writing is performed up to a position just before the writing start position. Thereafter, the writing to the next (right) column is performed.

By performing the above-described column twist interleave, it is possible to avoid a situation in which a plurality of code bits corresponding to a plurality of variable nodes connected to the same check node is made one symbol of the 16QAM (in which they are included in the same symbol) for the LDPC code specified in the DVB-T.2 standard, and as a result, the decoding performance in the communication channel in which the erasure occurs may be improved.

FIG. 25 illustrates the number of columns of the memory 31 required for the column twist interleave and the address of the writing start position for each modulation scheme for the LDPC code of each of 11 code rates whose code length N is 64800 specified in the DVB-T.2 standard.

When the multiple number b is set to 1 and when the number of bits m of one symbol is two by adoption of the QPSK, for example, as the modulation scheme, according to FIG. 25, the memory 31 has two columns, which store 2×1(=mb) bits in the row direction, and stores 64800/(2×1) bits in the column direction.

The writing start position of a first column out of the two columns of the memory 31 is set to the position whose address is 0 and the writing start position of a second column is set to the position whose address is 2.

Meanwhile, when any of the first to third interchanging schemes in FIG. 18 is adopted as the interchanging scheme of the interchanging process of the demultiplexer 25 (FIG. 9), for example, the multiple number b is set to 1.

When the multiple number is set to 2 and when the number of bits m of one symbol is two by the adoption of the QPSK, for example, as the modulation scheme, according to FIG. 25, the memory 31 has the four columns, which store 2×2 bits in the row direction, and stores 64800/(2×2) bits in the column direction.

The writing start position of the first column out of the four columns of the memory 31 is set to the position whose address is 0, the writing start position of the second column is set to the position whose address is 2, the writing start position of the third column is set to the position whose address is 4, and the writing start position of the fourth column is set to the position whose address is 7.

Meanwhile, when the fourth interchanging scheme in FIG. 19 is adopted as the interchanging scheme of the interchanging process of the demultiplexer 25 (FIG. 9), for example, the multiple number b is set to 2.

When the multiple number b is set to 1 and when the number of bits m of one symbol is four by the adoption of the 16QAM, for example, as the modulation scheme, according to FIG. 25, the memory 31 has the four columns, which store 4×1 bits in the row direction, and stores 64800/(4×1) bits in the column direction.

The writing start position of the first column out of the four columns of the memory 31 is set to the position whose address is 0, the writing start position of the second column is set to the position whose address is 2, the writing start position of the third column is set to the position whose address is 4, and the writing start position of the fourth column is set to the position whose address is 7.

When the multiple number is set to 2 and when the number of bits m of one symbol is four by the adoption of the 16QAM, for example, as the modulation scheme, according to FIG. 25, the memory 31 has eight columns, which store 4×2 bits in the row direction, and stores 64800/(4×2) bits in the column direction.

The writing start position of a first column out of the eight columns of the memory 31 is set to the position whose address is 0, the writing start position of a second column is set to the position whose address is 0, the writing start position of a third column is set to the position whose address is 2, the writing start position of a fourth column is set to the position whose address is 4, the writing start position of a fifth column is set to the position whose address is 4, the writing start position of a sixth column is set to a position whose address is 5, the writing start position of a seventh column is set to the position whose address is 7, and the writing start position of an eighth column is set to the position whose address is 7.

When the multiple number b is set to 1 and when the number of bits m of one symbol is six by the adoption of the 64QAM, for example, as the modulation scheme, according to FIG. 25, the memory 31 has six columns, which store 6×1 bits in the row direction, and stores 64800/(6×1) bits in the column direction.

The writing start position of a first column out of the six columns of the memory 31 is set to the position whose address is 0, the writing start position of a second column is set to the position whose address is 2, the writing start position of a third column is set to the position whose address is 5, the writing start position of a fourth column is set to a position whose address is 9, the writing start position of a fifth column is set to a position whose address is 10, and the writing start position of a sixth column is set to a position whose address is 13.

When the multiple number b is set to 2 and when the number of bits m of one symbol is six by the adoption of the 64QAM, for example, as the modulation scheme, according to FIG. 25, the memory 31 has 12 columns, which store 6×2 bits in the row direction, and stores 64800/(6×2) bits in the column direction.

The writing start position of a 1st column out of the 12 columns of the memory 31 is set to the position whose address is 0, the writing start position of a 2nd column is set to the position whose address is 0, the writing start position of a 3rd column is set to the position whose address is 2, the writing start position of a 4th column is set to the position whose address is 2, the writing start position of a 5th column is set to a position whose address is 3, the writing start position of a 6th column is set to the position whose address is 4, the writing start position of a 7th column is set to the position whose address is 4, the writing start position of an 8th column is set to the position whose address is 5, the writing start position of a 9th column is set to the position whose address is 5, the writing start position of a 10th column is set to the position whose address is 7, the writing start position of an 11th column is set to a position whose address is 8, and the writing start position of a 12th column is set to the position whose address is 9.

When the multiple number b is set to 1 and when the number of bits m of one symbol is eight by the adoption of the 256QAM, for example, as the modulation scheme, according to FIG. 25, the memory 31 has the eight columns, which store 8×1 bits in the row direction, and stores 64800/(8×1) bits in the column direction.

The writing start position of the first column out of the eight columns of the memory 31 is set to the position whose address is 0, the writing start position of the second column is set to the position whose address is 0, the writing start position of the third column is set to the position whose address is 2, the writing start position of the fourth column is set to the position whose address is 4, the writing start position of the fifth column is set to the position whose address is 4, the writing start position of the sixth column is set to the position whose address is 5, the writing start position of the seventh column is set to the position whose address is 7, and the writing start position of the eighth column is set to the position whose address is 7.

When the multiple number is set to 2 and when the number of bits m of one symbol is eight by the adoption of the 256QAM, for example, as the modulation scheme, according to FIG. 25, the memory 31 has 16 columns, which store 8×2 bits in the row direction, and stores 64800/(8×2) bits in the column direction.

The writing start position of a 1st column out of the 16 columns of the memory 31 is set to the position whose address is 0, the writing start position of a 2nd column is set to the position whose address is 2, the writing start position of a 3rd column is set to the position whose address is 2, the writing start position of a 4th column is set to the position whose address is 2, the writing start position of a 5th column is set to the position whose address is 2, the writing start position of a 6th column is set to a position whose address is 3, the writing start position of a 7th column is set to the position whose address is 7, the writing start position of an 8th column is set to a position whose address is 15, the writing start position of a 9th column is set to a position whose address is 16, the writing start position of a 10th column is set to a position whose address is 20, the writing start position of an 11th column is set to a position whose address is 22, the writing start position of a 12th column is set to the position whose address is 22, the writing start position of a 13th column is set to a position whose address is 27, the writing start position of a 14th column is set to the position whose address is 27, the writing start position of a 15th column is set to a position whose address is 28, and the writing start position of a 16th column is set to a position whose address is 32.

When the multiple number b is set to 1 and when the number of bits m of one symbol is 10 by the adoption of the 1024QAM, for example, as the modulation scheme, according to FIG. 25, the memory 31 has 10 columns, which store 10×1 bits in the row direction, and stores 64800/(10×1) bits in the column direction.

The writing start position of a 1st column out of the 10 columns of the memory 31 is set to the position whose address is 0, the writing start position of a 2nd column is set to the position whose address is 3, the writing start position of a 3rd column is set to a position whose address is 6, the writing start position of a 4th column is set to the position whose address is 8, the writing start position of a 5th column is set to a position whose address is 11, the writing start position of a 6th column is set to a position whose address is 13, the writing start position of a 7th column is set to the position whose address is 15, the writing start position of an 8th column is set to a position whose address is 17, the writing start position of a 9th column is set to a position whose address is 18, and the writing start position of a 10th column is set to the position whose address is 20.

When the multiple number is set to 2 and when the number of bits m of one symbol is 10 by the adoption of the 1024QAM, for example, as the modulation scheme, according to FIG. 25, the memory 31 has 20 columns, which store 10×2 bits in the row direction, and stores 64800/(10×2) bits in the column direction.

The writing start position of a 1st column out of the 20 columns of the memory 31 is set to the position whose address is 0, the writing start position of a 2nd column is set to a position whose address is 1, the writing start position of a 3rd column is set to the position whose address is 3, the writing start position of a 4th column is set to the position whose address is 4, the writing start position of a 5th column is set to the position whose address is 5, the writing start position of a 6th column is set to the position whose address is 6, the writing start position of a 7th column is set to the position whose address is 6, the writing start position of an 8th column is set to the position whose address is 9, the writing start position of a 9th column is set to the position whose address is 13, the writing start position of a 10th column is set to a position whose address is 14, the writing start position of an 11th column is set to the position whose address is 14, the writing start position of a 12th column is set to the position whose address is 16, the writing start position of a 13th column is set to a position whose address is 21, the writing start position of a 14th column is set to the position whose address is 21, the writing start position of a 15th column is set to a position whose address is 23, the writing start position of a 16th column is set to a position whose address is 25, the writing start position of a 17th column is set to the position whose address is 25, the writing start position of an 18th column is set to a position whose address is 26, the writing start position of a 19th column is set to the position whose address is 28, and the writing start position of a 20th column is set to a position whose address is 30.

When the multiple number b is set to 1 and when the number of bits m of one symbol is 12 by the adoption of the 4096QAM, for example, as the modulation scheme, according to FIG. 25, the memory 31 has the 12 columns, which store 12×1 bits in the row direction, and stores 64800/(12×1) bits in the column direction.

The writing start position of the 1st column out of the 12 columns of the memory 31 is set to the position whose address is 0, the writing start position of the end column is set to the position whose address is 0, the writing start position of the 3rd column is set to the position whose address is 2, the writing start position of the 4th column is set to the position whose address is 2, the writing start position of the 5th column is set to the position whose address is 3, the writing start position of the 6th column is set to the position whose address is 4, the writing start position of the 7th column is set to the position whose address is 4, the writing start position of the 8th column is set to the position whose address is 5, the writing start position of the 9th column is set to the position whose address is 5, the writing start position of the 10th column is set to the position whose address is 7, the writing start position of the 11th column is set to the position whose address is 8, and the writing start position of the 12th column is set to the position whose address is 9.

When the multiple number is set to 2 and when the number of bits m of one symbol is 12 by the adoption of the 4096QAM, for example, as the modulation scheme, according to FIG. 25, the memory 31 has 24 columns, which store 12×2 bits in the row direction, and stores 64800/(12×2) bits in the column direction.

The writing start position of a 1st column out of the 24 columns of the memory 31 is set to the position whose address is 0, the writing start position of a 2nd column is set to the position whose address is 5, the writing start position of a 3rd column is set to the position whose address is 8, the writing start position of a 4th column is set to the position whose address is 8, the writing start position of a 5th column is set to the position whose address is 8, the writing start position of a 6th column is set to the position whose address is 8, the writing start position of a 7th column is set to the position whose address is 10, the writing start position of an 8th column is set to the position whose address is 10, the writing start position of a 9th column is set to the position whose address is 10, the writing start position of a 10th column is set to a position whose address is 12, the writing start position of an 11th column is set to the position whose address is 13, the writing start position of a 12th column is set to the position whose address is 16, the writing start position of a 13th column is set to a position whose address is 17, the writing start position of a 14th column is set to a position whose address is 19, the writing start position of a 15th column is set to the position whose address is 21, the writing start position of a 16th column is set to the position whose address is 22, the writing start position of a 17th column is set to the position whose address is 23, the writing start position of an 18th column is set to the position whose address is 26, the writing start position of a 19th column is set to a position whose address is 37, the writing start position of a 20th column is set to a position whose address is 39, the writing start position of a 21st column is set to a position whose address is 40, the writing start position of a 22nd column is set to a position whose address is 41, the writing start position of a 23rd column is set to the position whose address is 41, and the writing start position of a 24th column is set to the position whose address is 41.

FIG. 26 illustrates the number of columns of the memory 31 required for the column twist interleave and the address of the writing start position for each modulation scheme for the LDPC code of each of 10 code rates whose code length N is 16200 specified in the DVB-T.2 standard.

When the multiple number b is set to 1 and when the number of bits m of one symbol is two by the adoption of the QPSK, for example, as the modulation scheme, according to FIG. 26, the memory 31 has the two columns, which store 2×1 bits in the row direction, and stores 16200/(2×1) bits in the column direction.

The writing start position of the first column out of the two columns of the memory 31 is set to the position whose address is 0 and the writing start position of the second column is set to the position whose address is 0.

When the multiple number b is set to 2 and when the number of bits m of one symbol is two by the adoption of the QPSK, for example, as the modulation scheme, according to FIG. 26, the memory 31 has the four columns, which store 2×2 bits in the row direction, and stores 16200/(2×2) bits in the column direction.

The writing start position of the first column out of the four columns of the memory 31 is set to the position whose address is 0, the writing start position of the second column is set to the position whose address is 2, the writing start position of the third column is set to the position whose address is 3, and the writing start position of the fourth column is set to the position whose address is 3.

When the multiple number b is set to 1 and when the number of bits m of one symbol is four by the adoption of the 16QAM, for example, as the modulation scheme, according to FIG. 26, the memory 31 has the four columns, which store 4×1 bits in the row direction, and stores 16200/(4×1) bits in the column direction.

The writing start position of the first column out of the four columns of the memory 31 is set to the position whose address is 0, the writing start position of the second column is set to the position whose address is 2, the writing start position of the third column is set to the position whose address is 3, and the writing start position of the fourth column is set to the position whose address is 3.

When the multiple number b is set to 2 and when the number of bits m of one symbol is four by the adoption of the 16QAM, for example, as the modulation scheme, according to FIG. 26, the memory 31 has the eight columns, which store 4×2 bits in the row direction, and stores 16200/(4×2) bits in the column direction.

The writing start position of the first column out of the eight columns of the memory 31 is set to the position whose address is 0, the writing start position of the second column is set to the position whose address is 0, the writing start position of the third column is set to the position whose address is 0, the writing start position of the fourth column is set to the position whose address is 1, the writing start position of the fifth column is set to the position whose address is 7, the writing start position of the sixth column is set to the position whose address is 20, the writing start position of the seventh column is set to the position whose address is 20, and the writing start position of the eighth column is set to the position whose address is 21.

When the multiple number b is set to 1 and when the number of bits m of one symbol is six by the adoption of the 64QAM, for example, as the modulation scheme, according to FIG. 26, the memory 31 has the six columns, which store 6×1 bits in the row direction, and stores 16200/(6×1) bits in the column direction.

The writing start position of the first column out of the six columns of the memory 31 is set to the position whose address is 0, the writing start position of the second column is set to the position whose address is 0, the writing start position of the third column is set to the position whose address is 2, the writing start position of the fourth column is set to the position whose address is 3, the writing start position of the fifth column is set to the position whose address is 7, and the writing start position of the sixth column is set to the position whose address is 7.

When the multiple number b is set to 2 and when the number of bits m of one symbol is six by the adoption of the 64QAM, for example, as the modulation scheme, according to FIG. 26, the memory 31 has the 12 columns, which store 6×2 bits in the row direction, and stores 16200/(6×2) bits in the column direction.

The writing start position of the 1st column out of the 12 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 2, the writing start position of the 5th column is set to the position whose address is 2, the writing start position of the 6th column is set to the position whose address is 2, the writing start position of the 7th column is set to the position whose address is 3, the writing start position of the 8th column is set to the position whose address is 3, the writing start position of the 9th column is set to the position whose address is 3, the writing start position of the 10th column is set to the position whose address is 6, the writing start position of the 11th column is set to the position whose address is 7, and the writing start position of the 12th column is set to the position whose address is 7.

When the multiple number b is set to 1 and when the number of bits m of one symbol is eight by the adoption of the 256QAM, for example, as the modulation scheme, according to FIG. 26, the memory 31 has the eight columns, which store 8×1 bits in the row direction, and stores 16200/(8×1) bits in the column direction.

The writing start position of the first column out of the eight columns of the memory 31 is set to the position whose address is 0, the writing start position of the second column is set to the position whose address is 0, the writing start position of the third column is set to the position whose address is 0, the writing start position of the fourth column is set to the position whose address is 1, the writing start position of the fifth column is set to the position whose address is 7, the writing start position of the sixth column is set to the position whose address is 20, the writing start position of the seventh column is set to the position whose address is 20, and the writing start position of the eighth column is set to the position whose address is 21.

When the multiple number b is set to 1 and when the number of bits m of one symbol is 10 by the adoption of the 1024QAM, for example, as the modulation scheme, according to FIG. 26, the memory 31 has the 10 columns, which store 10×1 bits in the row direction, and stores 16200/(10×1) bits in the column direction.

The writing start position of the 1st column out of the 10 columns of the memory 31 is set to the position whose address is 0, the writing start position of the 2nd column is set to the position whose address is 1, the writing start position of the 3rd column is set to the position whose address is 2, the writing start position of the 4th column is set to the position whose address is 2, the writing start position of the 5th column is set to the position whose address is 3, the writing start position of the 6th column is set to the position whose address is 3, the writing start position of the 7th column is set to the position whose address is 4, the writing start position of the 8th column is set to the position whose address is 4, the writing start position of the 9th column is set to the position whose address is 5, and the writing start position of the 10th column is set to the position whose address is 7.

When the multiple number b is set to 2 and when the number of bits m of one symbol is 10 by the adoption of the 1024QAM, for example, as the modulation scheme, according to FIG. 26, the memory 31 has the 20 columns, which store 10×2 bits in the row direction, and stores 16200/(10×2) bits in the column direction.

The writing start position of the 1st column out of the 20 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 2, the writing start position of the 5th column is set to the position whose address is 2, the writing start position of the 6th column is set to the position whose address is 2, the writing start position of the 7th column is set to the position whose address is 2, the writing start position of the 8th column is set to the position whose address is 2, the writing start position of the 9th column is set to the position whose address is 5, the writing start position of the 10th column is set to the position whose address is 5, the writing start position of the 11th column is set to the position whose address is 5, the writing start position of the 12th column is set to the position whose address is 5, the writing start position of the 13th column is set to the position whose address is 5, the writing start position of the 14th column is set to the position whose address is 7, the writing start position of the 15th column is set to the position whose address is 7, the writing start position of the 16th column is set to the position whose address is 7, the writing start position of the 17th column is set to the position whose address is 7, the writing start position of the 18th column is set to the position whose address is 8, the writing start position of the 19th column is set to the position whose address is 8, and the writing start position of the 20th column is set to the position whose address is 10.

When the multiple number b is set to 1 and when the number of bits m of one symbol is 12 by the adoption of the 4096QAM, for example, as the modulation scheme, according to FIG. 26, the memory 31 has the 12 columns, which store 12×1 bits in the row direction, and stores 16200/(12×1) bits in the column direction.

The writing start position of the 1st column out of the 12 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 2, the writing start position of the 5th column is set to the position whose address is 2, the writing start position of the sixth column is set to the position whose address is 2, the writing start position of the seventh column is set to the position whose address is 3, the writing start position of the eighth column is set to the position whose address is 3, the writing start position of the ninth column is set to the position whose address is 3, the writing start position of the tenth column is set to a position whose address is 6, the writing start position of the 11th column is set to the position whose address is 7, and the writing start position of the 12th column is set to the position whose address is 7.

When the multiple number b is set to 2 and when the number of bits m of one symbol is 12 by the adoption of the 4096QAM, for example, as the modulation scheme, according to FIG. 26, the memory 31 has the 24 columns, which store 12×2 bits in the row direction, and stores 16200/(12×2) bits in the column direction.

The writing start position of the 1st column out of the 24 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 0, the writing start position of the 5th column is set to the position whose address is 0, the writing start position of the 6th column is set to the position whose address is 0, the writing start position of the 7th column is set to the position whose address is 0, the writing start position of the 8th column is set to the position whose address is 1, the writing start position of the 9th column is set to the position whose address is 1, the writing start position of the 10th column is set to the position whose address is 1, the writing start position of the 11th column is set to the position whose address is 2, the writing start position of the 12th column is set to the position whose address is 2, the writing start position of the 13th column is set to the position whose address is 2, the writing start position of the 14th column is set to the position whose address is 3, the writing start position of the 15th column is set to the position whose address is 7, the writing start position of the 16th column is set to the position whose address is 9, the writing start position of the 17th column is set to the position whose address is 9, the writing start position of the 18th column is set to a position whose address is 9, the writing start position of the 19th column is set to the position whose address is 10, the writing start position of the 20th column is set to the position whose address is 10, the writing start position of the 21st column is set to the position whose address is 10, the writing start position of the 22nd column is set to the position whose address is 10, the writing start position of the 23rd column is set to the position whose address is 10, and the writing start position of the 24th column is set to the position whose address is 11.

Figure 27:
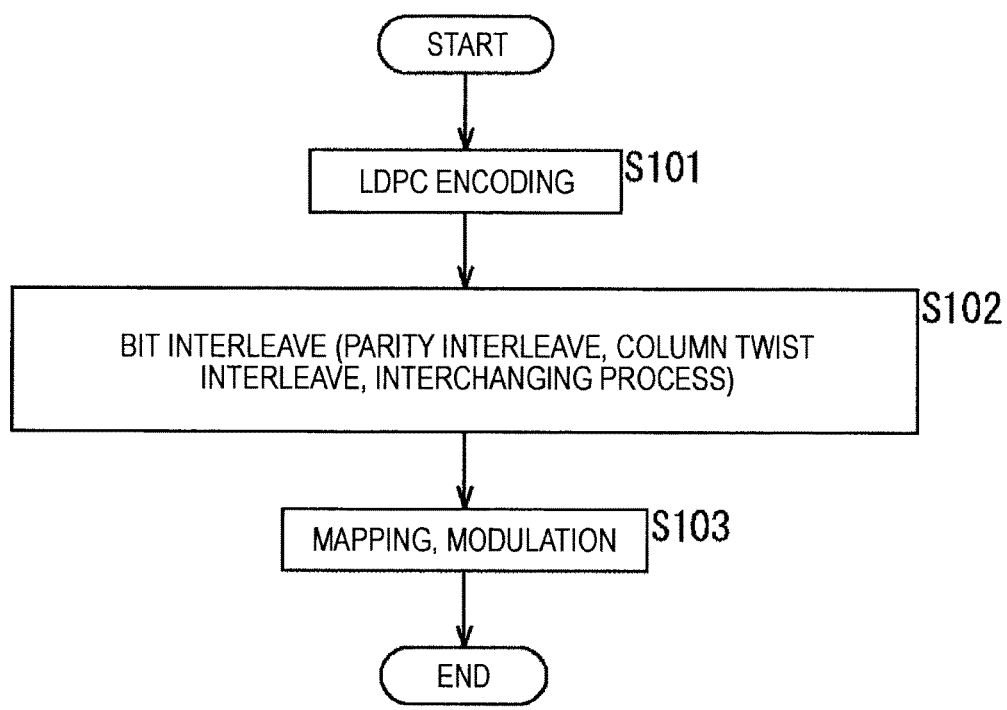
FIG. 27 is a flowchart illustrating processes performed by the bit interleaver 116 and a QAM encoder 117.

FIG. 27 is a flowchart illustrating processes performed by the LDPC encoder 115, the bit interleaver 116, and the QAM encoder 117 in FIG. 8.

The LDPC encoder 115 encodes the LDPC target data into the LDPC code at step S101 after waiting for supply of the LDPC target data from the BCH encoder 114 and supplies the LDPC code to the bit interleaver 116, then the process shifts to step S102.

The bit interleaver 116 performs the bit interleave of the LDPC code from the LDPC encoder 115 and supplies the symbol obtained by symbolizing the LDPC code after the bit interleave to the QAM encoder 117 at step S102, then the process shifts to step S103.

That is to say, at step S102, in the bit interleaver 116 (FIG. 9), the parity interleaver 23 performs the parity interleave of the LDPC code from the LDPC encoder 115 and supplies the LDPC code after the parity interleave to the column twist interleaver 24.

The column twist interleaver 24 performs the column twist interleave of the LDPC code from the parity interleaver 23 to supply to the demultiplexer 25.

The demultiplexer 25 performs the interchanging process to interchange the code bits of the LDPC code after the column twist interleave by the column twist interleaver 24 and make the code bits after the interchange the symbol bits of the symbol (bits representing the symbol).

Herein, the interchanging process by the demultiplexer 25 may be performed according to the first to fourth interchanging schemes illustrated in FIGS. 18 and 19 and may be performed according to an allocation rule. The allocation rule is a rule for allocating the code bit of the LDPC code to the symbol bit representing the symbol and this is described later in detail.

The symbol obtained by the interchanging process by the demultiplexer 25 is supplied from the demultiplexer 25 to the QAM encoder 117.

The QAM encoder 117 maps the symbol from the demultiplexer 25 onto the signal point defined by the modulation scheme of the orthogonal modulation performed by the QAM encoder 117 to perform the orthogonal modulation and supplies the data obtained as a result to the time interleaver 118 at step S103.

As described above, it is possible to improve the resistance to erasure and burst error in a case in which a plurality of code bits of the LDPC code is transmitted as one symbol by performing the parity interleave and the column twist interleave.

Herein, the parity interleaver 23, which is a block to perform the parity interleave, and the column twist interleaver 24, which is a block to perform the column twist interleave, are separately formed in FIG. 9 for convenience of description; however, the parity interleaver 23 and the column twist interleaver 24 may be integrally formed.

That is to say, the parity interleave and the column twist interleave may be performed by the writing and the reading of the code bit to and from the memory and may be represented by a matrix to convert the address at which the code bit is written (write address) to the address at which the code bit is read (read address).

Therefore, by obtaining the matrix obtained by multiplying the matrix representing the parity interleave by the matrix representing the column twist interleave, it is possible to obtain a result of performing the parity interleave and performing the column twist interleave of the LDPC code after the parity interleave by converting the code bit by the matrix.

It is also possible to integrally form the demultiplexer 25 in addition to the parity interleaver 23 and the column twist interleaver 24.

That is to say, the interchanging process performed by the demultiplexer 25 may also be represented by the matrix to convert the write address of the memory 31, which stores the LDPC code, to the read address.

Therefore, by obtaining the matrix obtained by multiplying the matrix representing the parity interleave, the matrix representing the column twist interleave, and the matrix representing the interchanging process together, it is possible to collectively perform the parity interleave, the column twist interleave, and the interchanging process by the matrix.

Meanwhile, as for the parity interleave and the column twist interleave, it is possible to perform any one of them or to perform none of them.

Simulation of measurement of the bit error rate performed for the transmitting device 11 in FIG. 8 is next described with reference to FIGS. 28 to 30.

The simulation is performed by adopting the communication channel with the flutter in which the D/U is 0 dB.

Figure 28:
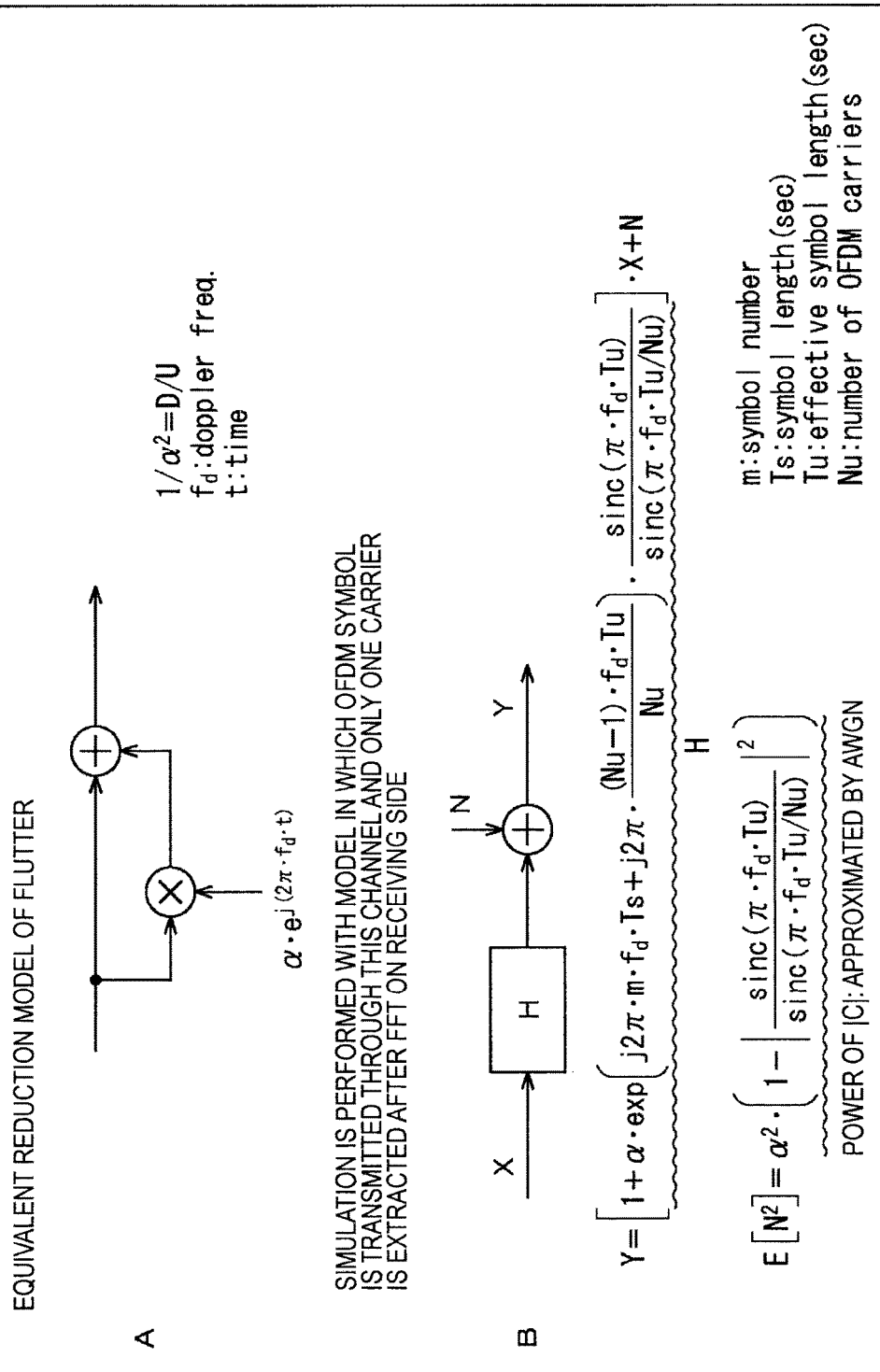
FIG. 28 is a view illustrating a model of a communication channel adopted in simulation.

FIG. 28 illustrates a model of the communication channel adopted in the simulation.

That is to say, FIG. 28A illustrates a model of the flutter adopted in the simulation.

FIG. 28B illustrates a model of the communication channel with the flutter illustrated by the model in FIG. 28A.

Meanwhile, in FIG. 28B, H represents the model of the flutter in FIG. 28A. In FIG. 28B, N represents ICI (inter carrier interference) and an expected value $E[N^2]$ of power thereof is approximated by the AWGN in the simulation.

Figure 29:
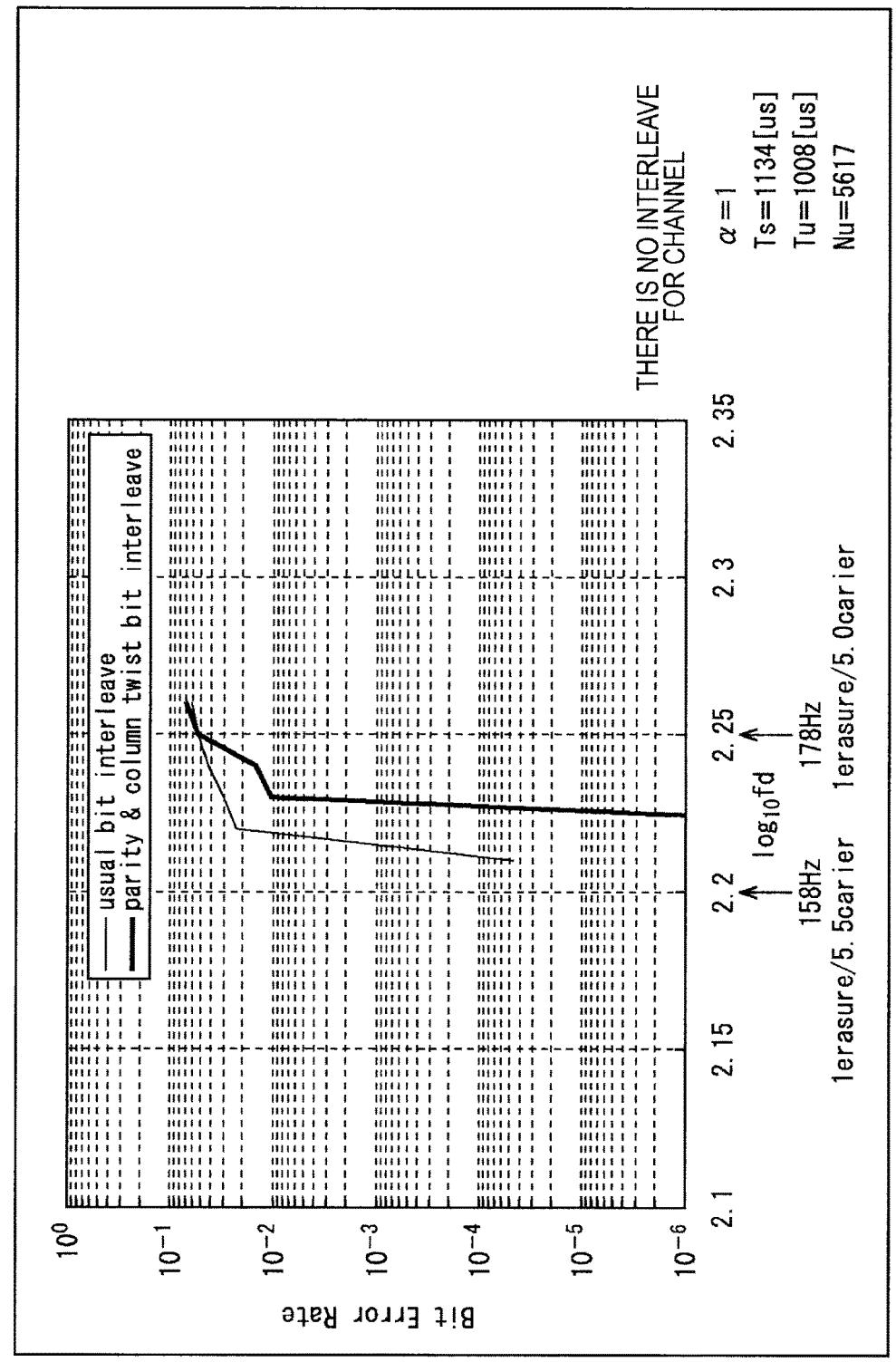
FIG. 29 is a view illustrating relationship between a bit error rate obtained by the simulation and a Doppler frequency $f_d$ of a flutter.
Figure 30:
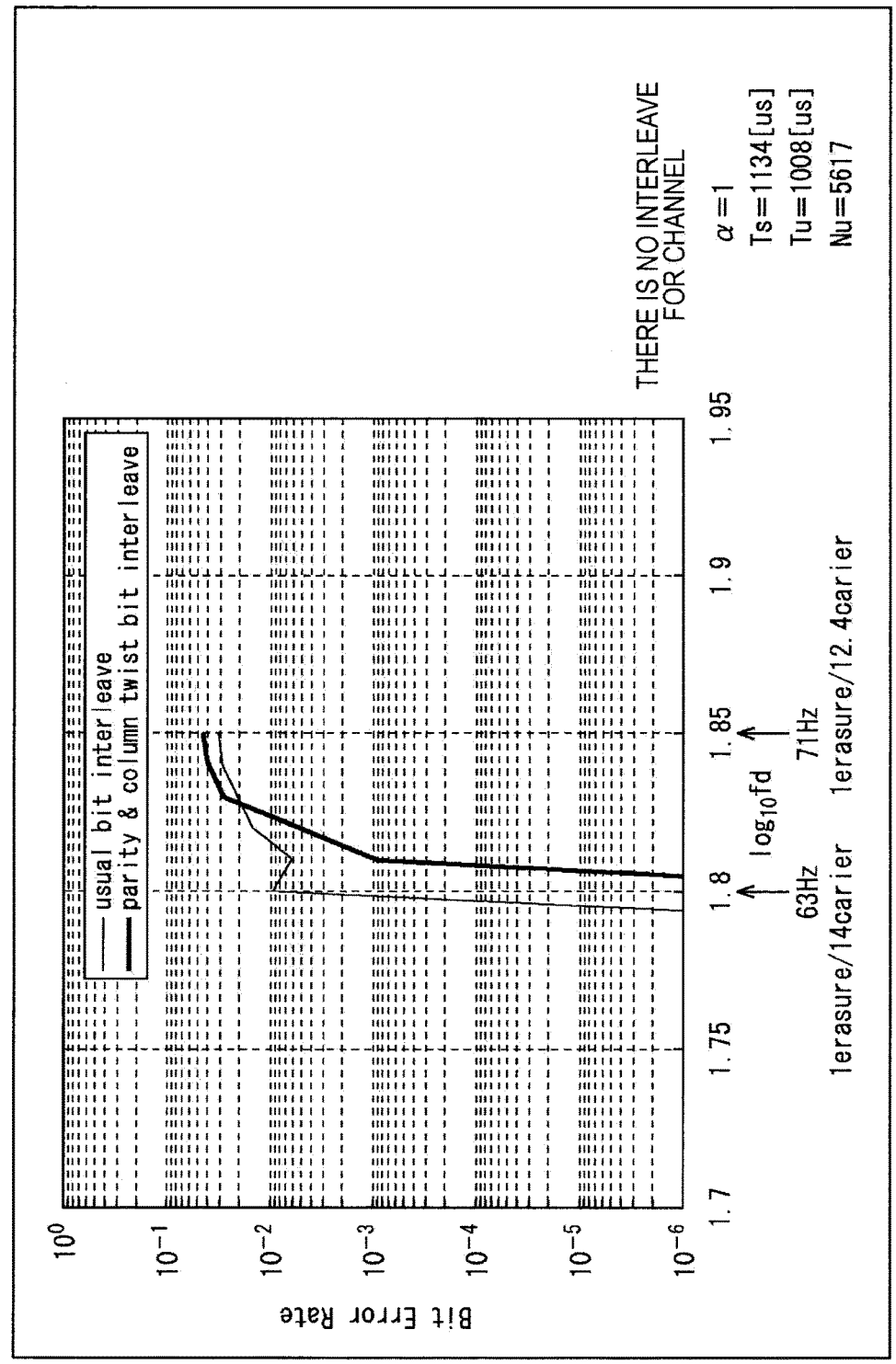
FIG. 30 is a view illustrating the relationship between the bit error rate obtained by the simulation and the Doppler frequency $f_d$ of the flutter.

FIGS. 29 and 30 illustrate relationship between the bit error rate obtained by the simulation and a Doppler frequency $f_d$ of the flutter.

Meanwhile, FIG. 29 illustrates the relationship between the bit error rate and the Doppler frequency $f_d$ when the modulation scheme is the 16QAM, the code rate (r) is (3/4), and the interchanging scheme is the first interchanging scheme. FIG. 30 illustrates the relationship between the bit error rate and the Doppler frequency $f_d$ when the modulation scheme is the 64QAM, the code rate (r) is (5/6), and the interchanging scheme is the first interchanging scheme.

Further, in FIGS. 29 and 30, a thick line indicates the relationship between the bit error rate and the Doppler frequency $f_d$ when all of the parity interleave, the column twist interleave, and the interchanging process are performed, and a thin line indicates the relationship between the bit error rate and the Doppler frequency $f_d$ when only the interchanging process out of the parity interleave, the column twist interleave, and the interchanging process is performed.

In both of FIGS. 29 and 30, it is understood that the bit error rate is improved (becomes lower) when all of the parity interleave, the column twist interleave, and the interchanging process are performed as compared to a case in which only the interchanging process is performed.

[Configuration Example of LDPC Encoder 115]

Figure 31:
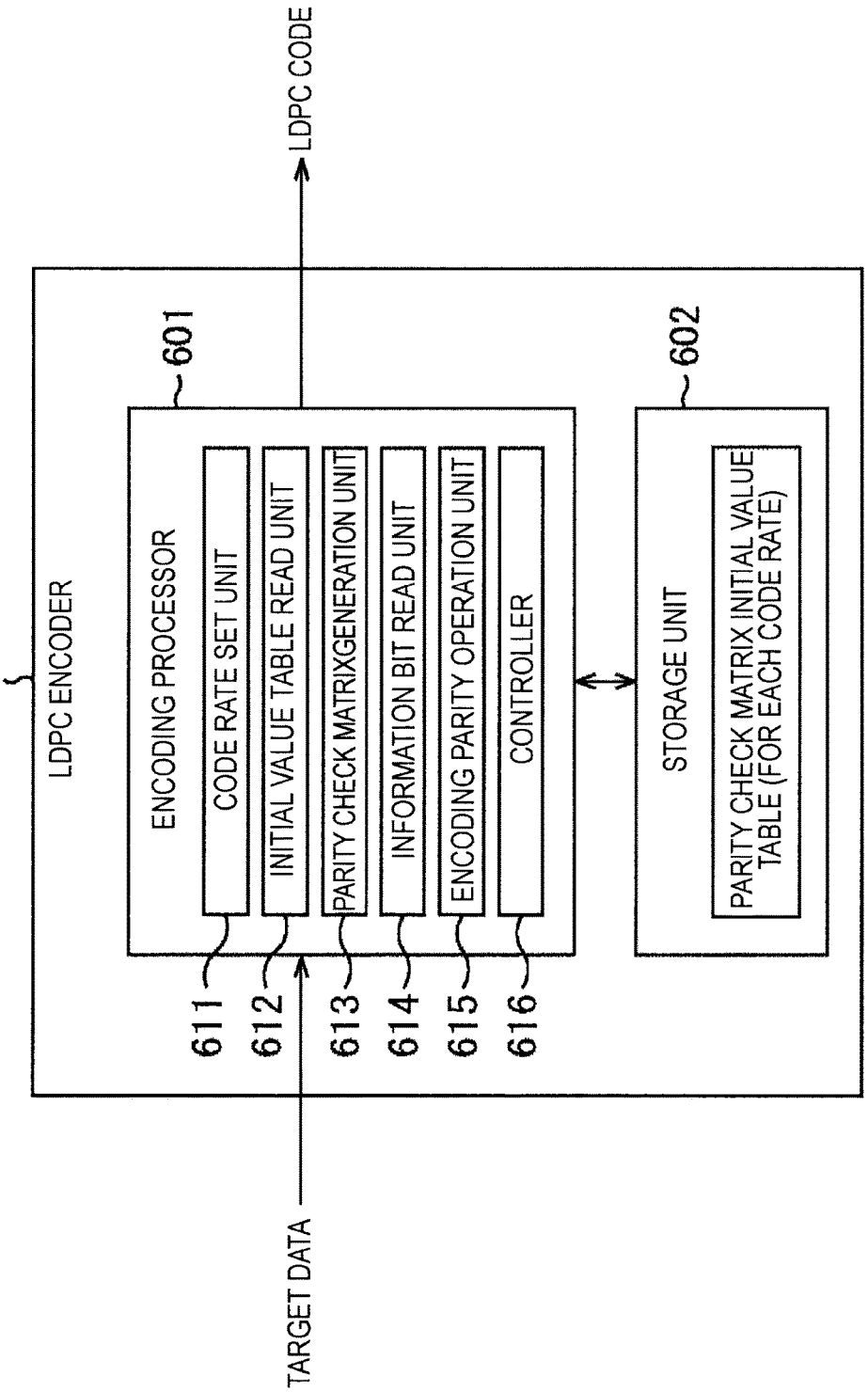
FIG. 31 is a block diagram illustrating a configuration example of an LDPC encoder 115.

FIG. 31 is a block diagram illustrating a configuration example of the LDPC encoder 115 in FIG. 8.

Meanwhile, the LDPC encoder 122 in FIG. 8 also is composed in the same manner.

As illustrated in FIGS. 12 and 13, the LDPC codes of the two code lengths N of 64800 bits and 16200 bits are specified in the DVB-T.2 standard.

As for the LDPC code whose code length N is 64800 bits, 11 code rates 1/4, 1/3, 2/5, 1/2, 3/5, 2/3, 3/4, 4/5, 5/6, 8/9, and 9/10 are specified, and as for the LDPC code whose code length N is 16200 bits, 10 code rates 1/4, 1/3, 2/5, 1/2, 3/5, 2/3, 3/4, 4/5, 5/6 and 8/9 are specified (refer to FIGS. 12 and 13).

The LDPC encoder 115 may perform the encoding (error correction encoding) by such LDPC code of each code rate whose code lengths N are 64800 bits or 16200 bits according to the parity check matrix H prepared for each code length N and each code rate, for example.

The LDPC encoder 115 is composed of an encoding processor 601 and a storage unit 602.

The encoding processor 601 is composed of a code rate set unit 611, an initial value table read unit 612, a parity check matrix generation unit 613, an information bit read unit 614, an encoding parity operation unit 615, and a controller 616, and this performs the LDPC encoding of the LDPC target data supplied to the LDPC encoder 115 and supplies the LDPC code obtained as a result to the bit interleaver 116 (FIG. 8).

That is to say, the code rate set unit 611 sets the code length N and the code rate of the LDPC code according to the operation of the operator and the like, for example.

The initial value table read unit 612 reads a parity check matrix initial value table to be described later corresponding to the code length N and the code rate set by the code rate set unit 611 from the storage unit 602.

The parity check matrix generation unit 613 generates the parity check matrix H by arranging the element 1 of the information matrix $H_A$ corresponding to the information length K (=code length N−parity length M) according to the code length N and the code rate set by the code rate set unit 611 with a period of 360 columns (the number of columns P being the unit of the cyclic structure) in the column direction based on the parity check matrix initial value table read by the initial value table read unit 612 and stores the same in the storage unit 602.

The information bit read unit 614 reads (extracts) the information bits as many as the information length K from the LDPC target data supplied to the LDPC encoder 115.

The encoding parity operation unit 615 reads the parity check matrix H generated by the parity check matrix generation unit 613 from the storage unit 602 and calculates the parity bit for the information bit read by the information bit read unit 614 based on a predetermined equation using the parity check matrix H, thereby generating the code word (LDPC code).

The controller 616 controls each block composing the encoding processor 601.

A plurality of parity check matrix initial value tables and the like corresponding to a plurality of code rates and the like illustrated in FIGS. 12 and 13 for each of the code lengths N such as 64800 bits and 16200 bits is stored in the storage unit 602, for example. The storage unit 602 temporarily stores the data required in the process of the encoding processor 601.

Figures 32, 33:
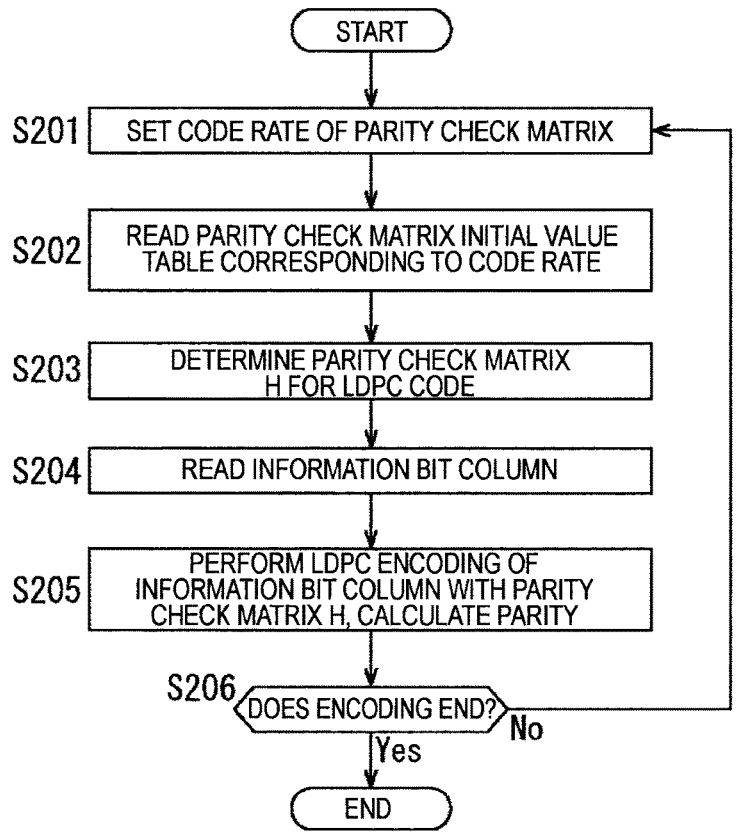
FIG. 32 is a flowchart illustrating a process of the LDPC encoder 115.
FIG. 33 is a view illustrating an example of a parity check matrix initial value table in which a code rate is 1/4 and a code length is 16200.

FIG. 32 is a flowchart illustrating the process of the LDPC encoder 115 in FIG. 31.

At step S201, the code rate set unit 611 determines (sets) the code length N and the code rate r with which the LDPC encoding is performed.

At step S202, the initial value table read unit 612 reads the parity check matrix initial value table determined in advance corresponding to the code length N and the code rate r determined by the code rate set unit 611 from the storage unit 602.

At step S203, the parity check matrix generation unit 613 obtains (generates) the parity check matrix H of the LDPC code with the code length N and the code rate r determined by the code rate set unit 611 using the parity check matrix initial value table read by the initial value table read unit 612 from the storage unit 602 and supplies the same to the storage unit 602 to store.

At step S204, the information bit read unit 614 reads the information bits of the information length K (=N×r) corresponding to the code length N and the code rate r determined by the code rate set unit 611 from the LDPC target data supplied to the LDPC encoder 115 and reads the parity check matrix H obtained by the parity check matrix generation unit 613 from the storage unit 602 to supply to the encoding parity operation unit 615.

At step S205, the encoding parity operation unit 615 sequentially calculates the parity bit of the code word c satisfying equation (8).

$$Hc^T = 0 \qquad (8)$$

In equation (8), c represents the row vector as the code word (LDPC code) and $c^T$ represents transposition of the row vector c.

Herein, as described above, when the part of the information bit and the part of the parity bit of the row vector c as the LDPC code (one code word) are represented by the row vector A and the row vector T, respectively, the row vector c may be represented by the equation c=[A|T] by the row vector A as the information bit and the row vector T as the parity bit.

The parity check matrix H and the row vector c=[A|T] as the LDPC code are required to satisfy the equation $Hc^T=0$ and it is possible to sequentially obtain the row vector T as the parity bit composing the row vector c=[A|T] satisfying such equation $Hc^T=0$ by setting the element of each row to 0 in order from the element of the first row of the column vector $Hc^T$ in the equation $Hc^T=0$ when the parity matrix $H_T$ of the parity check matrix $H=[H_A|H_T]$ has the stepwise structure illustrated in FIG. 11.

When the encoding parity operation unit 615 obtains the parity bit T for the information bit A, this outputs the code word c=[A|T] represented by the information bit A and the parity bit T as a result of the LDPC encoding of the information bit A.

Thereafter, at step S206, the controller 616 judges whether to finish the LDPC encoding. At step S206, when it is judged that the LDPC encoding is not finished, that is to say, when there still is the LDPC target data to be LDPC encoded, for example, the process returns to step S201 (or step S204) and the processes at steps S201 (or step S204) to S206 are hereinafter repeated.

When it is judged that the LDPC encoding is finished at step S206, that is to say, there is no LDPC target data to be LDPC encoded, for example, the LDPC encoder 115 finishes the process.

In this manner, the parity check matrix initial value table corresponding to each code length N and each code rate r is prepared, and the LDPC encoder 115 performs the LDPC encoding with a predetermined code length N and a predetermined code rate r using the parity check matrix H generated from the parity check matrix initial value table corresponding to the predetermined code length N and the predetermined code rate r.

[Example of Parity Check Matrix Initial Value Table]

The parity check matrix initial value table is the table indicating the position of the element 1 of the information matrix $H_A$ (FIG. 10) corresponding to the information length K according to the code length N and the code rate r of the LDPC code (LDPC code defined by the parity check matrix H) of the parity check matrix for each 360 columns (the number of columns P being the unit of the cyclic structure) and is created in advance for each parity check matrix H of each code length N and each code rate r.

FIG. 33 is a view illustrating an example of the parity check matrix initial value table.

That is to say, FIG. 33 illustrates the parity check matrix initial value table for the parity check matrix H whose code length N is 16200 bits and code rate (code rate in notation of DVB-T.2) r is 1/4 specified in the DVB-T.2 standard.

The parity check matrix generation unit 613 (FIG. 31) obtains the parity check matrix H in a following manner using the parity check matrix initial value table.

Figure 34:
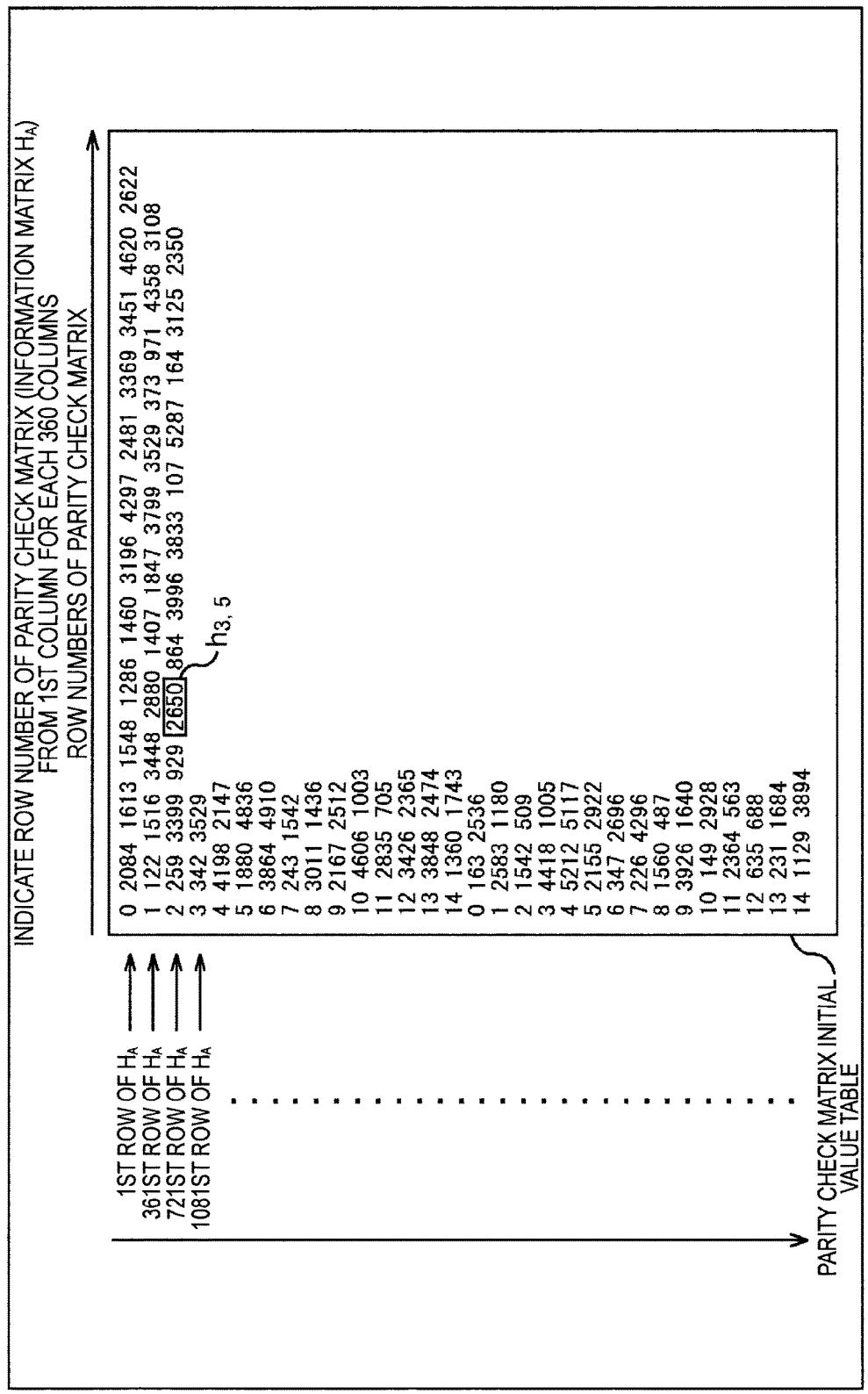
FIG. 34 is a view illustrating a method of obtaining the parity check matrix H from the parity check matrix initial value table.

That is to say, FIG. 34 illustrates a method of obtaining the parity check matrix H from the parity check matrix initial value table.

Meanwhile, the parity check matrix initial value table in FIG. 34 illustrates the parity check matrix initial value table for the parity check matrix H whose code length N is 16200 bits and code rate r is 2/3 specified in the DVB.T-2 standard.

The parity check matrix initial value table is the table indicating the position of the element 1 of the information matrix $H_A$ (FIG. 10) corresponding to the information length K according to the code length N and the code rate r of the LDPC code for each 360 columns (the number of columns P being the unit of the cyclic structure) as described above in which row numbers (the row number of the first row of the parity check matrix H is 0) of the elements of 1 of a 1+360×(i−1)-th column of the parity check matrix H as many as the number of column weights of the 1+360×(i−1)-th column are arranged in an i-th row.

Herein, the parity matrix $H_T$ (FIG. 10) corresponding to the parity length M of the parity check matrix H is determined as illustrated in FIG. 21, so that the information matrix $H_A$ (FIG. 10) corresponding to the information length K of the parity check matrix H is obtained according to the parity check matrix initial value table.

The number of rows k+1 of the parity check matrix initial value table differs according to the information length K.

The information length K and the number of rows k+1 of the parity check matrix initial value table satisfy relationship in equation (9).

$$K = (k+1) \times 360 \qquad (9)$$

Herein, 360 in equation (9) is the number of columns P being the unit of the cyclic structure illustrated in FIG. 22.

In the parity check matrix initial value table in FIG. 34, 13 values are arranged in each of first to third rows and 3 values are arranged in each of fourth to k+1-th rows (30th row in FIG. 34).

Therefore, the column weights of the parity check matrix H obtained from the parity check matrix initial value table in FIG. 34 are 13 from the first column to 1+360×(3−1)−1-th column and 3 from the 1+360×(3−1)-th column to a K-th column.

The first row of the parity check matrix initial value table in FIG. 34 is 0, 2084, 1613, 1548, 1286, 1460, 3196, 4297, 2481, 3369, 3451, 4620, and 2622 and this indicates that the element of the rows whose row numbers are 0, 2084, 1613, 1548, 1286, 1460, 3196, 4297, 2481, 3369, 3451, 4620, and 2622 is 1 (and other elements are 0) in the first column of the parity check matrix H.

Also, the second row of the parity check matrix initial value table in FIG. 34 is 1, 122, 1516, 3448, 2880, 1407, 1847, 3799, 3529, 373, 971, 4358, and 3108 and this indicates that the element of the rows whose row numbers are 1, 122, 1516, 3448, 2880, 1407, 1847, 3799, 3529, 373, 971, 4358, and 3108 are 1 in a 361 (=1+360×(2−1))-th column of the parity check matrix H.

As described above, the parity check matrix initial value table indicates the position of the element 1 of the information matrix $H_A$ of the parity check matrix H for each 360 columns.

The column other than the 1+360×(i−1)-th column of the parity check matrix H, that is to say, each column from a 2+360×(i−1)-th column to a 360×i-th column is obtained by periodically performing the cyclic shift to the element 1 of the 1+360×(i−1)-th column determined by the parity check matrix initial value table downward (in a direction toward a lower part of the column) according to the parity length M to arrange.

That is to say, the 2+360×(i−1)-th column is obtained by the cyclic shift of the 1+360×(i−1)-th column downward by M/360 (=q) and a next 3+360×(i−1)-th column is obtained by the cyclic shift of the 1+360×(i−1)-th column downward by 2×M/360 (=2×q) (the cyclic shift of the 2+360×(i−1)-th column downward by M/360(=q)), for example.

Herein, if an i-th row (i-th row from the top) j-th column (j-th column from left) value of the parity check matrix initial value table is represented as $h_{i,j}$ and the row number of a j-th element 1 of a w-th column of the parity check matrix H is represented as $H_{w-j}$, a row number $H_{w-j}$ of the element 1 of the w-th column being the column other than the 1+360×(i−1)-th column of the parity check matrix H may be obtained by equation (10).

$$H_{w-j}=\mathrm{mod}\ \{h_{i,j}+\mathrm{mod}((w-1),P)\times q,M\} \quad (10)$$

Herein, mod (x, y) represents a remainder obtained when x is divided by y.

Also, P represents the above-described number of columns being the unit of the cyclic structure, which is set to 360 as described above in the DVB-T.2 standard, for example. Further, q represents a value M/360 obtained by dividing the parity length M by the number of columns P (=360) being the unit of the cyclic structure.

The parity check matrix generation unit 613 (FIG. 31) specifies the row number of the element 1 of the 1+360×(i−1)-th column of the parity check matrix by the parity check matrix initial value table.

Further, the parity check matrix generation unit 613 (FIG. 31) obtains the row number $H_{w-j}$ of the element 1 of the w-th column being the column other than the 1+360×(i−1)-th column of the parity check matrix H according to equation (10) and generates the parity check matrix H in which an element of the row number obtained from above is 1.

[LDPC Code Suitable for Mobile Terminal]

If digital broadcasting for the mobile terminal may be realized without changing a specification of the transmitting device and the receiving device based on a standard of the digital broadcasting for the fixed terminal, for example, DVB-T.2 as far as possible, this is cost advantageous.

Herein, the LDPC codes of the two code lengths N of 64 k bits and 16 k bits are specified in DVB-T.2.

If the LDPC code specified in DVB-T.2 is adopted in the digital broadcasting for the mobile terminal, the LDPC code of a shorter code length may make the memory required for the decoding of the LDPC code and the delay smaller as compared to those of the LDPC code of a longer code length, so that it is appropriate to adopt the 16 k-bit LDPC code whose code length is shorter of the LDPC codes of the two code lengths specified in DVB-T.2 in the digital broadcasting for the mobile terminal.

However, in the mobile terminal, the number of repetitions of the decoding of the LDPC code (number of times of repetitive decoding C) might be limited as compared to a case of the fixed terminal, for example, in order to decrease a load required for the process such as the decoding of the LDPC code, and the resistance to error might not be sufficient in the 16 k-bit LDPC code specified in DVB-T.2 in the digital broadcasting for the mobile terminal.

Therefore, the transmitting device 11 (FIG. 7) may realize the digital broadcasting for the mobile terminal using a new 16 k-bit LDPC code more resistant to error than the 16 k-bit LDPC code specified in DVB-T.2 as the LDPC code suitable for the digital broadcasting for the mobile terminal (hereinafter, also referred to as the LDPC code for mobile).

Meanwhile, as for the LDPC code for mobile, the parity matrix $H_T$ of the parity check matrix H has the stepwise structure (FIG. 11) as is the case with the LDPC code specified in DVB-T.2 from a viewpoint of maintaining compatibility with DVB-T.2 as far as possible.

Further, as for the LDPC code for mobile, as is the case with the LDPC code specified in DVB-T.2, the information matrix $H_A$ of the parity check matrix H has the cyclic structure and the number of columns P being the unit of the cyclic structure is set to 360.

FIGS. 35 to 43 are views illustrating examples of the parity check matrix initial value table of the LDPC code (for mobile) whose code length N is 16 k bits as described above.

Figure 35:
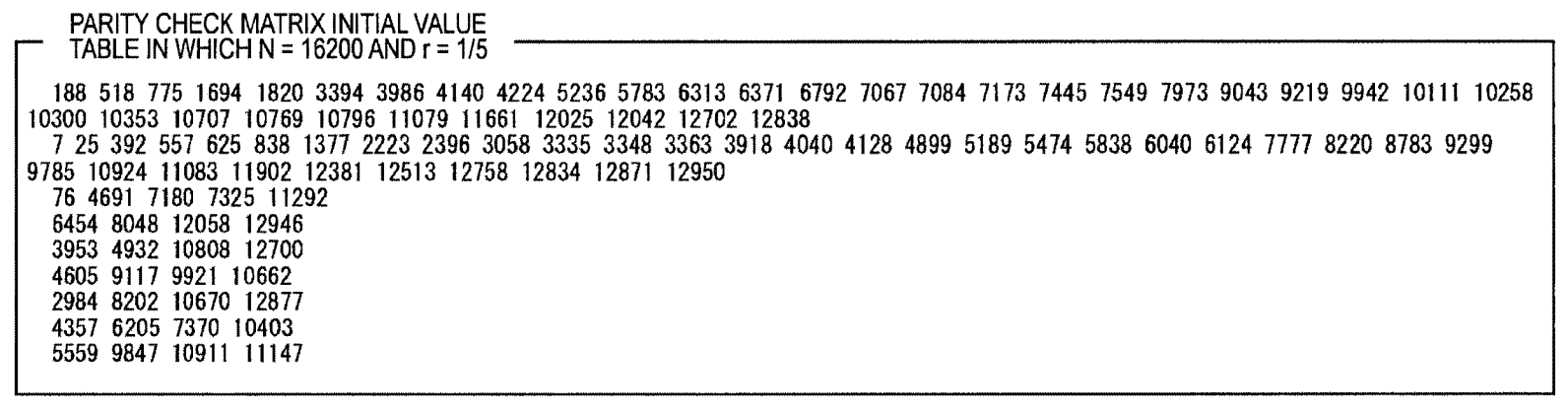

That is to say, FIG. 35 illustrates the parity check matrix initial value table for the parity check matrix H whose code length N is 16 k bits and code rate r is 1/5.

FIG. 36 illustrates the parity check matrix initial value table for the parity check matrix H whose code length N is 16 k bits and code rate r is 4/15.

Figure 37:
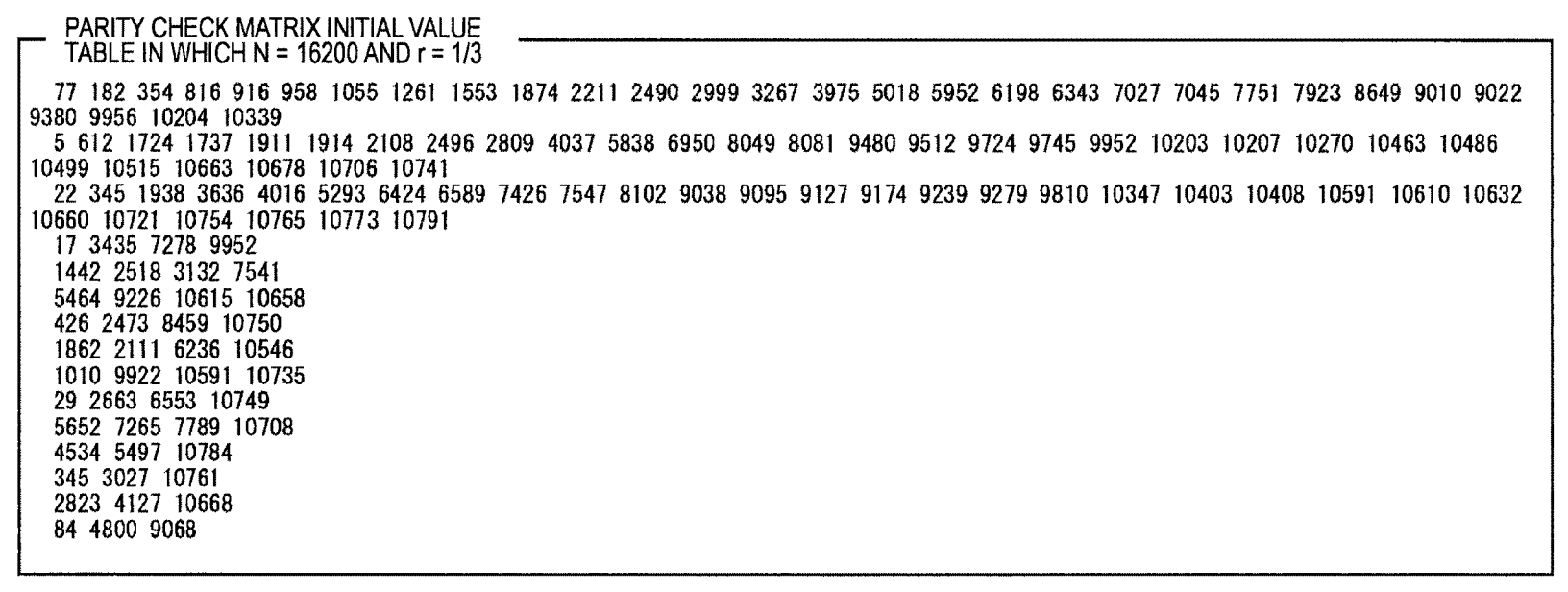

FIG. 37 illustrates the parity check matrix initial value table for the parity check matrix H whose code length N is 16 k bits and code rate r is 1/3.

Figure 38:
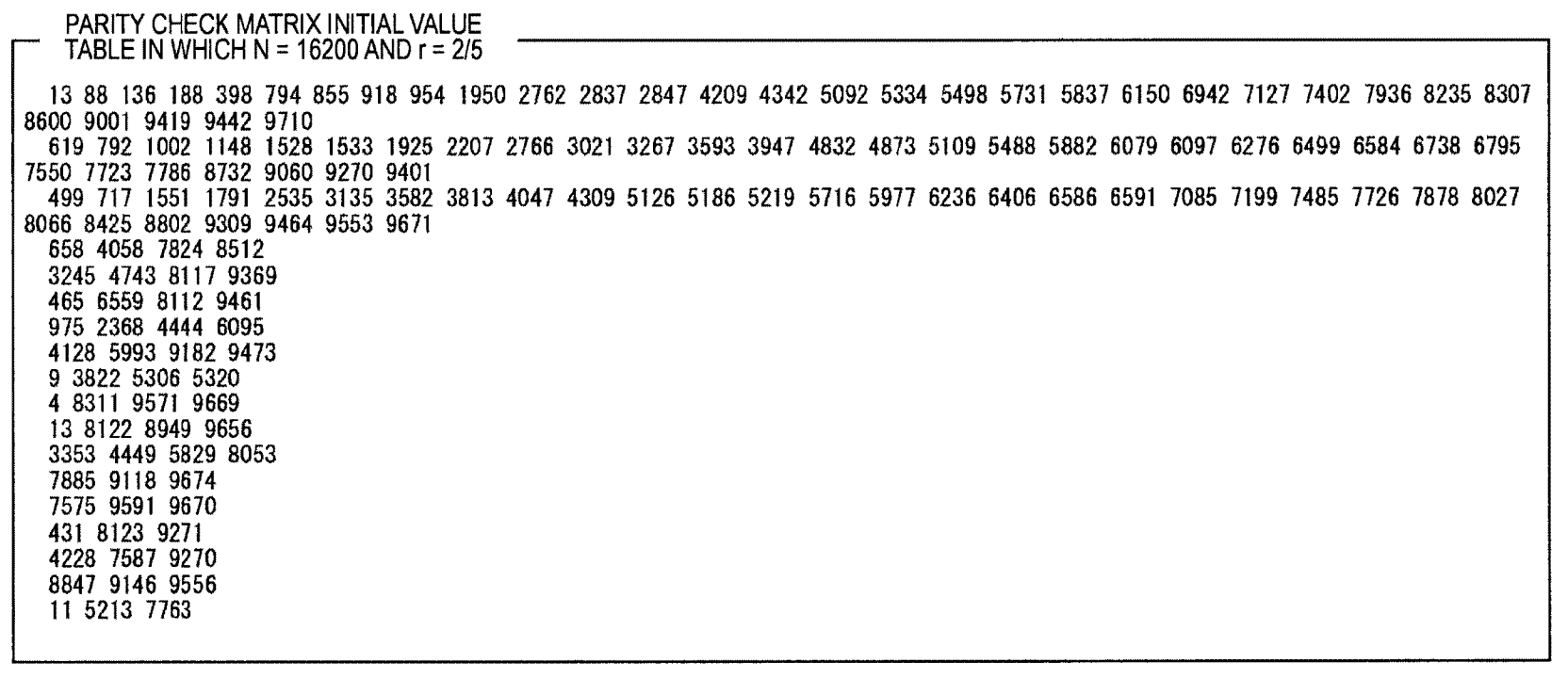

FIG. 38 illustrates the parity check matrix initial value table for the parity check matrix H whose code length N is 16 k bits and code rate r is 2/5.

Figure 39:
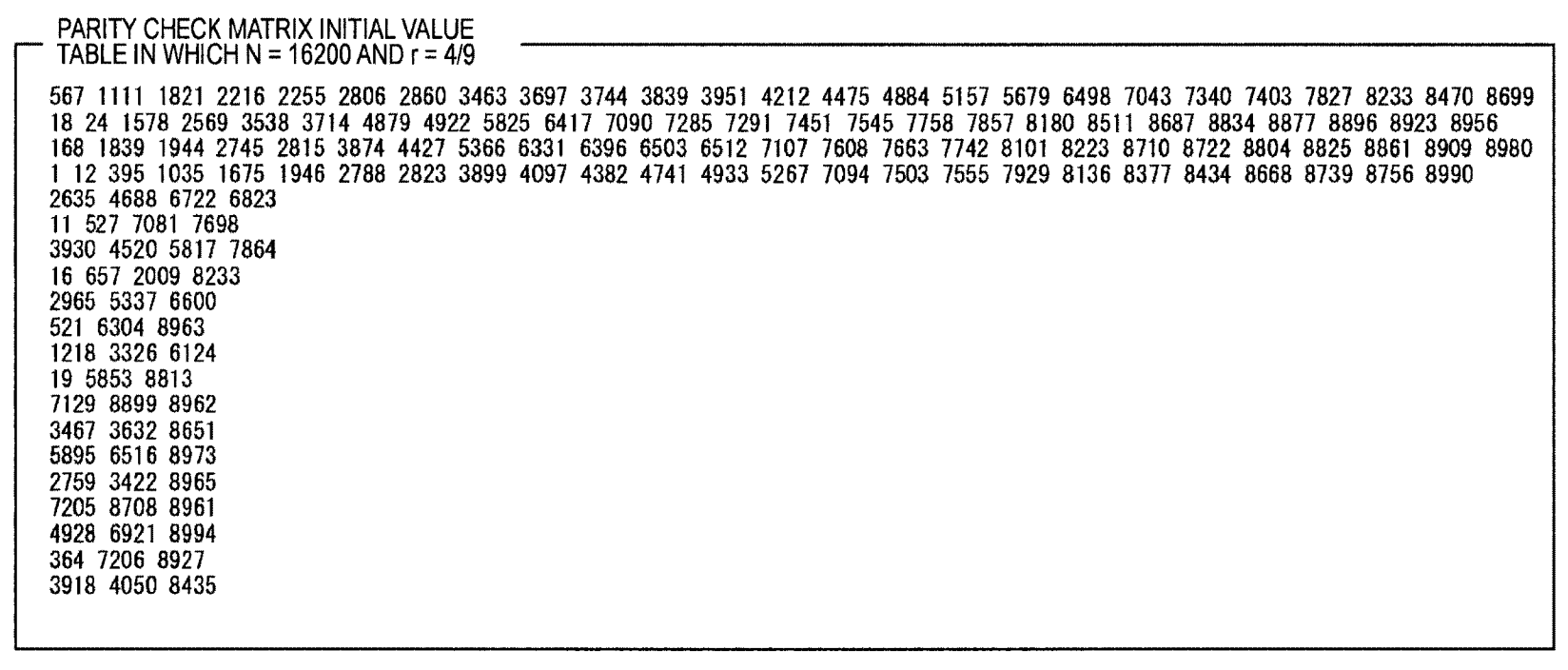

FIG. 39 illustrates the parity check matrix initial value table for the parity check matrix H whose code length N is 16 k bits and code rate r is 4/9.

FIG. 40 illustrates the parity check matrix initial value table for the parity check matrix H whose code length N is 16 k bits and code rate r is 7/15.

FIG. 41 illustrates the parity check matrix initial value table for the parity check matrix H whose code length N is 16 k bits and code rate r is 8/15.

Figure 42:
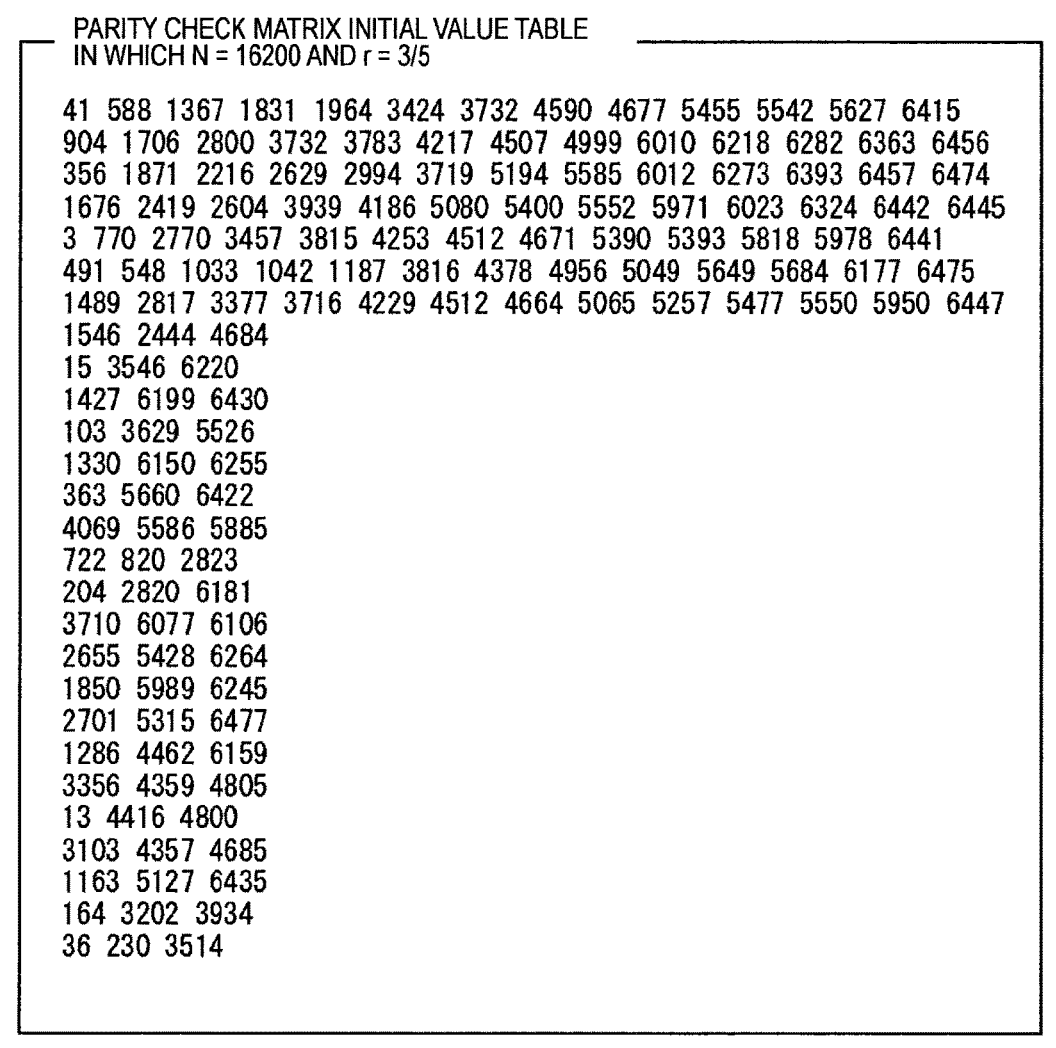

FIG. 42 illustrates the parity check matrix initial value table for the parity check matrix H whose code length N is 16 k bits and code rate r is 3/5.

FIG. 43 illustrates the parity check matrix initial value table for the parity check matrix H whose code length N is 16 k bits and code rate r is 2/3.

The LDPC encoder 115 (FIGS. 8 and 31) performs the encoding to the LDPC code whose code length N is 16 k bits and code rate r is any one of nine types of 1/5, 4/15, 1/3, 2/5, 4/9, 7/15, 8/15, 3/5, and 2/3 using the parity check matrix H obtained from the parity check matrix initial value table illustrated in FIGS. 35 to 43 for the digital broadcasting for the mobile terminal.

The LDPC code obtained using the parity check matrix H obtained from the parity check matrix initial value table in FIGS. 35 to 43 is a high-performance LDPC code.

Herein, the term "high-performance LDPC code" is intended to mean the LDPC code obtained from an appropriate parity check matrix H.

The term "appropriate parity check matrix H" is intended to mean the parity check matrix, which satisfies a predetermined condition to make the BER (bit error rate) lower when the LDPC code obtained from the parity check matrix H is transmitted with low $E_s/N_o$ (signal power to noise power ratio per symbol) or $E_b/N_o$ (signal power to noise power ratio per bit).

The appropriate parity check matrix H may be obtained by the simulation of the measurement of the BER at the time when the LDPC code obtained from the various parity check matrices satisfying the predetermined condition is transmitted with the low $E_s/N_o$, for example.

The predetermined condition, which the appropriate parity check matrix H should satisfy, includes an excellent analysis result obtained by an analyzing method of performance of the code referred to as density evolution, absence of a loop of the elements of 1 referred to as cycle-4 and the like, for example.

Herein, it is known that the decoding performance of the LDPC code is deteriorated when the elements of 1 close up as the cycle-4 in the information matrix $H_A$, so that the absence of the cycle-4 is required as the predetermined condition, which the appropriate parity check matrix H should satisfy.

Meanwhile, the predetermined condition, which the appropriate parity check matrix H should satisfy, may be appropriately determined from a viewpoint of improvement in the decoding performance of the LDPC code, facilitation (simplification) of the decoding process of the LDPC code and the like.

Figure 44:
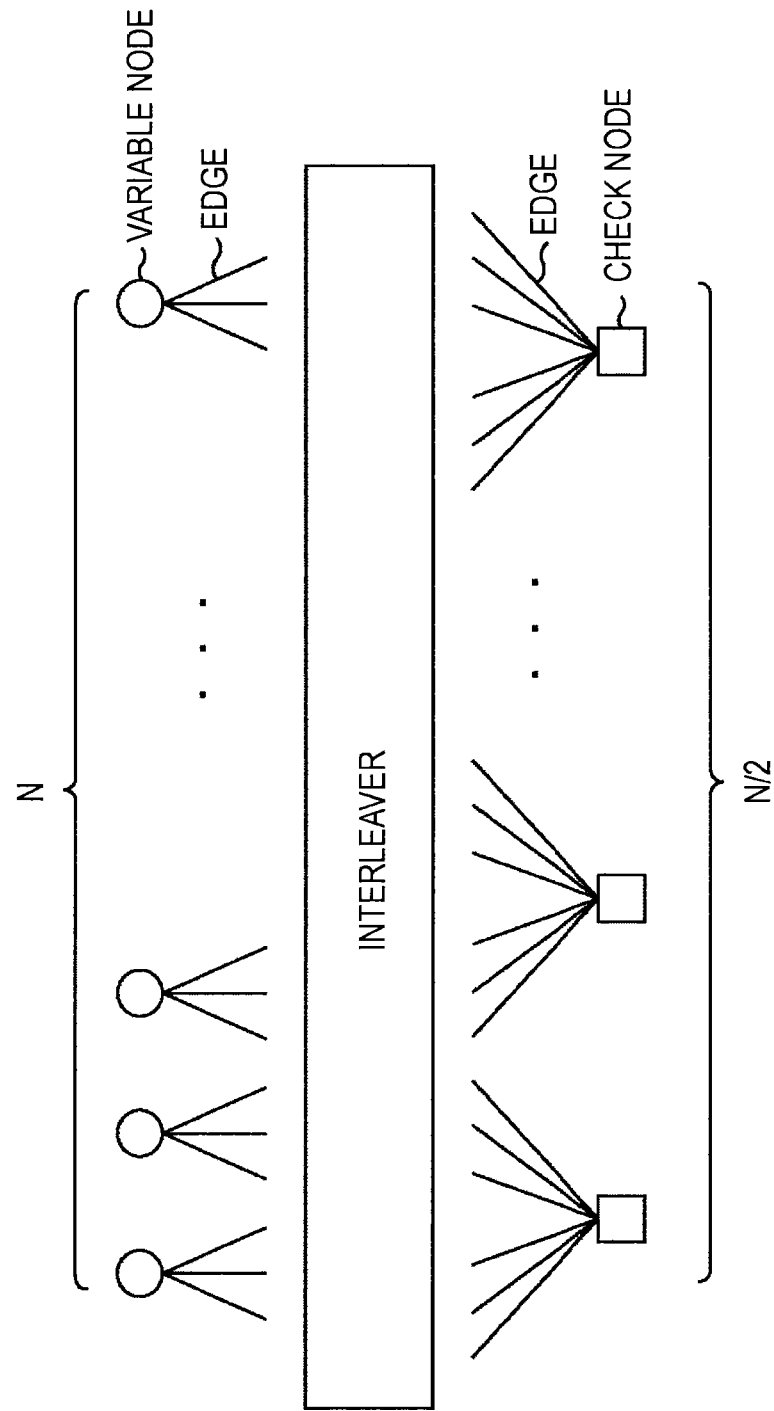
FIG. 44 is a view illustrating an example of the Tanner graph of an ensemble of a degree sequence in which a column weight is 3 and a row weight is 6.
Figure 45:
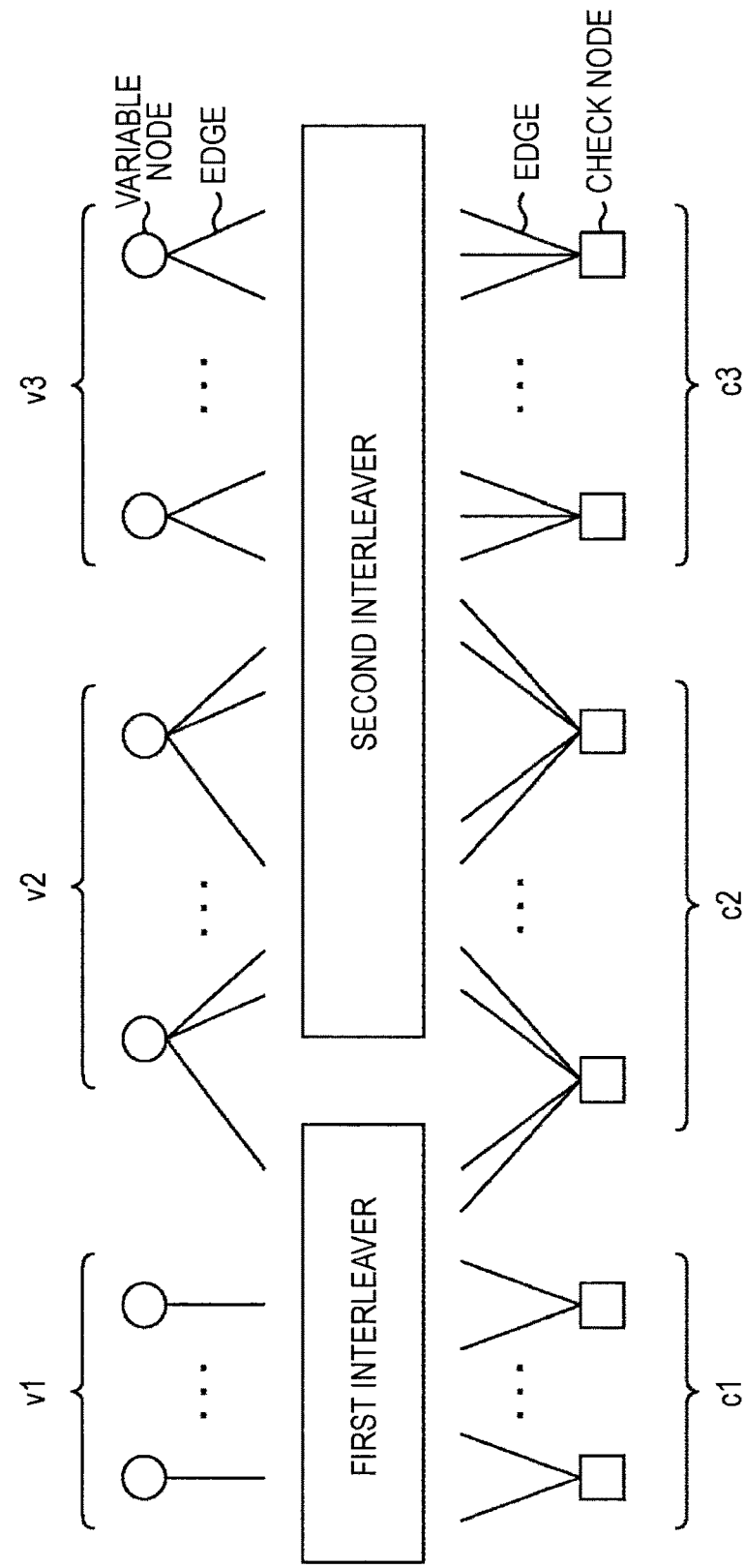
FIG. 45 is a view illustrating an example of the Tanner graph of a multi-edge type ensemble.

FIGS. 44 and 45 are views illustrating the density evolution with which the analysis result as the predetermined condition, which the appropriate parity check matrix H should satisfy, is obtained.

The density evolution is the analyzing method of the code, which calculates an expected value of the error probability for an entire LDPC code (ensemble) whose code length N is 0.0 characterized by a degree sequence to be described later.

For example, when a variance value of noise is set to be larger from 0 on the AWGN channel, the expected value of the error probability of a certain ensemble, which is initially 0, is no longer 0 when the variance value of the noise becomes a certain threshold or larger.

According to the density evolution, it is possible to determine whether performance of the ensemble (appropriateness of the parity check matrix) is excellent by comparing the threshold of the variance value of the noise (hereinafter, also referred to as a performance threshold) at which the expected value of the error probability is no longer 0.

Meanwhile, it is possible to predict rough performance of a specific LDPC code by determining the ensemble to which the LDPC code belongs and performing the density evolution to the ensemble.

Therefore, when a high-performance ensemble is found, the high-performance LDPC code may be found from the LDPC codes belonging to the ensemble.

Herein, the above-described degree sequence indicates a ratio of the variable node and the check node having the weight of each value to the code length N of the LDPC code.

For example, a regular (3, 6) LDPC code whose code rate is 1/2 belongs to the ensemble characterized by the degree sequence in which the weight (column weight) of all the variable nodes is 3 and the weight (row weight) of all the check nodes is 6.

FIG. 44 illustrates the Tanner graph of such ensemble.

In the Tanner graph in FIG. 44, there are N (equal to the code length N) variable nodes represented by a circle (o) in the drawing and N/2 (equal to a product obtained by multiplying the code rate 1/2 by the code length N) check nodes represented by a square ( ) in the drawing.

Three edges, the number of which is equal to the column weight, are connected to each variable node, so that there are a total of 3N edges connected to the N variable nodes.

Also, six edges the number of which is equal to the row weight, are connected to each check node, so that there are a total of 3N edges connected to the N/2 check nodes.

Further, there is one interleaver in the Tanner graph in FIG. 44.

The interleaver randomly rearranges the 3N edges connected to the N variable nodes and connects the rearranged edges to any of the 3N edges connected to the N/2 check nodes.

There are $(3N)!(=(3N)\times(3N-1)\times \ldots \times 1)$ rearranging patterns of rearranging the 3N edges connected to the N variable nodes by the interleaver. Therefore, the ensemble characterized by the degree sequence in which the weight of all the variable nodes is 3 and the weight of all the check nodes is 6 is a set of (3N)!LDPC codes.

In the simulation for obtaining the high-performance LDPC code (appropriate parity check matrix), a multi-edge type ensemble is used in the density evolution.

In the multi-edge type, the interleaver through which the edge connected to the variable node and the edge connected to the check node pass is divided into a multi-edge one, so that the ensemble is more strictly characterized.

FIG. 45 illustrates an example of the Tanner graph of the multi-edge type ensemble.

In the Tanner graph in FIG. 45, there are two interleavers, which are a first interleaver and a second interleaver.

In the Tanner graph in FIG. 45, there are v1 variable nodes with one edge connected to the first interleaver and no edge connected to the second interleaver, v2 variable nodes with one edge connected to the first interleaver and two edges connected to the second interleaver, and v3 variable nodes with no edge connected to the first interleaver and two edges connected to the second interleaver.

Further, in the Tanner graph in FIG. 45, there are c1 check nodes with two edges connected to the first interleaver and no edge connected to the second interleaver, c2 check nodes with two edges connected to the first interleaver and two edges connected to the second interleaver, and c3 check nodes with no edge connected to the first interleaver and three edges connected to the second interleaver.

Herein, the density evolution and implementation thereof are described in "On the Design of Low-Density Parity-Check Codes within 0.0045 dB of the Shannon Limit", S. Y. Chung, G. D. Forney, T. J. Richardson, and R. Urbanke, IEEE Communications Leggers, VOL. 5, NO. 2, February 2001, for example.

In the simulation for obtaining (the parity check matrix initial value table of) the LDPC code for mobile in FIGS. 35 to 43, the ensemble in which the performance threshold being $E_b/N_o$ at which the BER starts to decrease (to be lower) is a predetermined value or smaller is found by multi-edge type density evolution and the LDPC code to decrease the BER in a plurality of modulation schemes used in the digital broadcasting for the mobile terminal such as the 16QAM and the 64QAM is selected as the high-performance LDPC code out of the LDPC codes belonging to the ensemble.

Herein, since the resistance to error is deteriorated in the mobile terminal as compared to the fixed terminal, the modulation scheme in which the number of signal points is relatively small such as the QPSK, the 16QAM, and the 64QAM is adopted, for example, for improving the resistance to error in the digital broadcasting for the mobile terminal.

The above-described parity check matrix initial value table in FIGS. 35 to 43 is the parity check matrix initial value table of the LDPC code whose code length N is 16 k bits obtained by the above-described simulation.

Figures 46, 47:
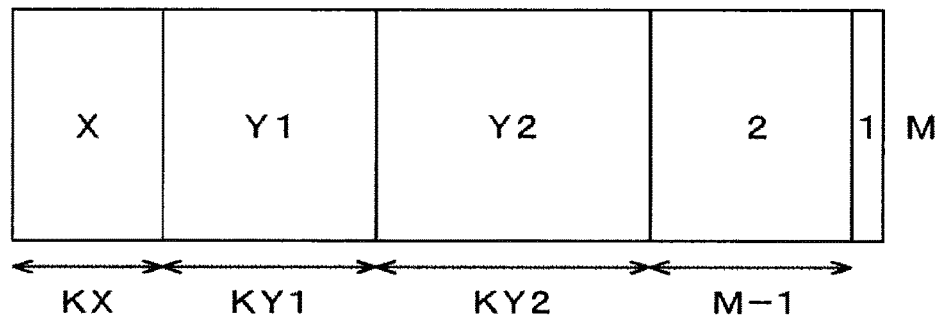
FIG. 46 is a view illustrating a minimum cycle length and a performance threshold of the parity check matrix of the LDPC code whose code length is 16200.
FIG. 47 is a view illustrating the parity check matrix of the LDPC code whose code length is 16200.

FIG. 46 is a view illustrating a minimal cycle length of the parity check matrix H obtained from the parity check matrix initial value table of the LDPC codes of nine types of 1/5, 4/15, 1/3, 2/5, 4/9, 7/15, 8/15, 3/5, and 2/3 whose code length N is 16 k bits in FIGS. 35 to 43 and the performance threshold.

The minimal cycle length of the parity check matrix H whose code rate r is 1/5, 4/15, and 3/5 out of the parity check matrices H obtained from the parity check matrix initial value table in FIGS. 35 to 43 is eight cycles and the minimal cycle length of the parity check matrix H whose code rate r is 1/3, 2/5, 4/9, 7/15, 8/15, and 2/3 is six cycles.

Therefore, there is no cycle-4 in the parity check matrix H obtained from the parity check matrix initial value table in FIGS. 35 to 43.

Also, since redundancy of the LDPC code becomes larger as the code rate r is smaller, the performance threshold tends to be improved (smaller) as the code rate r becomes smaller.

FIG. 47 is a view illustrating the parity check matrix H (hereinafter, also referred to as the parity check matrix H of the LDPC code for mobile) (obtained from the parity check matrix initial value table) in FIGS. 35 to 43.

The column weight is X for first to KX-th columns of the parity check matrix H of the LDPC code for mobile, the column weight is Y1 for next KY1 columns, the column weight is Y2 for next KY2 columns, the column weight is 2 for next M−1 columns, and the column weight is 1 for a last column.

Herein, KX+KY1+KY2+M−1+1 is equal to the code length N=16200 bits.

FIG. 48 is a view illustrating the numbers of columns KX, KY1, KY2, and M, and the column weights X, Y1, and Y2 in FIG. 47 for each code rate r (=1/5, 4/15, 1/3, 2/5, 4/9, 7/15, 8/15, 3/5, and 2/3) of the LDPC code for mobile.

As for the parity check matrix H of the LDPC code for mobile whose code length N is 16 k, as is the case with the parity check matrix specified in DVB-T.2 illustrated in FIGS. 12 and 13, the column weight of the column closer to the top (left) column tends to be larger, so that the code bit closer to the top code bit of the LDPC code for mobile tends to be more tolerant to error (have resistance to error).

Figure 49:
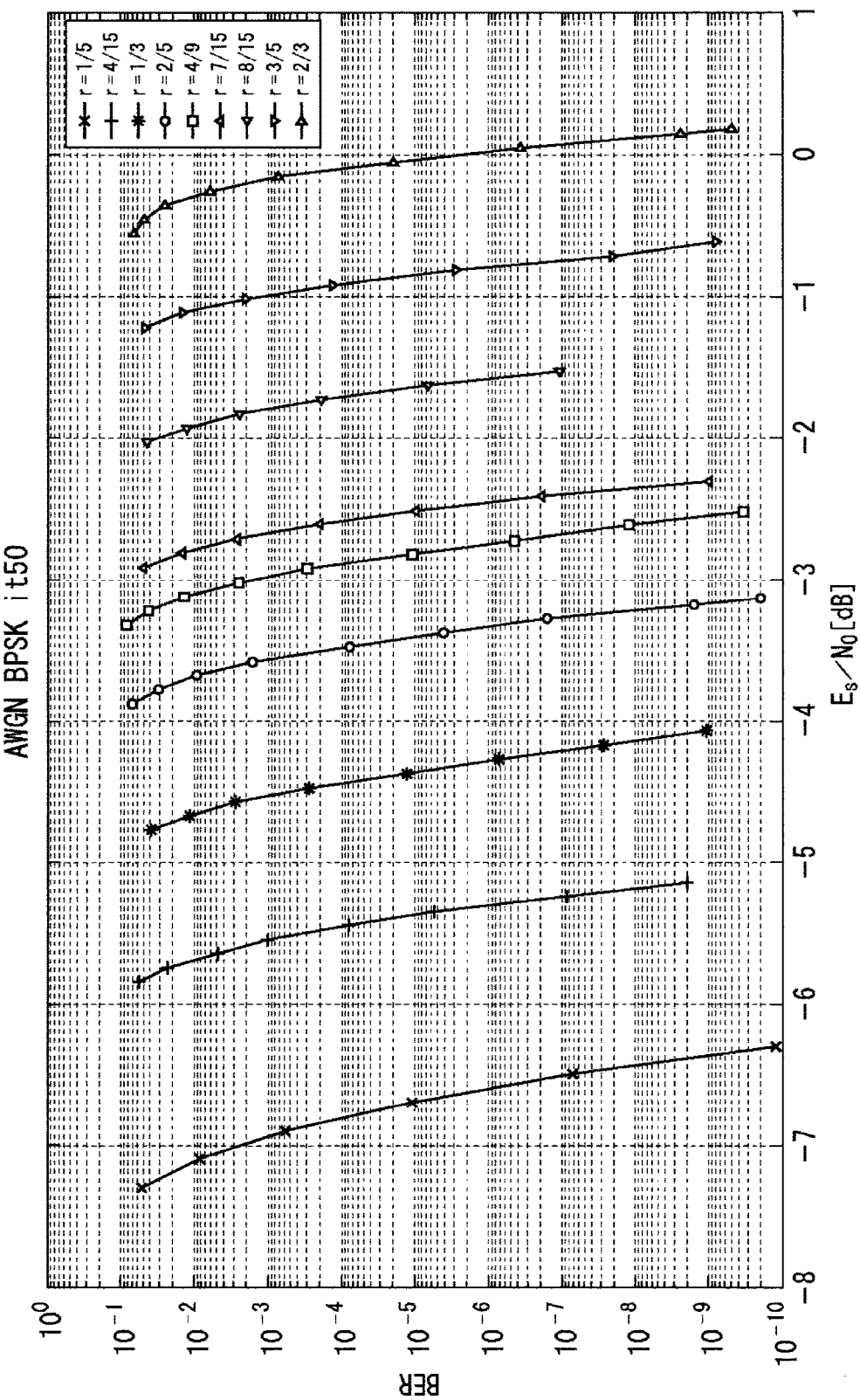
FIG. 49 is a view illustrating a simulation result of a BER of the LDPC code whose code length is 16200.

FIG. 49 is a view illustrating a result of the simulation of the BER of the LDPC code for mobile in FIGS. 35 to 43.

In the simulation, the AWGN communication channel (channel) is supposed, the BPSK is adopted as the modulation scheme and 50 times is adopted as the number of times of repetitive decoding C.

In FIG. 49, $E_s/N_o$ (signal power to noise power ratio per symbol) is plotted along the abscissa and the BER is plotted along the ordinate.

Herein, as for 1/5, 1/3, 2/5, 4/9, 3/5, and 2/3 out of the code rates r=1/5, 4/15, 1/3, 2/5, 4/9, 7/15, 8/15, 3/5, and 2/3 of the LDPC code for mobile, the LDPC code whose code length N is 16 k (hereinafter, also referred to as a standard 16 k code) of the same code rate is specified in DVB-T.2.

In the simulation, as for the LDPC codes for mobile whose code rates r are 1/5, 1/3, 2/5, 4/9, 3/5, and 2/3, it is confirmed that the performance of the BER of the LDPC codes for mobile of all the code rates r is better than the BER of the standard 16 k code of the same code rate specified in DVB-T.2, therefore, according to the LDPC code for mobile, the resistance to error may be improved.

Herein, the same code rates as 4/15, 7/15, and 8/15 out of the code rates r of the LDPC code for mobile 1/5, 4/15, 1/3, 2/5, 4/9, 7/15, 8/15, 3/5, and 2/3 are not present in the standard 16 k code.

In other words, the LDPC codes whose code rates r are 4/15, 7/15, and 8/15, which are not present in the standard 16 k code, are present in the LDPC codes for mobile.

As described above, since the LDPC codes whose code rates r are 4/15, 7/15, and 8/15, which are not present in the standard 16 k code, are present as the LDPC code for mobile, the BERs for the code rates r (=1/5, 4/15, 1/3, 2/5, 4/9, 7/15, 8/15, 3/5, and 2/3) of the LDPC code for mobile are arranged at a relatively regular interval shorter than a predetermined interval of approximately 1 dB in a direction of $E_s/N_o$ as illustrated in FIG. 49.

On the other hand, as for the standard 16 k code, since 4/15, 7/15, and 8/15 are not present as the code rate r of the standard 16 k code, there is a relatively large gap of approximately 2 dB in the direction of $E_s/N_o$ between the BER for the code rate r of 1/5 (1/4 in the notation of DVB-T.2) and the BER for the code rate r of 1/3 and between the BER for the code rate r of 4/9 (1/2 in the notation of DVB-T.2) and the BER for the code rate r of 3/5, and the arrangement of the BERs of the standard 16 k code becomes irregular due to such large gap.

For a broadcasting organization, which broadcasts the program by the transmitting device 11, there is an advantage that the code rate used for the broadcasting may be easily selected according to a condition and the like of the channel (communication channel 13) with the LDPC code for mobile in which the BERs are arranged at a relatively regular small interval approximately 1 db or smaller than the standard 16 k code in which there is a portion with the large gap of approximately 2 db in the arrangement of the BERs and the BERs are irregularly arranged.

[Configuration Example of Receiving Device 12]

Figure 50:
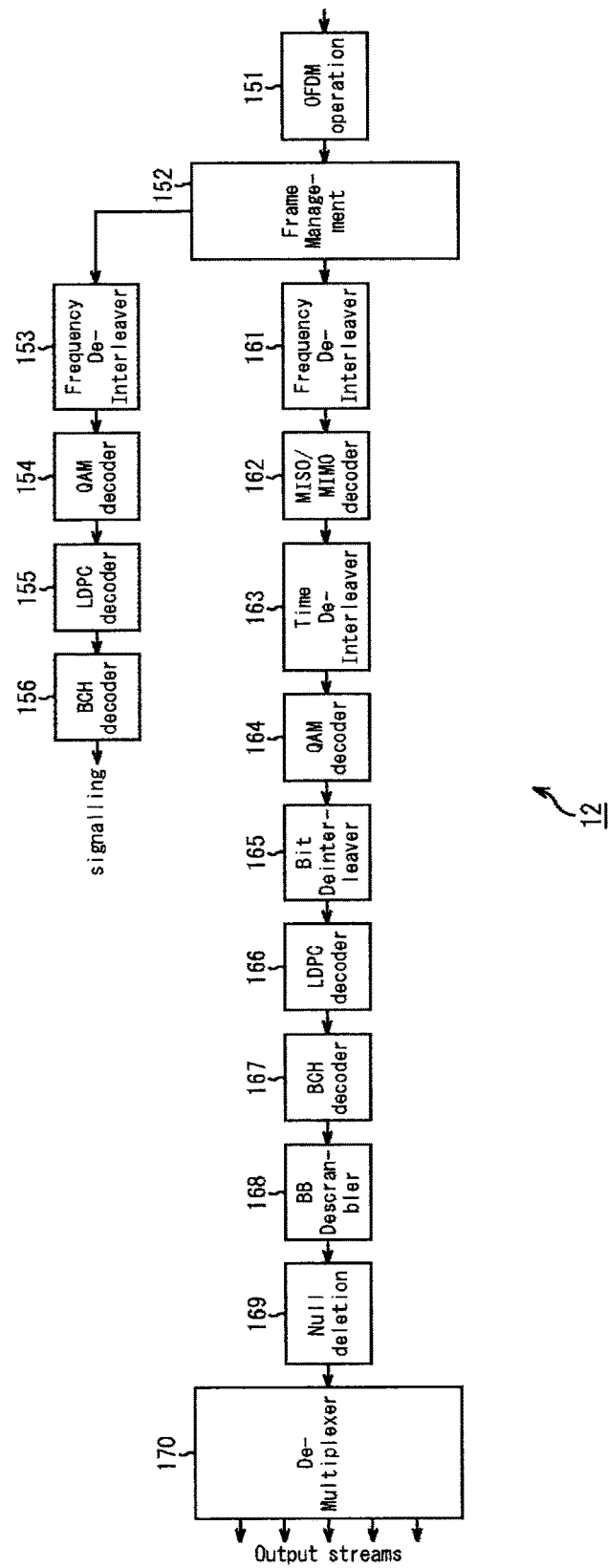
FIG. 50 is a block diagram illustrating a configuration example of a receiving device 12.

FIG. 50 is a block diagram illustrating a configuration example of the receiving device 12 in FIG. 7.

An OFDM operation 151 receives the OFDM signal from the transmitting device 11 (FIG. 7) and performs signal processing of the OFDM signal. The data (symbol) obtained by the signal processing by the OFDM operation 151 is supplied to a frame management 152.

The frame management 152 performs processing of the frame (frame interpretation) composed of the symbols supplied from the OFDM operation 151 and supplies the symbol of the target data and the symbol of the control data obtained as a result to frequency deinterleavers 161 and 153.

The frequency deinterleaver 153 performs frequency deinterleave in the symbol unit for the symbol from the frame management 152 to supply to a QAM decoder 154.

The QAM decoder 154 demaps the symbol from the frequency deinterleaver 153 (symbol arranged onto the signal point) (performs signal point arrangement decoding) to perform the orthogonal demodulation thereof and supplies the data (LDPC code) obtained as a result to a LDPC decoder 155.

The LDPC decoder 155 performs LDPC decoding of the LDPC code from the QAM decoder 154 and supplies the LDPC target data (herein, a BCH code) obtained as a result to a BCH decoder 156.

The BCH decoder 156 performs BCH decoding of the LDPC target data from the LDPC decoder 155 and outputs the control data (signalling) obtained as a result.

On the other hand, the frequency deinterleaver 161 performs the frequency deinterleave in the symbol unit for the symbol from the frame management 152 to supply to a MISO/MIMO decoder 162.

The MISO/MIMO decoder 162 performs time-space decoding of the data (symbol) from the frequency deinterleaver 161 to supply to a time deinterleaver 163.

The time deinterleaver 163 performs time deinterleave of the data (symbol) from the MISO/MIMO decoder 162 in the symbol unit to supply to a QAM decoder 164.

The QAM decoder 164 demaps the symbol from the time deinterleaver 163 (symbol arranged onto the signal point) (performs the signal point arrangement decoding) to perform the orthogonal demodulation thereof and supplies the data (symbol) obtained as a result to a bit deinterleaver 165.

The bit deinterleaver 165 performs bit deinterleave of the data (symbol) from the QAM decoder 164 and supplies the LDPC code obtained as a result to an LDPC decoder 166.

The LDPC decoder 166 performs the LDPC decoding of the LDPC code from the bit deinterleaver 165 and supplies the LDPC target data (herein, the BCH code) obtained as a result to a BCH decoder 167.

The BCH decoder 167 performs the BCH decoding of the LDPC target data from the LDPC decoder 155 and supplies the data obtained as a result to a BB descrambler 168.

The BB descrambler 168 applies an energy inverse diffusion treatment to the data from the BCH decoder 167 and supplies the data obtained as a result to a null deletion 169.

The null deletion 169 deletes the null inserted by the padder 112 in FIG. 8 from the data from the BB descrambler 168 and supplies the same to a demultiplexer 170.

The demultiplexer 170 separates one or more streams (target data) multiplexed into the data from the null deletion 169 and outputs the same as output streams.

Figure 51:
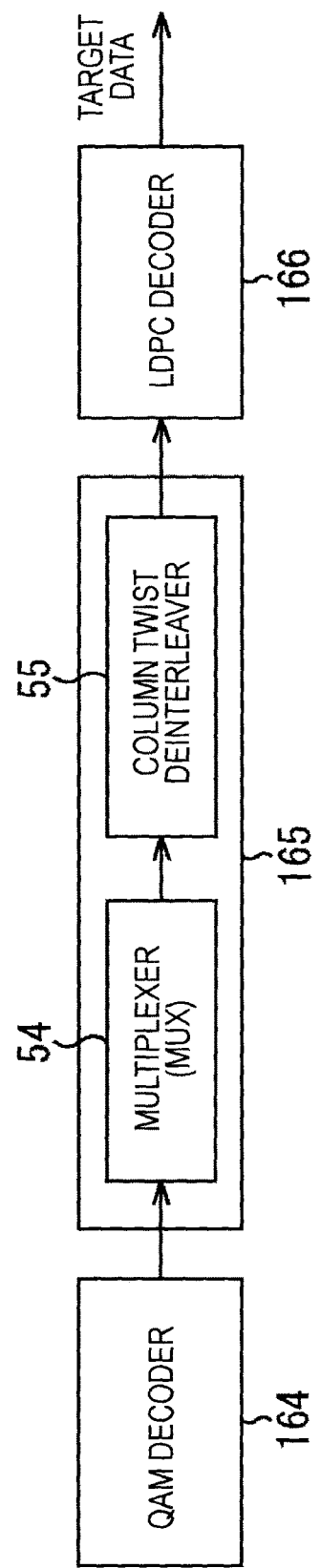
FIG. 51 is a block diagram illustrating a configuration example of a bit deinterleaver 165.

FIG. 51 is a block diagram illustrating a configuration example of the bit deinterleaver 165 in FIG. 50.

The bit deinterleaver 165 composed of a multiplexer (MUX) 54 and a column twist deinterleaver 55 performs the (bit) deinterleave of the symbol bit of the symbol from the QAM decoder 164 (FIG. 50).

That is to say, the multiplexer 54 performs an inverse interchanging process corresponding to the interchanging process performed by the demultiplexer 25 in FIG. 9 (an inverse process of the interchanging process), that is to say, the inverse interchanging process to return the positions of the code bits (symbol bits) of the LDPC code interchanged by the interchanging process to the original positions to the symbol bit of the symbol from the QAM decoder 164 and supplies the LDPC code obtained as a result to the column twist deinterleaver 55.

The column twist deinterleaver 55 performs column twist deinterleave (inverse process of the column twist interleave) corresponding to the column twist interleave as the rearranging process performed by the column twist interleaver 24 in FIG. 9 to the LDPC code from the multiplexer 54, that is to say, the column twist deinterleave, for example, as an inverse rearranging process to return the code bits of the LDPC code, the arrangement of which is changed by the column twist interleave as the rearranging process, to the original arrangement.

Specifically, the column twist deinterleaver 55 writes/reads the code bit of the LDPC code to/from the memory for the deinterleave composed in the same manner as the memory 31 illustrated in FIG. 24 and the like, thereby performing the column twist deinterleave.

In the column twist deinterleaver 55, the writing of the code bits is performed in the row direction of the memory for the deinterleave using the read address at the time of the reading of the code bit from the memory 31 as the write address. Also, the reading of the code bits is performed in the column direction of the memory for the deinterleave using the write address at the time of the writing of the code bit to the memory 31 as the read address.

The LDPC code obtained as a result of the column twist deinterleave is supplied from the column twist deinterleaver 55 to the LDPC decoder 166.

Herein, although the parity interleave, the column twist interleave, and the interchanging process are applied to the LDPC code supplied from the QAM decoder 164 to the bit deinterleaver 165 in this order, only the inverse interchanging corresponding to the interchanging process and the column twist deinterleave corresponding to the column twist interleave, respectively, are performed in the bit deinterleaver 165, so that parity deinterleave (inverse process of the parity interleave) corresponding to the parity interleave, that is to say, the parity deinterleave to return the code bits of the LDPC code, the arrangement of which is changed by the parity interleave, to the original arrangement is not performed.

Therefore, the LDPC code to which the inverse interchanging process and the column twist deinterleave are applied and the parity deinterleave is not applied is supplied from (the column twist deinterleaver 55 of) the bit deinterleaver 165 to the LDPC decoder 166.

The LDPC decoder 166 performs the LDPC decoding of the LDPC code from the bit deinterleaver 165 using the conversion parity check matrix obtained by at least applying the column permutation corresponding to the parity interleave to the parity check matrix H used by the LDPC encoder 115 in FIG. 8 in the LDPC encoding and outputs the data obtained as a result as a decoding result of the LDPC target data.

Figure 52:
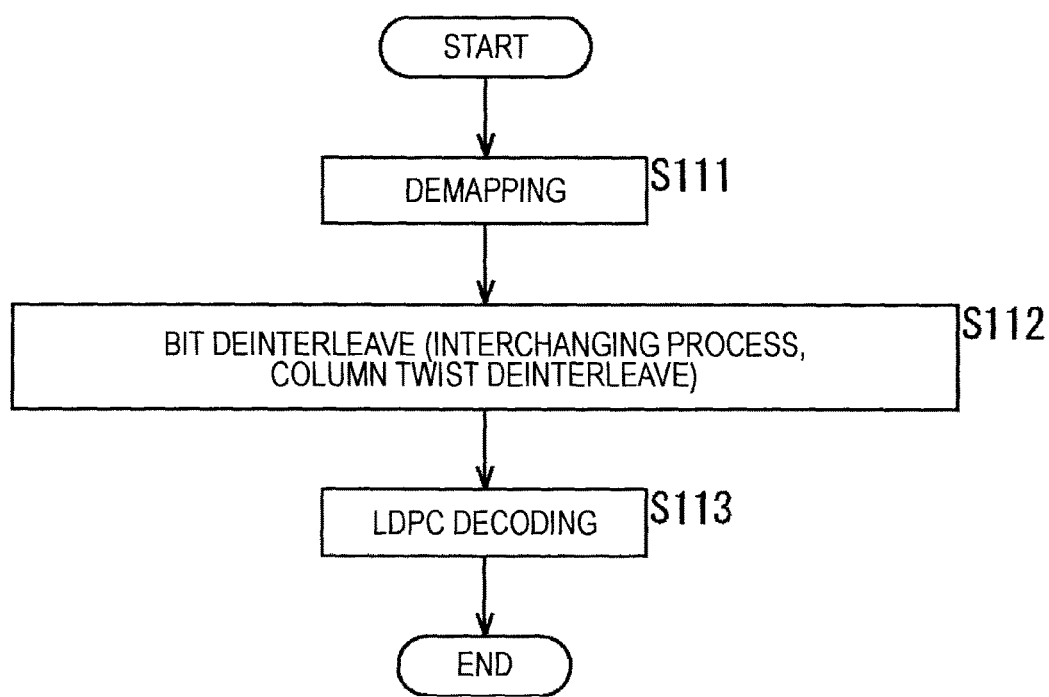
FIG. 52 is a flowchart illustrating processes performed by a QAM decoder 164, the bit deinterleaver 165, and an LDPC decoder 166.

FIG. 52 is a flowchart illustrating processes performed by the QAM decoder 164, the bit deinterleaver 165, and the LDPC decoder 166 in FIG. 51.

At step S111, the QAM decoder 164 demaps the symbol from the time deinterleaver 163 (symbol mapped onto the signal point) to perform the orthogonal demodulation and supplies the same to the bit deinterleaver 165, then the process shifts to step S112.

At step S112, the bit deinterleaver 165 performs the deinterleave (bit deinterleave) of the symbol bit of the symbol from the QAM decoder 164 and the process shifts to step S113.

That is to say, at step S112, the multiplexer 54 performs the inverse interchanging process of the symbol bits of the symbol from the QAM decoder 164 and supplies the code bit of the LDPC code obtained as a result to the column twist deinterleaver 55 in the bit deinterleaver 165.

The column twist deinterleaver 55 performs the column twist deinterleave to the LDPC code from the multiplexer 54 and supplies the LDPC code obtained as a result to the LDPC decoder 166.

At step S113, the LDPC decoder 166 performs the LDPC decoding of the LDPC code from the column twist deinterleaver 55 using the conversion parity check matrix obtained by at least applying the column permutation corresponding to the parity interleave to the parity check matrix H used by the LDPC encoder 115 in FIG. 8 in the LDPC encoding and outputs the data obtained as a result to the BCH decoder 167 as the decoding result of the LDPC target data.

Meanwhile, although the multiplexer 54, which performs the inverse interchanging process, and the column twist deinterleaver 55, which performs the column twist deinterleave, are separately formed also in FIG. 51 as in FIG. 9 for convenience of description, the multiplexer 54 and the column twist deinterleaver 55 may be integrally formed.

When the column twist interleave is not performed by the bit interleaver 116 in FIG. 9, it is not required to provide the column twist deinterleaver 55 in the bit deinterleaver 165 in FIG. 51.

Next, the LDPC decoding performed by the LDPC decoder 166 in FIG. 50 is further described.

The LDPC decoder 166 in FIG. 50 performs the LDPC decoding of the LDPC code to which the inverse interchanging process and the column twist deinterleave are applied and the parity interleave is not applied from the column twist deinterleaver 55 using the conversion parity check matrix obtained by at least applying the column permutation corresponding to the parity interleave to the parity check matrix H used by the LDPC encoder 115 in FIG. 8 in the LDPC encoding as described above.

Herein, the LDPC decoding capable of limiting an operation frequency within a sufficiently feasible range while limiting a circuit size by performing the LDPC decoding using the conversion parity check matrix is conventionally suggested (refer to U.S. Pat. No. 4,224,777, for example).

Therefore, the LDPC decoding using the conversion parity check matrix conventionally suggested is first described with reference to FIGS. 53 to 56.

Figure 53:
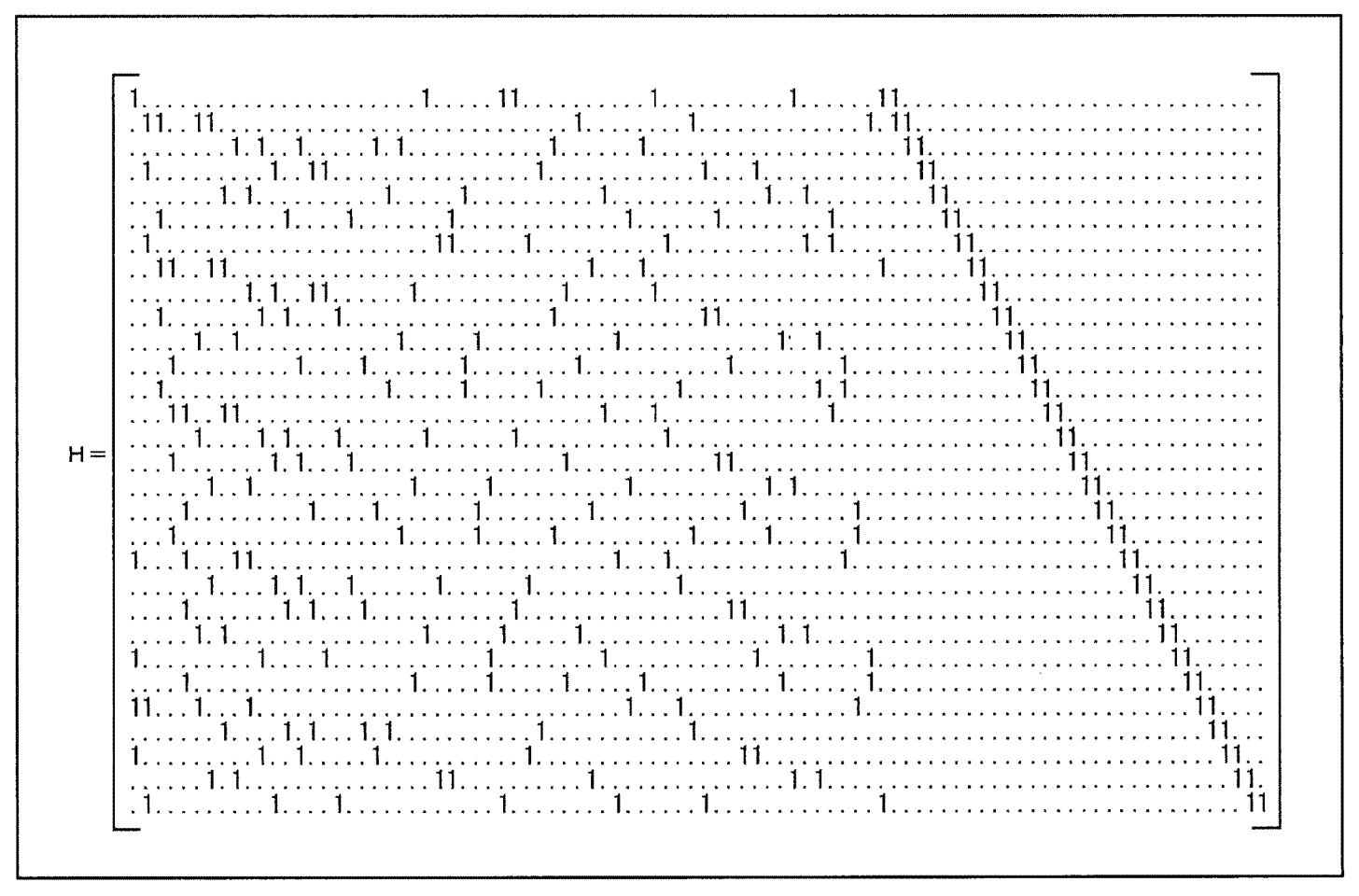

FIG. 53 illustrates an example of the parity check matrix H of the LDPC code whose code length N is 90 and code rate is 2/3.

Meanwhile, in FIG. 53 (also in FIGS. 54 and 55 to be described later), 0 is represented by a period (.).

In the parity check matrix H in FIG. 53, the parity matrix has the stepwise structure.

Figure 54:
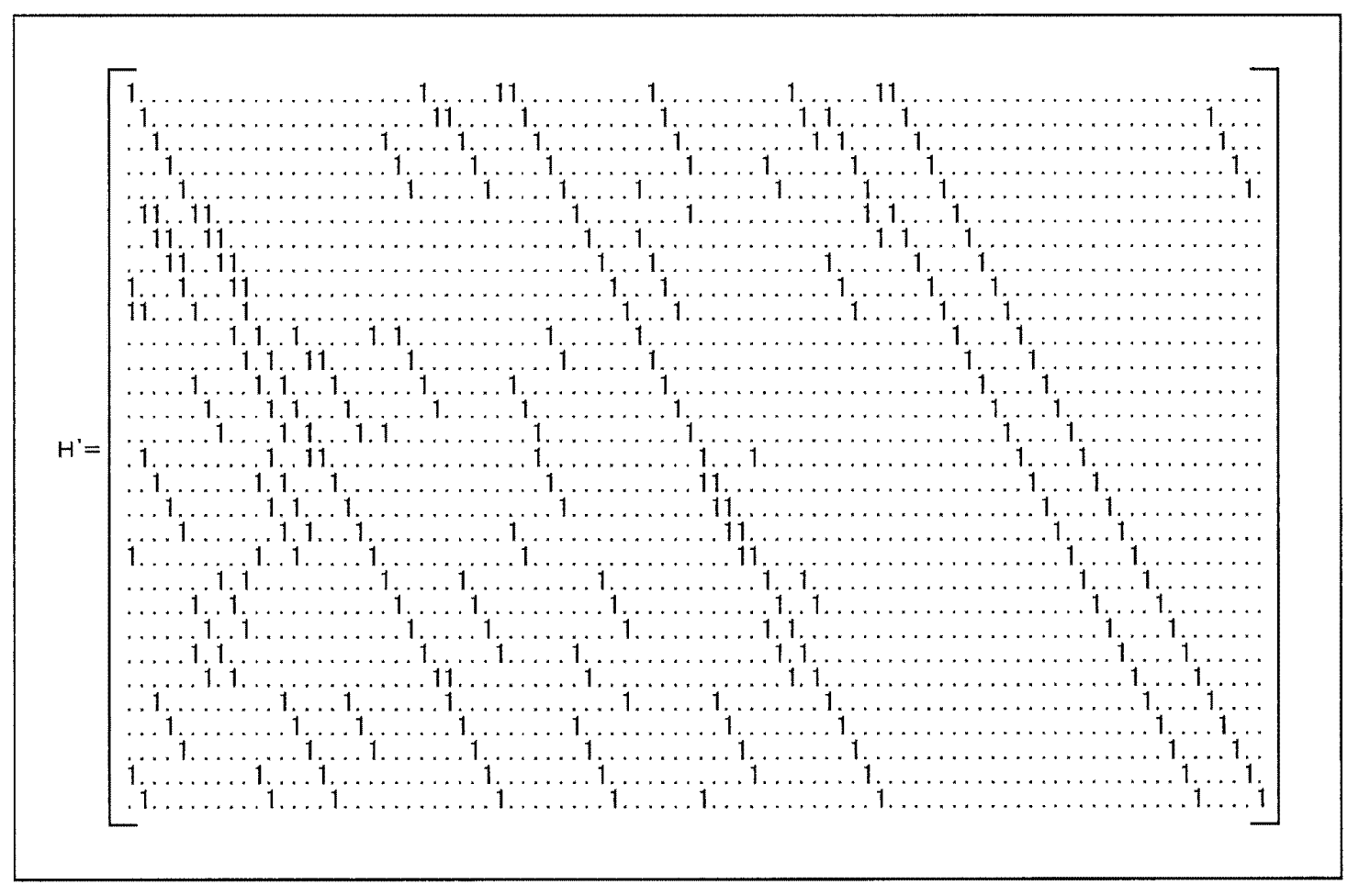

FIG. 54 illustrates a parity check matrix H' obtained by applying the row permutation in equation (11) and the column permutation in equation (12) to the parity check matrix H in FIG. 53.

$$\text{Row permutation: } 6s+t+1\text{-}th \text{ row to } 5t+s+1\text{-}th \text{ row} \qquad (11)$$

$$\text{Column permutation: } 6x+y+61\text{-}th \text{ column to } 5y+x+61\text{-}th \text{ column} \qquad (12)$$

In equations (11) and (12), s, t, x, and y are integers within a range satisfying $0 \le s < 5$, $0 \le t < 6$, $0 \le x < 5$, and $0 \le t < 6$, respectively.

According to the row permutation in equation (11), it is permutated such that 1st, 7th, 13th, 19th, and 25th rows, which leave a remainder of 1 when divided by 6, are made 1st, 2nd, 3rd, 4th, and 5th rows, and 2nd, 8th, 14th, 20th, and 26th rows, which leave a remainder of 2 when divided by 6, are made 6th, 7th, 8th, 9th, and 10th rows, respectively.

Also, according to the column permutation in equation (12), it is permutated such that 61st, 67th, 73rd, 79th, and 85th columns, which leave a remainder of 1 when divided by 6, are made 61st, 62nd, 63rd, 64th, and 65th columns, and 62nd, 68th, 74th, 80th, and 86th columns, which leave a remainder of 2 when divided by 6, are made 66th, 67th, 68th, 69th, and 70th columns, respectively, for the 61st and subsequent columns (parity matrix).

The matrix obtained by performing the row permutation and the column permutation of the parity check matrix H in FIG. 53 in this manner is the parity check matrix H' in FIG. 54.

Herein, the row permutation of the parity check matrix H does not affect the arrangement of the code bits of the LDPC code.

The column permutation in equation (12) corresponds to the parity interleave when the information length K, the number of columns P being the unit of the cyclic structure, and the submultiple q (=M/P) of the parity length M (herein, 30) of the above-described parity interleave to interleave the K+qx+y+1-th code bit to the position of the K+Py+x+1-th code bit are set to 60, 5, and 6, respectively.

By multiplying the parity check matrix (hereinafter, appropriately referred to as the conversion parity check matrix) H' in FIG. 54 by the LDPC code of the parity check matrix (hereinafter, appropriately referred to as the original parity check matrix) H in FIG. 53 to which the same permutation as equation (12) is applied, a 0 vector is output. That is to say, when a row vector obtained by applying the column permutation in equation (12) to the row vector c as the LDPC code (one code word) of the original parity check matrix H is represented as c', $Hc^T$ becomes the 0 vector from the nature of the parity check matrix, so that $H'c'^T$ naturally becomes the 0 vector.

From above, the conversion parity check matrix H' in FIG. 54 is the parity check matrix of the LDPC code c' obtained by applying the column permutation in equation (12) to the LDPC code c of the original parity check matrix H.

Therefore, by applying the column permutation in equation (12) to the LDPC code c of the original parity check matrix H, decoding (LDPC decoding) the LDPC code c' after the column permutation using the conversion parity check matrix H' in FIG. 54, and applying inverse permutation in the column permutation in equation (12) to the decoding result, it is possible to obtain the decoding result similar to that in a case in which the LDPC code of the original parity check matrix H is decoded using the parity check matrix H.

Figure 55:
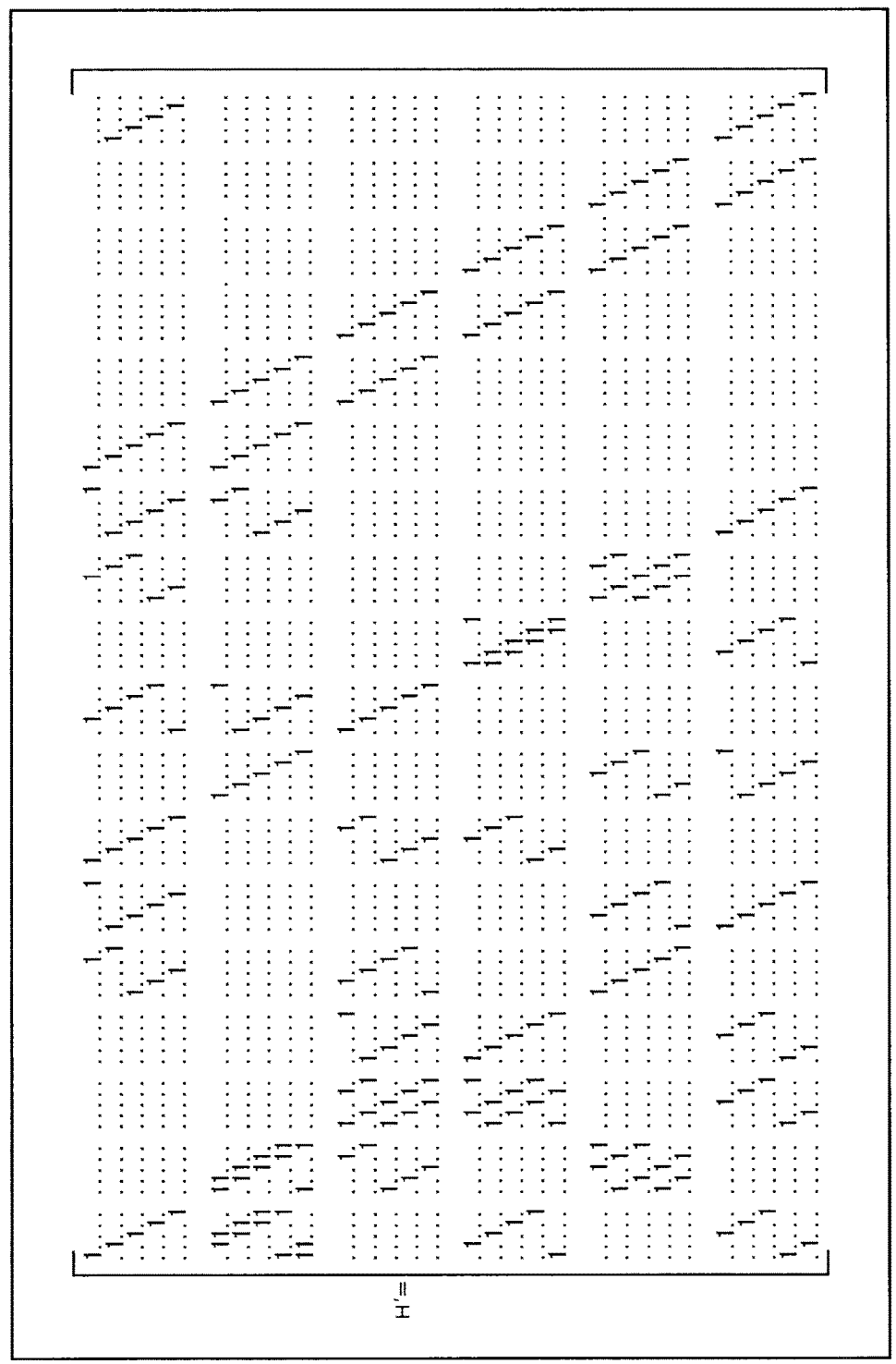
FIG. 55 is a view illustrating the conversion parity check matrix divided into 5×5 units.

FIG. 55 illustrates the conversion parity check matrix H' in FIG. 54 with an interval between the units of 5×5 matrix.

In FIG. 55, the conversion parity check matrix H' is represented by a combination of the 5×5 unit matrix, a matrix in which one or more 1 of the unit matrix is set to 0 (hereinafter, appropriately referred to as a quasi-unit matrix), a matrix obtained by the cyclic shift of the unit matrix or the quasi-unit matrix (hereinafter, appropriately referred to as a shift matrix), a sum of two or more of the unit matrix, the quasi-unit matrix, and the shift matrix (hereinafter, appropriately referred to as a sum matrix), and a 5×5 0 matrix.

It may be said that the conversion parity check matrix H' in FIG. 55 is composed of the 5×5 unit matrix, quasi-unit matrix, shift matrix, sum matrix, and 0 matrix. Therefore, the 5×5 matrices composing the conversion parity check matrix H' are hereinafter appropriately referred to as constitutive matrices.

An architecture to simultaneously perform P check node operations and P variable node operations may be used to decode the LDPC code of the parity check matrix represented by a P×P constitutive matrix.

Figure 56:
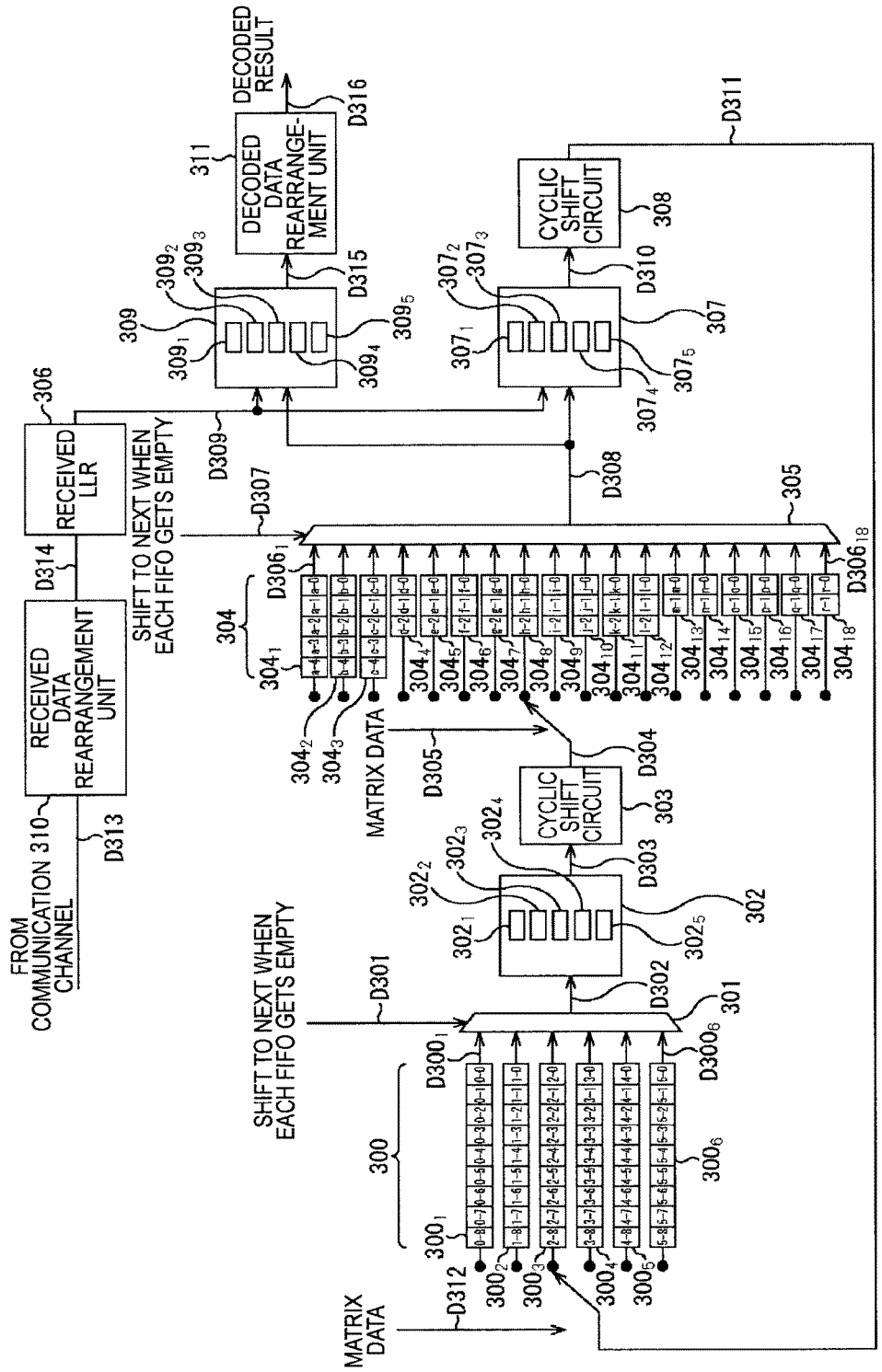
FIG. 56 is a block diagram illustrating a configuration example of a decoding device, which collectively performs P node operations.

FIG. 56 is a block diagram illustrating a configuration example of the decoding device, which performs such decoding.

That is to say, FIG. 56 illustrates the configuration example of the decoding device, which decodes the LDPC code using the conversion parity check matrix H' in FIG. 55 obtained by at least applying the column permutation in equation (12) to the original parity check matrix H in FIG. 53.

The decoding device in FIG. 56 is composed of an edge data storage memory 300 composed of 6 FIFOs $300_1$ to $300_6$, a selector 301, which selects from the FIFOs $300_1$ to $300_6$, a check node calculation unit 302, two cyclic shift circuits 303 and 308, an edge data storage memory 304 composed of 18 FIFOs $304_1$ to $304_{18}$, a selector 305, which selects from the FIFOs $304_1$ to $304_{18}$, a received data memory 306, which stores received data, a variable node calculation unit 307, a decoded word calculation unit 309, a received data rearrangement unit 310, and a decoded data rearrangement unit 311.

A method of storing the data in the edge data storage memories 300 and 304 is first described.

The edge data storage memory 300 is composed of six FIFOs $300_1$ to $300_6$, the number of which is obtained by dividing the number of rows 30 of the conversion parity check matrix H' in FIG. 55 by the number of rows 5 of the constitutive matrix. The FIFOs $300_y$ (y=1, 2, . . . , 6) is formed of a plurality of stages of storage regions and messages corresponding to five edges, the number of which is equal to the number of rows and the number of columns of the constitutive matrix, may be read and written at the same time from and to the storage region of each stage. The number of stages of the storage regions of the FIFO $300_y$ is set to nine being a maximum number of 1 in the row direction of the conversion parity check matrix in FIG. 55 (Hamming weight).

The data corresponding to the position of 1 from first to fifth rows of the conversion parity check matrix H' in FIG. 55 (a message $v_1$ from the variable node) is stored in the FIFO $300_1$ in a form closed up in a horizontal direction for each row (ignoring 0). That is to say, when the j-th row i-th column is represented as (j, i), the data corresponding to the position of 1 of the 5×5 unit matrix from (1, 1) to (5, 5) of the conversion parity check matrix H' is stored in the storage region of a first stage of the FIFO $300_1$. The data corresponding to the position of 1 of the shift matrix from (1, 21) to (5, 25) of the conversion parity check matrix H' (shift matrix obtained by the cyclic shift of the 5×5 unit matrix by three rightward) is stored in the storage region of a second stage. The data is similarly stored in the storage regions of third to eighth stages in association with the conversion parity check matrix H'. Then, the data corresponding to the position of 1 of the shift matrix (shift matrix obtained by replacement of 1 in the first row of the 5×5 unit matrix with 0 and the cyclic shift thereof by one leftward) from (1, 86) to (5, 90) of the conversion parity check matrix H' is stored in the storage region of a ninth stage.

The data corresponding to the position of 1 from 6th to 10th rows of the conversion parity check matrix H' in FIG. 55 is stored in the FIFO $300_2$. That is to say, the data corresponding to the position of 1 of a first shift matrix composing the sum matrix from (6, 1) to (10, 5) of the conversion parity check matrix H' (the sum matrix obtained by summing the first shift matrix obtained by the cyclic shift of the 5×5 unit matrix by one rightward and a second shift matrix obtained by the cyclic shift thereof by two rightward) is stored in the storage region of a first stage of the FIFO $3000_2$. The data corresponding to the position of 1 of the second shift matrix composing the sum matrix from (6, 1) to (10, 5) of the conversion parity check matrix H' is stored in the storage region of a second stage.

That is to say, as for the constitutive matrix whose weight is 2 or larger, the data corresponding to the position of 1 of the unit matrix, the quasi-unit matrix, and the shift matrix whose weight is 1 (message corresponding to the edge belonging to the unit matrix, the quasi-unit matrix, or the shift matrix) when the constitutive matrix is represented as the sum of a plurality of the P×P unit matrix whose weight is 1, the quasi-unit matrix in which one or more of the elements 1 of the unit matrix is set to 0, and the shift matrix obtained by the cyclic shift of the unit matrix or the quasi-unit matrix is stored in the same address (same FIFO out of the FIFOs $300_1$ to $300_6$).

The data is hereinafter stored in association with the conversion parity check matrix H' also in the storage regions of third to ninth stages.

The data is stored in association with the conversion parity check matrix H' also in the FIFOs $300_3$ to $300_6$.

The edge data storage memory 304 is composed of 18 FIFOs $304_1$ to $304_{18}$, the number of which is obtained by dividing the number of columns 90 of the conversion parity check matrix H' by the number of columns 5 of the constitutive matrix. The FIFO $304_x$ (x=1, 2, . . . , 18) is formed of a plurality of stages of storage regions and the messages corresponding to the five edges, the number of which is the number of rows and the number of columns of the conversion constitutive matrix H', may be simultaneously read and written from and to the storage region of each stage.

In the FIFO $304_1$, the data corresponding to the position of 1 from first to fifth columns of the conversion parity check matrix H' in FIG. 55 (message $u_j$ from the check node) is stored in a form closed up in a vertical direction for each column (ignoring 0). That is to say, the data corresponding to the position of 1 of the 5×5 unit matrix from (1, 1) to (5, 5) of the conversion parity check matrix H' is stored in the storage region of a first stage of the FIFO $304_1$. The data corresponding to the position of 1 of the first shift matrix composing the sum matrix from (6, 1) to (10, 5) of the conversion parity check matrix H' (the sum matrix obtained by summing the first shift matrix obtained by the cyclic shift of the 5×5 unit matrix by one rightward and the second shift matrix obtained by the cyclic shift thereof by two rightward) is stored in the storage region of the second stage. The data corresponding to the position of 1 of a second shift matrix composing the sum matrix from (6, 1) to (10, 5) of the conversion parity check matrix H' is stored in the storage region of a third stage.

That is to say, as for the constitutive matrix whose weight is 2 or larger, the data corresponding to the position of 1 of the unit matrix, the quasi-unit matrix, and the shift matrix whose weight is 1 (the message corresponding to the edge belonging to the unit matrix, the quasi-unit matrix, or the shift matrix) when the constitutive matrix is represented as the sum of a plurality of the P×P unit matrix whose weight is 1, the quasi-unit matrix in which one or more of the elements 1 of the unit matrix is set to 0, and the shift matrix obtained by the cyclic shift of the unit matrix or the quasi-unit matrix is stored in the same address (same FIFO out of the FIFOs $304_1$ to $304_{18}$).

Hereinafter, the data is stored in the storage regions of fourth and fifth stages in association with the conversion parity check matrix H'. The number of stages of the storage regions of the FIFO $304_1$ is five being the maximum number of the number of 1 in the row direction from the first to fifth columns of the conversion parity check matrix H' (Hamming weight).

The data is similarly stored in association with the conversion parity check matrix H' in the FIFOs $304_2$ and $304_3$, the length (the number of stages) of which is five. The data is similarly stored in association with the conversion parity check matrix H' in the FIFOs $304_4$ to $304_{12}$, the length of which is three. The data is similarly stored in association with the conversion parity check matrix H' in the FIFOs $304_{13}$ to $304_{18}$, the length of which is two.

Next, operation of the decoding device in FIG. 56 is described.

The edge data storage memory 300 composed of the six FIFOs $300_1$ to $300_6$ selects the FIFO in which the data is stored from the FIFOs $300_1$ to $300_6$ according to information (matrix data) D312 indicating the row of the conversion parity check matrix H' to which five messages D311 supplied from the cyclic shift circuit 308 in a preceding stage belong and collectively stores the five messages D311 in the selected FIFO in sequence. When reading the data, the edge data storage memory 300 reads five messages $D300_1$ from the FIFO $300_1$ in sequence to supply to the selector 301 in a subsequent stage. The edge data storage memory 300 reads the message also from the FIFOs $300_2$ to $300_6$ in sequence after finishing reading the message from the FIFO $300_1$ to supply to the selector 301.

The selector 301 selects the five messages from the FIFO from which the data is currently read out of the FIFOs $300_1$ to $300_6$ according to a select signal D301 and supplies the same as a message D302 to the check node calculation unit 302.

The check node calculation unit 302 composed of five check node calculators $302_1$ to $302_5$ performs the check node operation according to equation (7) using the messages D302 ($D302_1$ to $D302_5$) supplied through the selector 301 (message $v_i$ in equation (7)) and supplies five messages D303 ($D303_1$ to $D303_5$) obtained as a result of the check node operation (message $u_j$ in equation (7)) to the cyclic shift circuit 303.

The cyclic shift circuit 303 performs the cyclic shift of the five messages $D303_1$ to $D303_5$ obtained by the check node calculation unit 302 based on information (matrix data) D305 indicating a value by which the cyclic shift of the original unit matrix in the conversion parity check matrix H' is performed to obtain the corresponding edge and supplies a result to the edge data storage memory 304 as a message D304.

The edge data storage memory 304 composed of 18 FIFOs $304_1$ to $304_{18}$ selects the FIFO in which the data is stored from the FIFOs $304_1$ to $304_{18}$ according to the information D305 indicating the row of the conversion parity check matrix H' to which the five messages D304 supplied from the cyclic shift circuit 303 in the preceding stage belongs and collectively stores the five messages D304 in the selected FIFO in sequence. When reading the data, the edge data storage memory 304 reads the five messages $D306_1$ in sequence from the FIFO $304_1$ to supply to the selector 305 in the subsequent stage. The edge data storage memory 304 reads the message in sequence also from the FIFOs $304_2$ to $304_{18}$ after finishing reading the data from the FIFO $304_1$ to supply to the selector 305.

The selector 305 selects the five messages from the FIFO from which the data is currently read out of the FIFOs $304_1$ to $304_{18}$ according to a select signal D307 and supplies the same to the variable node calculation unit 307 and the decoded word calculation unit 309 as a message D308.

On the other hand, the received data rearrangement unit 310 rearranges an LDPC code D313 received through the communication channel 13 by the column permutation in equation (12) and supplies the same to the received data memory 306 as received data D314. The received data memory 306 calculates a received LLR (log likelihood ratio) from the received data D314 supplied from the received data rearrangement unit 310 to store and collectively supplies the five received LLRs to the variable node calculation unit 307 and the decoded word calculation unit 309 as received value D309.

The variable node calculation unit 307 composed of five variable node calculators $307_1$ to $307_5$ performs the variable node operation according to equation (1) using the messages D308 ($D308_1$ to $D308_5$) supplied through the selector 305 (message $u_j$ in equation (1)) and the five received values D309 supplied from the received data memory 306 (received value $u_{0i}$ in equation (1)) and supplies messages D310 ($D310_1$ to $D310_5$) obtained as a result of the operation (message $v_i$ in equation (1)) to the cyclic shift circuit 308.

The cyclic shift circuit 308 performs the cyclic shift of the messages $D310_1$ to $D310_5$ calculated by the variable node calculation unit 307 based on the information indicating the value by which the cyclic shift of the original unit matrix in the conversion parity check matrix H' is performed to obtain the corresponding edge and supplies a result to the edge data storage memory 300 as a message D311.

Single decoding of the LDPC code may be performed by single round of the above-described operation. The decoding device in FIG. 56 decodes the LDPC code a predetermined number of times, and then obtains a final decoding result by the decoded word calculation unit 309 and the decoded data rearrangement unit 311 to output.

That is to say, the decoded word calculation unit 309 composed of five decoded word calculators $309_1$ to $309_5$ calculates the decoding result (decoded word) based on equation (5) as a final stage of a plurality of times of decoding using the five messages D308 ($D308_1$ to $D308_5$) (message $u_j$ in equation (5)) output by the selector 305 and the five received values D309 (received value $u_{0i}$ in equation (5)) supplied from the received data memory 306 and supplies decoded data D315 obtained as a result to the decoded data rearrangement unit 311.

The decoded data rearrangement unit 311 applies the inverse permutation of the column permutation in equation (12) to the decoded data D315 supplied from the decoded word calculation unit 309, thereby rearranging an order thereof and outputs the same as a final decoded result D316.

As described above, by applying any one or both of the row permutation and the column permutation to the parity check matrix (original parity check matrix) and converting the same to the parity check matrix (conversion parity check matrix) represented by the combination of the P×P unit matrix, the quasi-unit matrix in which one or more of the elements of 1 of the unit matrix is set to 0, the shift matrix obtained by the cyclic shift of the unit matrix or the quasi-unit matrix, the sum matrix obtained by summing a plurality of the unit matrix, the quasi-unit matrix, and the shift matrix, and the P×P 0 matrix, that is to say, the combination of the constitutive matrices, it becomes possible to adopt the architecture to simultaneously perform the P check node operations and the P variable node operations as the decoding of the LDPC code, thereby limiting the operation frequency within the feasible range by simultaneously performing the P node operations to perform a great number of times of repetitive decoding.

The LDPC decoder 166, which composes the receiving device 12 in FIG. 50, performs the LDPC decoding by simultaneously performing the P check node operations and the P variable node operations as is the case with the decoding device in FIG. 56.

That is to say, in order to simplify the description, supposing that the parity check matrix of the LDPC code output by the LDPC encoder 115 composing the transmitting device 11 in FIG. 8 is the parity check matrix H in which the parity matrix has the stepwise structure illustrated in FIG. 53, for example, the parity interleaver 23 of the transmitting device 11 performs the parity interleave to interleave the K+qx+y+1-th code bit to the position of the K+Py+x+1-th code bit by setting the information length K, the number of columns being the unit of the cyclic structure, and the submultiple q (=M/P) of the parity length M to 60, 5, and 6, respectively.

The parity interleave corresponds to the column permutation in equation (12) as described above, so that the LDPC decoder 166 is not required to perform the column permutation in equation (12).

Therefore, in the receiving device 12 in FIG. 50, as described above, the LDPC code to which the parity deinterleave is not applied, that is to say, the LDPC code in a state in which the column permutation in equation (12) is performed is supplied from the column twist deinterleaver 55 to the LDPC decoder 166, and the LDPC decoder 166 performs the process similar to that of the decoding device in FIG. 56 except that this does not perform the column permutation in equation (12).

Figure 57:
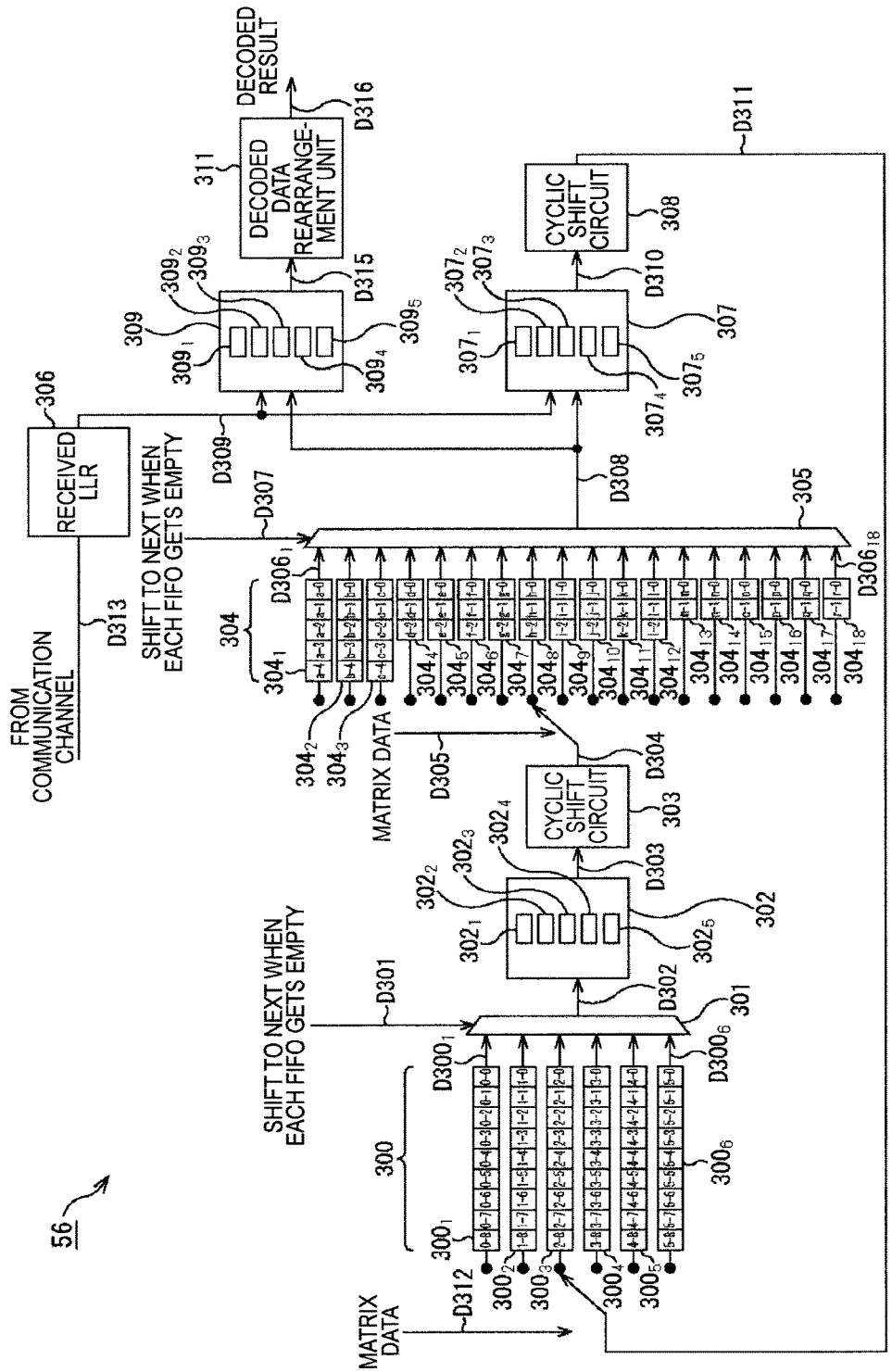
FIG. 57 is a block diagram illustrating a configuration example of the LDPC decoder 166.

That is to say, FIG. 57 illustrates a configuration example of the LDPC decoder 166 in FIG. 50.

In FIG. 57, the LDPC decoder 166 is configured as the decoding device in FIG. 56 except that the received data rearrangement unit 310 in FIG. 56 is not provided, and this performs the process similar to that of the decoding device in FIG. 56 except that the column permutation in equation (12) is not performed, so that the description thereof is omitted.

As described above, the LDPC decoder 166 may be composed without the received data rearrangement unit 310, so that a scale thereof may be made smaller than that of the decoding device in FIG. 56.

Meanwhile, although the code length N, the information length K, the number of columns (the number of rows and the number of columns of the constitutive matrix) being the unit of the cyclic structure P, and the submultiple q (=M/P) of the parity length M are set to 90, 60, 5, and 6, respectively, in FIGS. 53 to 57 in order to simplify the description, the code length N, the information length K, the number of columns P being the unit of the cyclic structure, and the submultiple q (=M/P) are not limited to the above-described values.

That is to say, in the transmitting device 11 in FIG. 8, the LDPC encoder 115 outputs the LDPC code of the code length of 64800, 16200 and the like, the information length K of N−Pq (=N−M), the number of columns P being the unit of the cyclic structure of 360, and the submultiple q of M/P, for example, the LDPC decoder 166 in FIG. 57 may also be applied to a case in which the LDPC decoding is performed by simultaneously performing the P check node operations and the P variable node operations to such LDPC code.

Figure 58:
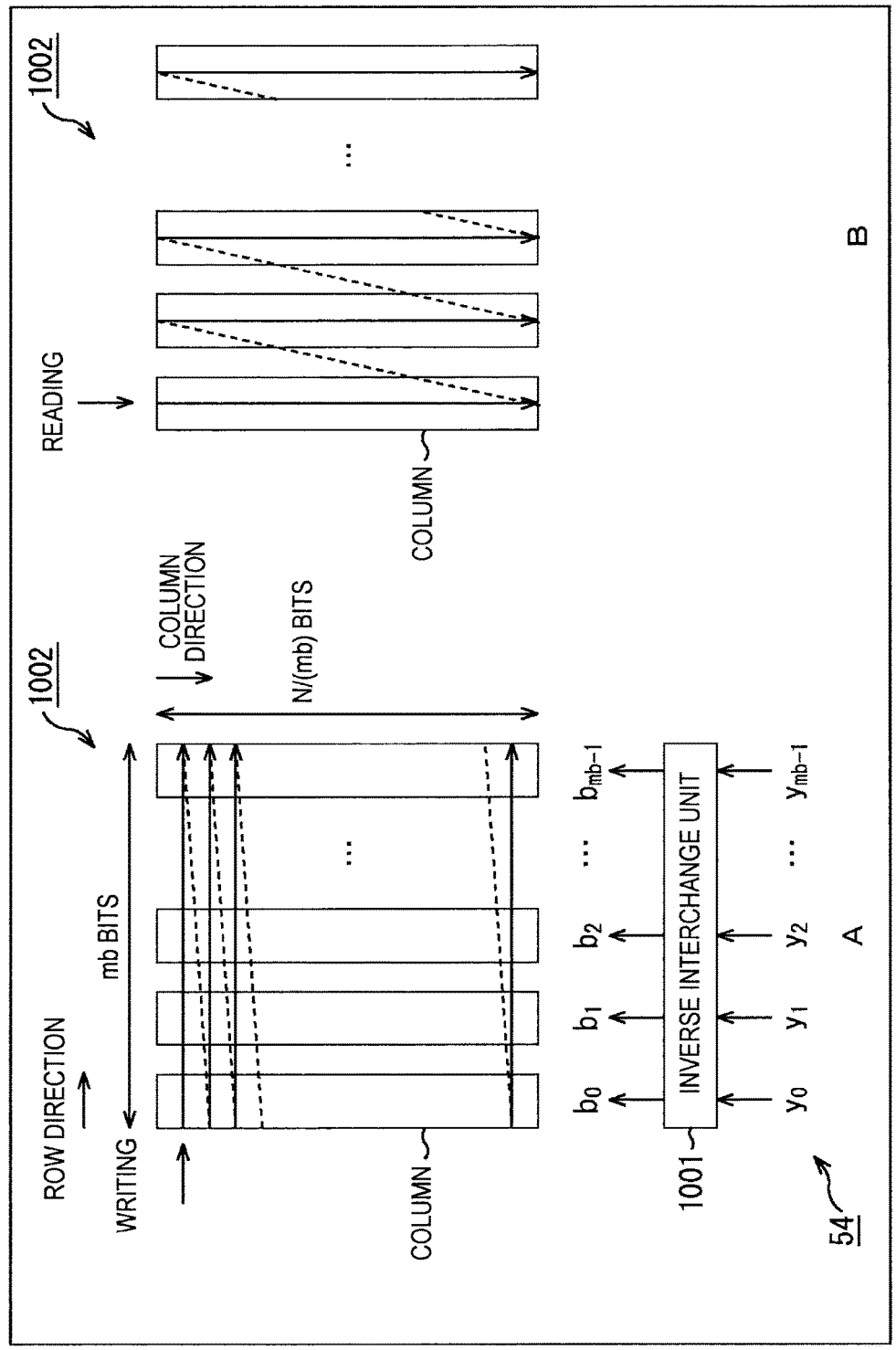
FIG. 58 is a view illustrating a process of a multiplexer 54 composing the bit deinterleaver 165.

FIG. 58 is a view illustrating the process of the multiplexer 54 composing the bit deinterleaver 165 in FIG. 51.

That is to say, FIG. 58A illustrates a functional configuration example of the multiplexer 54.

The multiplexer 54 is composed of an inverse interchange unit 1001 and a memory 1002.

The multiplexer 54 performs the inverse interchanging process (inverse process of the interchanging process) corresponding to the interchanging process performed by the demultiplexer 25 of the transmitting device 11, that is to say, the inverse interchanging process to return the position of the code bit (symbol bit) of the LDPC code interchanged by the interchanging process to the original position of the symbol bits of the symbol supplied from the QAM decoder 164 in the preceding stage and supplies the LDPC code obtained as a result to the column twist deinterleaver 55 in the subsequent stage.

That is to say, in the multiplexer 54, mb symbol bits $y_0, y_1, \ldots, y_{mb-1}$ of the b symbols are supplied to the inverse interchange unit 1001 in units of (consecutive) b symbols.

The inverse interchange unit 1001 performs the inverse interchanging to return the mb symbol bits $y_0$ to $y_{mb-1}$ to the original arrangement of the mb code bits $b_0, b_1, \ldots b_{mb-1}$ (arrangement of the code bits $b_0$ to $b_{mb-1}$ before the interchanging by the interchange unit 32 composing the demultiplexer 25 on the transmitting device 11 side is performed) and outputs the mb code bits $b_0$ to $b_{mb-1}$ obtained as a result.

The memory 1002 has the storage capacity to store the mb bits in the row (horizontal) direction and store the N/(mb) bits in the column (vertical) direction as the memory 31 composing the demultiplexer 25 on the transmitting device 11 side. That is to say, the memory 1002 is composed of the mb columns, which store the N/(mb) bits.

The code bits of the LDPC code output by the inverse interchange unit 1001 are written to the memory 1002 in a direction in which the code bits are read from the memory 31 of the demultiplexer 25 of the transmitting device 11 and the code bits written to the memory 1002 are read in a direction in which the code bits are written to the memory 31.

That is to say, in the multiplexer 54 of the receiving device 12, as illustrated in FIG. 58A, the code bits of the LDPC code output by the inverse interchange unit 1001 are sequentially written in the row direction in units of mb bits from a first row downward in the memory 1002.

When the writing of the code bits as many as one code length is finished, the multiplexer 54 reads the code bits in the column direction from the memory 1002 to supply to the column twist deinterleaver 55 in the subsequent stage.

Herein, FIG. 58B is a view illustrating the reading of the code bit from the memory 1002.

The multiplexer 54 reads the code bits of the LDPC code from the top of the column composing the memory 1002 downward (in the column direction) from a left column to a right column.

Figure 59:
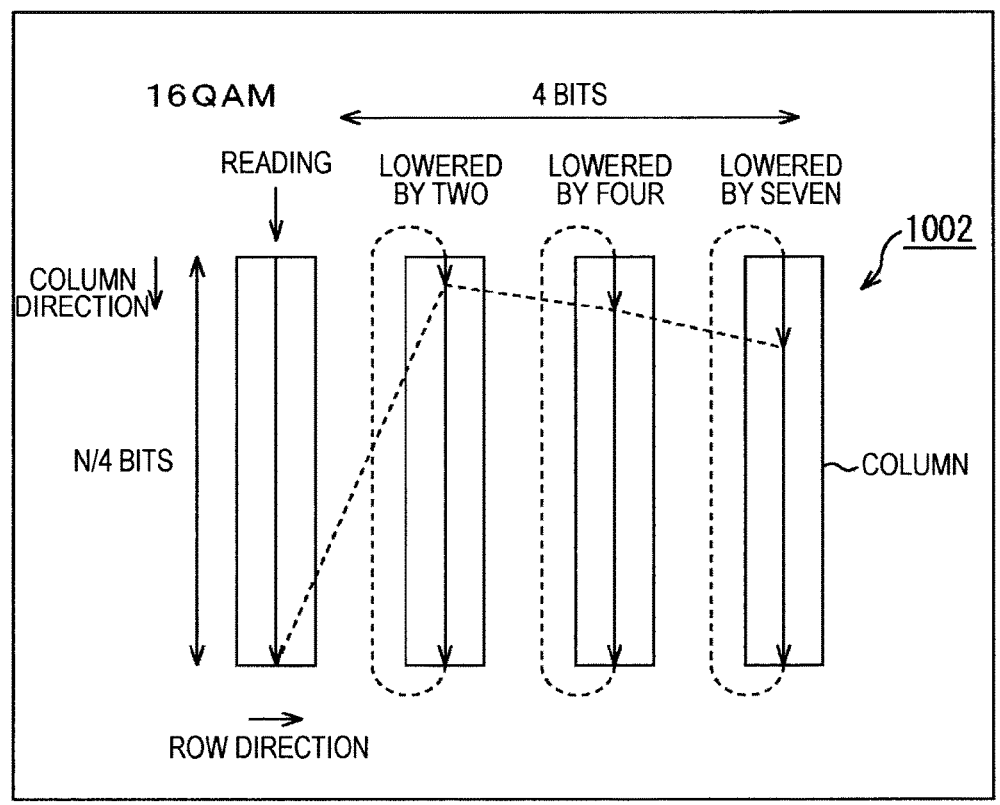
FIG. 59 is a view illustrating a process of a column twist deinterleaver 55.

FIG. 59 is a view illustrating the process of the column twist deinterleaver 55 composing the bit deinterleaver 165 in FIG. 51.

That is to say, FIG. 59 illustrates a configuration example of the memory 1002 of the multiplexer 54.

The memory 1002 has the storage capacity to store the mb bits in the column (vertical) direction and the N/(mb) bits in the row (horizontal) direction and is composed of the mb columns.

The column twist deinterleaver 55 controls a reading start position when the code bits of the LDPC code are written in the row direction and read in the column direction to/from the memory 1002, thereby performing the column twist deinterleave.

That is to say, the column twist deinterleaver 55 performs the inverse rearranging process to return the arrangement of the code bits rearranged by the column twist interleave to the original arrangement by appropriately changing the reading start position at which the reading of the code bits is started for each of a plurality of columns.

Herein, FIG. 59 illustrates the configuration example of the memory 1002 in a case in which the modulation scheme is the 16QAM and the multiple number b is set to 1 illustrated in FIG. 24. Therefore, the number of bits m of one symbol is four and the memory 1002 is composed of four (=mb) columns.

The column twist deinterleaver 55 sequentially writes the code bits of the LDPC code output by the interchange unit 1001 in the row direction from the first row of the memory 1002 downward in place of the multiplexer 54.

When the writing of the code bits as many as one code length is finished, the column twist deinterleaver 55 reads the code bits from the top of the memory 1002 downward (in the column direction) from the left column to the right column.

The column twist deinterleaver 55 reads the code bit from the memory 1002 while making the writing start position at which the column twist interleaver 24 on the transmitting device 11 side writes the code bit the reading start position of the code bit.

That is to say, when an address of each position in the column direction is represented by an integer in ascending order while setting the address of a top (uppermost) position of each column to 0, in the column twist deinterleaver 55, the reading start position is set to a position whose address is 0 for a leftmost column, the reading start position is set to a position whose address is 2 for a second column (from left), the reading start position is set to a position whose address is 4 for a third column, and the reading start position is set to a position whose address is 7 for a fourth column when the modulation scheme is the 16QAM and the multiple number b is set to 1.

Meanwhile, for the column in which the reading start position is located on a position other than the position whose address is 0, when the code bits are read up to an undermost position, it is returned to the top (position whose address is 0) and the reading is performed up to a position just before the reading start position. Then, the reading from the next (right) column is performed.

The arrangement of the code bits rearranged by the column twist interleave is returned to the original arrangement by the above-described column twist deinterleave.

Figure 60:
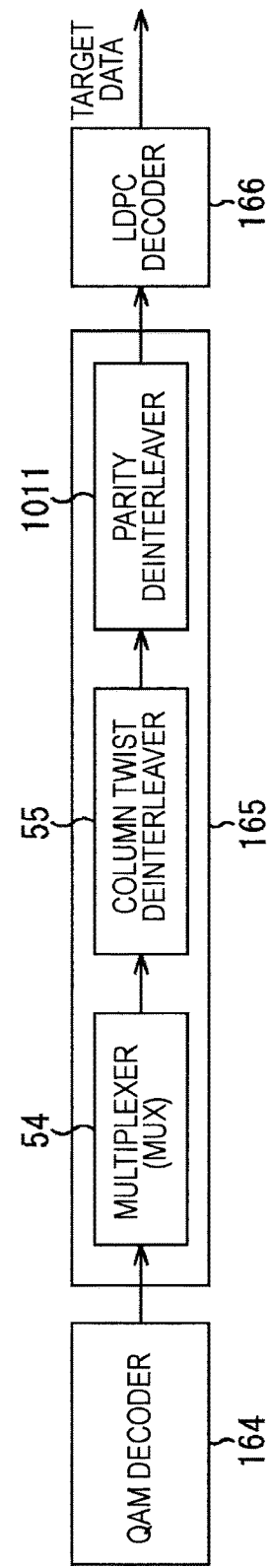
FIG. 60 is a block diagram illustrating another configuration example of the bit deinterleaver 165.

FIG. 60 is a block diagram illustrating another configuration example of the bit deinterleaver 165 in FIG. 50.

Meanwhile, in the drawing, the same reference sign is assigned to a part corresponding to that in FIG. 51 and the description thereof is hereinafter appropriately omitted.

That is to say, the bit deinterleaver 165 in FIG. 60 is configured in the same manner as that in FIG. 51 except that a parity deinterleaver 1011 is newly provided.

In FIG. 60, the bit deinterleaver 165 composed of the multiplexer (MUX) 54, the column twist deinterleaver 55, and the parity deinterleaver 1011 performs the bit deinterleave of the code bit of the LDPC code from the QAM decoder 164.

That is to say, the multiplexer 54 performs the inverse interchanging process corresponding to the interchanging process performed by the demultiplexer 25 of the transmitting device 11 (inverse process of the interchanging process) of the LDPC code from the QAM decoder 164, that is to say, the inverse interchanging process to return the position of the code bit interchanged by the interchanging process to the original position and supplies the LDPC code obtained as a result to the column twist deinterleaver 55.

The column twist deinterleaver 55 applies the column twist deinterleave corresponding to the column twist interleave as the rearranging process performed by the column twist interleaver 24 of the transmitting device 11 to the LDPC code from the multiplexer 54.

The LDPC code obtained as a result of the column twist deinterleave is supplied from the column twist deinterleaver 55 to the parity deinterleaver 1011.

The parity deinterleaver 1011 applies the parity deinterleave (inverse process of the parity interleave) corresponding to the parity interleave performed by the parity interleaver 23 of the transmitting device 11, that is to say, the parity deinterleave to return the code bit of the LDPC code, the arrangement of which is changed by the parity interleave, to the original arrangement to the code bit after the column twist deinterleave by the column twist deinterleaver 55.

The LDPC code obtained as a result of the parity deinterleave is supplied from the parity deinterleaver 1011 to the LDPC decoder 166.

Therefore, in the bit deinterleaver 165 in FIG. 60, the LDPC code to which the inverse interchanging process, the column twist deinterleave, and the parity deinterleave are applied, that is to say, the LDPC code obtained by the LDPC encoding according to the parity check matrix H is supplied to the LDPC decoder 166.

The LDPC decoder 166 performs the LDPC decoding of the LDPC code from the bit deinterleaver 165 using the parity check matrix H itself used by the LDPC encoder 115 of the transmitting device 11 in the LDPC encoding or the conversion parity check matrix obtained by at least applying the column permutation corresponding to the parity interleave to the parity check matrix H and outputs the data obtained as a result as the decoding result of the LDPC target data.

Herein, in FIG. 60, since the LDPC code obtained by the LDPC encoding according to the parity check matrix H is supplied from (the parity deinterleaver 1011 of) the bit deinterleaver 165 to the LDPC decoder 166, the LDPC decoder 166 may be composed of the decoding device, which performs the LDPC decoding by a full serial decoding scheme to sequentially perform the operation of the message (check node message and the variable node message) one node after another, and the decoding device, which performs the LDPC decoding by a full parallel decoding scheme to simultaneously perform the operation of the message (in parallel) for all the nodes, for example, when the LDPC decoding of the LDPC code is performed using the parity check matrix H itself used by the LDPC encoder 115 of the transmitting device 11 in the LDPC encoding.

Also, when the LDPC decoder 166 performs the LDPC decoding of the LDPC code using the conversion parity check matrix obtained by at least performing the column permutation corresponding to the parity interleave of the parity check matrix H used by the LDPC encoder 115 of the transmitting device 11 in the LDPC encoding, the LDPC decoder 166 may be composed of the decoding device of the architecture to simultaneously perform the P (or submultiple of P other than 1) check node operations and variable node operations being the decoding device (FIG. 56) including the received data rearrangement unit 310 to rearrange the code bits of the LDPC code by applying the column permutation similar to the column permutation for obtaining the conversion parity check matrix to the LDPC code.

Meanwhile, although the multiplexer 54, which performs the inverse interchanging process, the column twist deinterleaver 55, which performs the column twist deinterleave, and the parity deinterleaver 1011, which performs the parity deinterleave, are separately formed for convenience of description in FIG. 60, two or more of the multiplexer 54, the column twist deinterleaver 55, and the parity deinterleaver 1011 may be integrally formed as the parity interleaver 23, the column twist interleaver 24, and the demultiplexer 25 of the transmitting device 11.

[Configuration Example of Receiving System]

Figure 61:
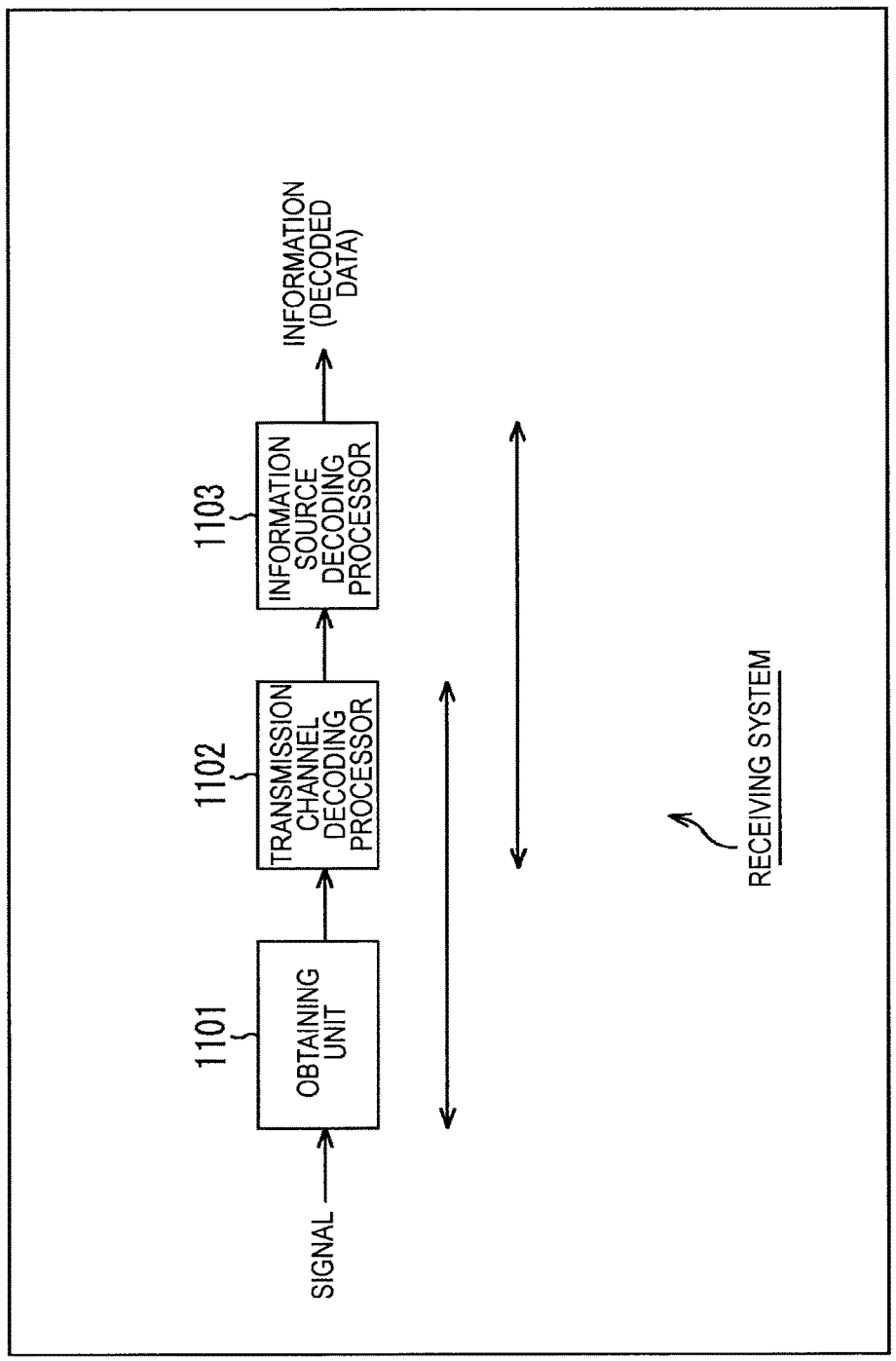
FIG. 61 is a block diagram illustrating a first configuration example of a receiving system to which the receiving device 12 may be applied.

FIG. 61 is a block diagram illustrating a first configuration example of a receiving system to which the receiving device 12 may be applied.

In FIG. 61, the receiving system is composed of an obtaining unit 1101, a transmission channel decoding processor 1102, and an information source decoding processor 1103.

The obtaining unit 1101 obtains a signal including the LDPC code obtained by at least the LDPC encoding of the LDPC target data such as the image data and the audio data of the program through a transmission channel (communication channel) not illustrated such as digital terrestrial broadcasting, digital satellite broadcasting, and a network such as a CATV network, the Internet and the like, for example, to supply to the transmission channel decoding processor 1102.

Herein, if the signal obtained by the obtaining unit 1101 is broadcasted from a broadcasting station through the terrestrial wave, a satellite wave, the CATV (cable television) network and the like, for example, the obtaining unit 1101 is composed of a tuner, an STB (set top box) and the like. When the signal obtained by the obtaining unit 1101 is multicast-transmitted from a web server such as IPTV (Internet protocol television), for example, the obtaining unit 1101 is composed of a network I/F (interface) such as an NIC (network interface card), for example.

The transmission channel decoding processor 1102 corresponds to the receiving device 12. The transmission channel decoding processor 1102 applies a transmission channel decoding process at least including a process to correct the error occurring in the transmission channel to the signal obtained by the obtaining unit 1101 through the transmission channel and supplies the signal obtained as a result to the information source decoding processor 1103.

That is to say, the signal obtained by the obtaining unit 1101 through the transmission channel is the signal obtained by at least the error correction encoding for correcting the error occurring in the transmission channel and the transmission channel decoding processor 1102 applies the transmission channel decoding process such as an error correction process, for example, to such signal.

Herein, the error correction encoding includes the LDPC encoding, BCH encoding and the like, for example. Herein, the LDPC encoding is at least performed as the error correction encoding.

Also, the transmission channel decoding process might include demodulation of a modulated signal and the like.

The information source decoding processor 1103 applies an information source decoding process at least including a process to expand compressed information to original information to the signal to which the transmission channel decoding process is applied.

That is to say, there is a case in which compression encoding to compress the information is applied to the signal obtained by the obtaining unit 1101 through the transmission channel so as to decrease a data volume of the image and the audio as the information, and in this case, the information source decoding processor 1103 applies the information source decoding process such as the process to expand the compressed information to the original information (expanding process) to the signal to which the transmission channel decoding process is applied.

Meanwhile, when the compression encoding is not applied to the signal obtained by the obtaining unit 1101 through the transmission channel, the information source decoding processor 1103 does not perform the process to expand the compressed information to the original information.

Herein, the expanding process includes MPEG decoding and the like, for example. Also, the transmission channel decoding process might include descrambling and the like in addition to the expanding process.

In the receiving system configured as above, the obtaining unit 1101 applies the compression encoding such as MPEG encoding to the data of the image and the audio, for example, and obtains the signal to which the error correction encoding such as the LDPC encoding is applied through the transmission channel to supply to the transmission channel decoding processor 1102.

The transmission channel decoding processor 1102 applies the process similar to that performed by the receiving device 12 and the like to the signal from the obtaining unit 1101 as the transmission channel decoding process, for example, and the signal obtained as a result is supplied to the information source decoding processor 1103.

The information source decoding processor 1103 applies the information source decoding process such as the MPEG decoding to the signal from the transmission channel decoding processor 1102 and outputs the image or the audio obtained as a result.

The receiving system in FIG. 61 as described above may be applied to a television tuner and the like, which receives television broadcasting as the digital broadcasting, for example.

Meanwhile, it is possible to form each of the obtaining unit 1101, the transmission channel decoding processor 1102, and the information source decoding processor 1103 as one independent device (hardware (IC (integrated circuit) and the like) or a software module).

Also, as for the obtaining unit 1101, the transmission channel decoding processor 1102, and the information source decoding processor 1103, it is possible to form a set of the obtaining unit 1101 and the transmission channel decoding processor 1102, a set of the transmission channel decoding processor 1102 and the information source decoding processor 1103, and a set of the obtaining unit 1101, the transmission channel decoding processor 1102, and the information source decoding processor 1103 as one independent device.

Figure 62:
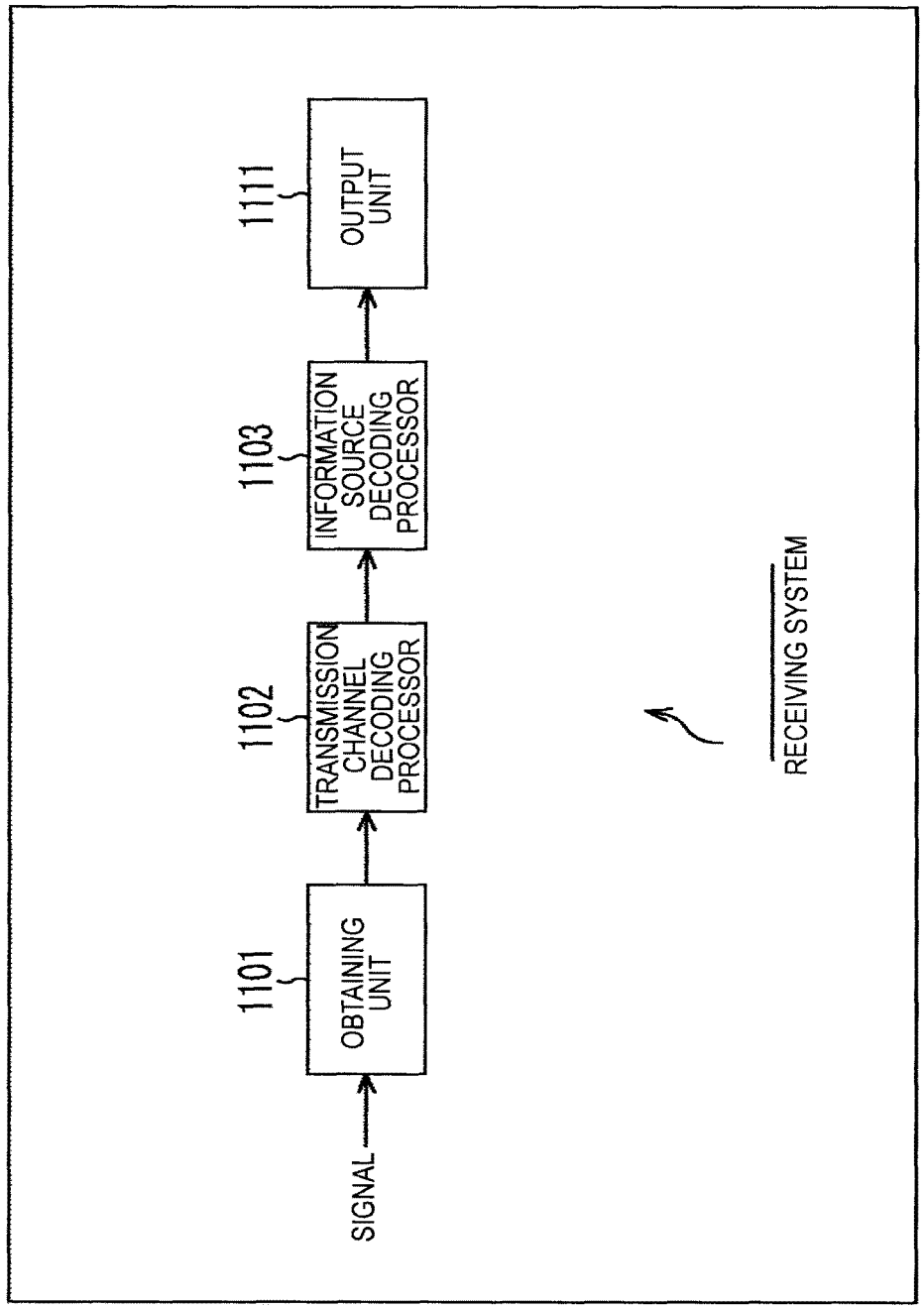
FIG. 62 is a block diagram illustrating a second configuration example of the receiving system to which the receiving device 12 may be applied.

FIG. 62 is a block diagram illustrating a second configuration example of the receiving system to which the receiving device 12 may be applied.

Meanwhile, in the drawing, the same reference sign is assigned to a part corresponding to that in FIG. 61 and the description thereof is hereinafter appropriately omitted.

The receiving system in FIG. 62 is the same as that in FIG. 61 in that this includes the obtaining unit 1101, the transmission channel decoding processor 1102, and the information source decoding processor 1103 and is different from that in FIG. 61 in that an output unit 1111 is newly provided.

The output unit 1111 is a display device, which displays the image, and a speaker, which outputs the audio, for example, and this outputs the image, the audio and the like as the signal output from the information source decoding processor 1103. That is to say, the output unit 1111 displays the image or outputs the audio.

The receiving system in FIG. 62 as described above may be applied to a TV (television receiver), which receives the television broadcasting as the digital broadcasting, a radio receiver, which receives radio broadcasting, and the like, for example.

Meanwhile, when the compression encoding is not applied to the signal obtained by the obtaining unit 1101, the signal output by the transmission channel decoding processor 1102 is supplied to the output unit 1111.

Figure 63:
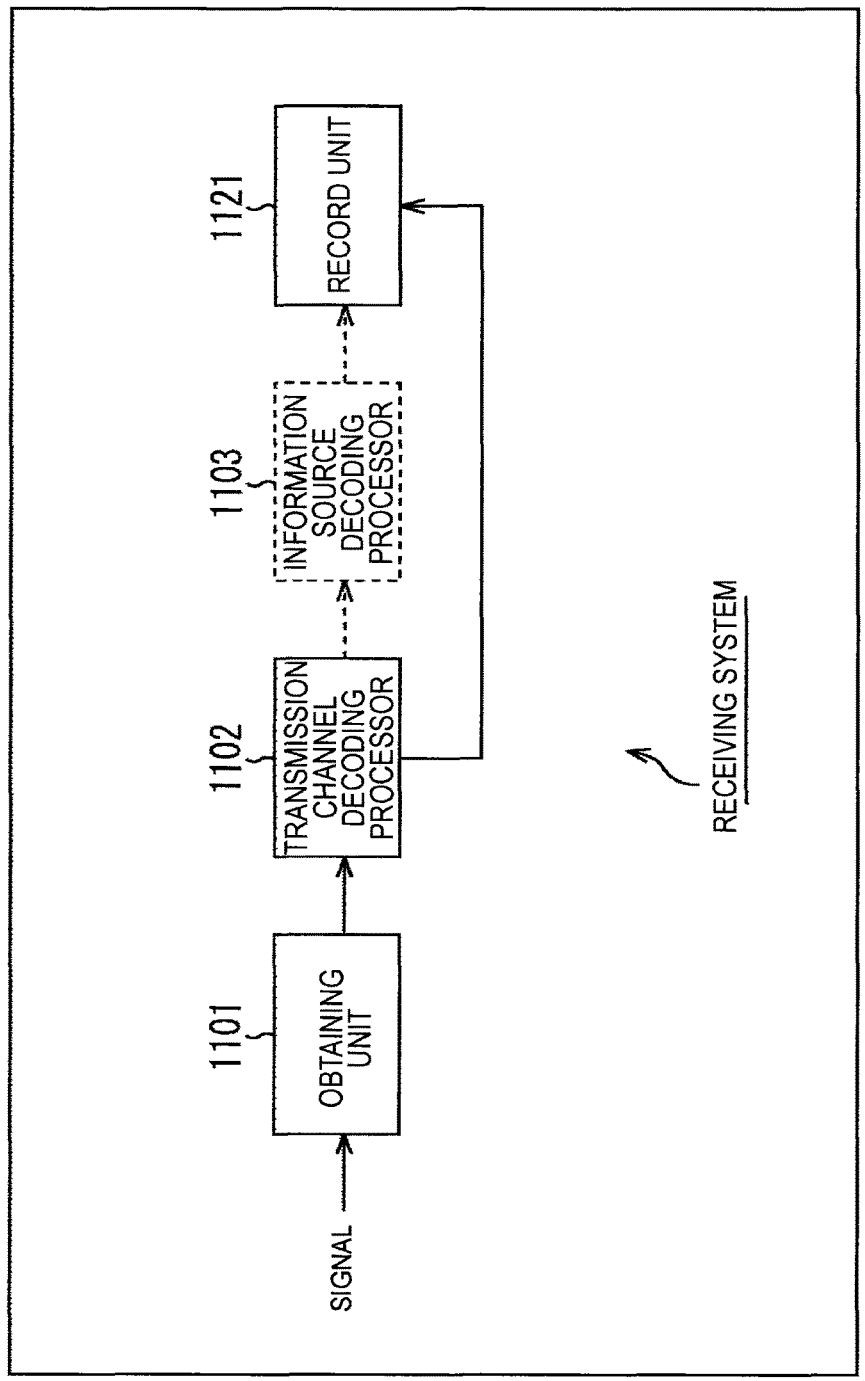
FIG. 63 is a block diagram illustrating a third configuration example of the receiving system to which the receiving device 12 may be applied.

FIG. 63 is a block diagram illustrating a third configuration example of the receiving system to which the receiving device 12 may be applied.

Meanwhile, in the drawing, the same reference sign is assigned to a part corresponding to that in FIG. 61 and the description thereof is hereinafter appropriately omitted.

The receiving system in FIG. 63 is the same as that in FIG. 61 in that this includes the obtaining unit 1101 and the transmission channel decoding processor 1102.

However, the receiving system in FIG. 63 is different from that in FIG. 61 in that the information source decoding processor 1103 is not provided and a record unit 1121 is newly provided.

The record unit 1121 records (stores) the signal output from the transmission channel decoding processor 1102 (for example, a TS packet of MPEG TS) in a recording (storage) medium such as an optical disk, a hard disk (magnetic disk), and a flash memory.

The receiving system in FIG. 63 as described above may be applied to a recorder and the like, which records the television broadcasting.

Meanwhile, in FIG. 63, the receiving system may be provided with the information source decoding processor 1103 and the information source decoding processor 1103 may record the signal to which the information source decoding process is applied, that is to say, the image and the audio obtained by the decoding in the record unit 1121.

[One Embodiment of Computer]

A series of processes described above may be performed by hardware or by software. When a series of processes is performed by the software, a program, which composes the software, is installed on a multi-purpose computer and the like.

Figure 64:
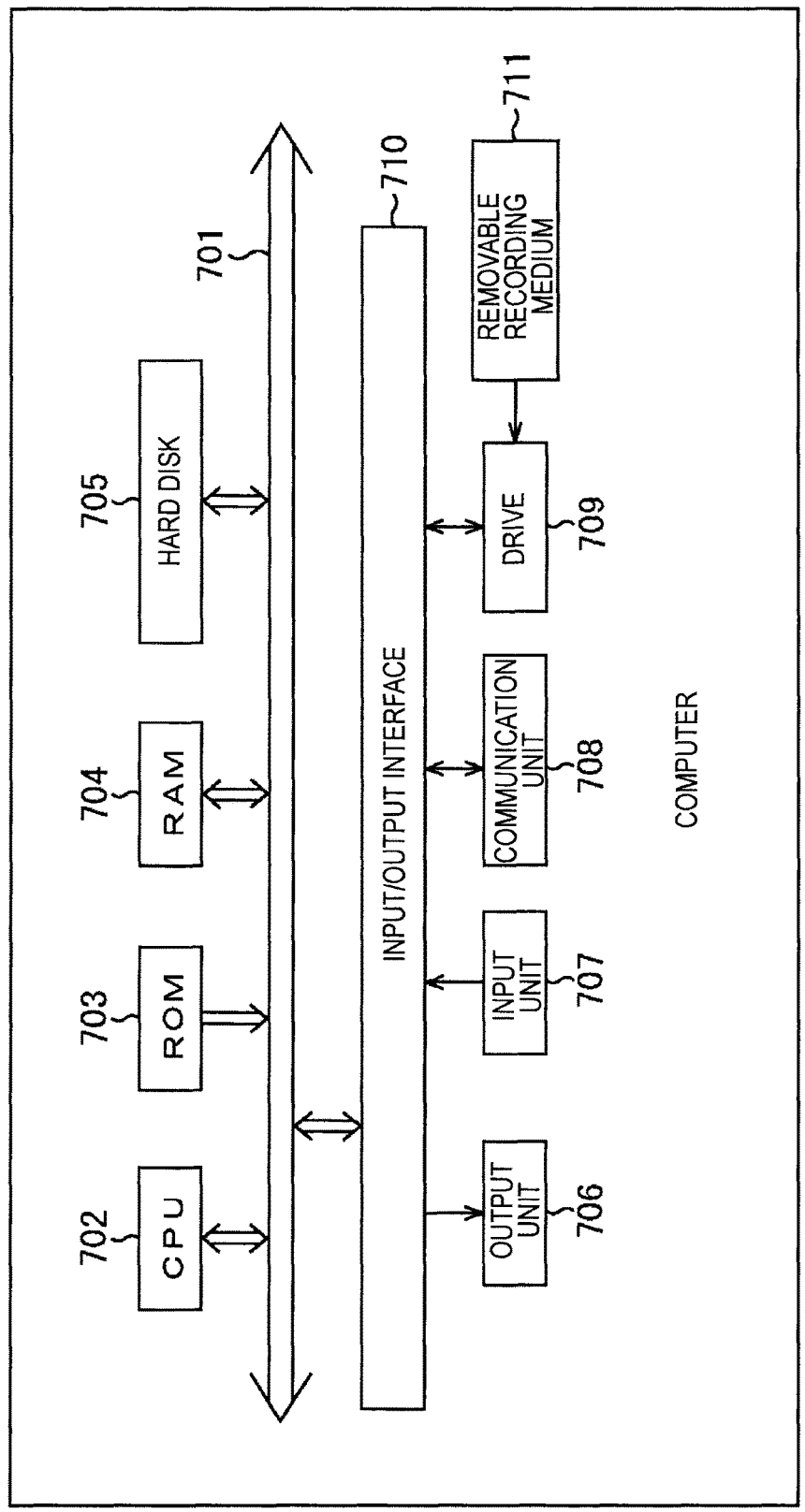
FIG. 64 is a block diagram illustrating a configuration example of one embodiment of a computer to which this technology is applied.

FIG. 64 illustrates a configuration example of one embodiment of the computer on which the program, which executes a series of processes described above, is installed.

The program may be recorded in advance in a hard disk 705 and a ROM 703 as a recording medium stored in the computer.

Alternatively, the program may be temporarily or permanently stored (recorded) in a removable recording medium 711 such as a flexible disk, a CD-ROM (compact disc read only memory), an MO (magnetooptical) disk, a DVD (digital versatile disc), the magnetic disk, and a semiconductor memory. Such removable recording medium 711 may be provided as so-called packaged software.

Meanwhile, in addition to installation from the above-described removable recording medium 711 on the computer, the program may be transferred from a downloading site to the computer by wireless through a satellite for the digital satellite broadcasting or transferred to the computer by wire through the network such as a LAN (local area network) and the Internet, and the computer may receive the program transferred in this manner by a communication unit 708 to install on an internal hard disk 705.

The computer has a CPU (central processing unit) 702 built-in. An input/output interface 710 is connected to the CPU 702 through a bus 701 and, when an instruction is input through the input/output interface 710 by operation and the like of the input unit 707 composed of a keyboard, a mouse, a microphone and the like by a user, the CPU 702 executes the program stored in the ROM (read only memory) 703 according to the same. Alternately, the CPU 702 loads the program stored in the hard disk 705, the program transferred from the satellite or the network to be received by the communication unit 708 and installed on the hard disk 705, or the program read from the removable recording medium 711 mounted on a drive 709 to be installed on the hard disk 705 on a RAM (random access memory) 704 to execute. According to this, the CPU 702 performs the process according to the above-described flowchart or the process performed by the configuration of the above-described block diagram. Then, the CPU 702 outputs a processing result from an output unit 706 composed of an LCD (liquid crystal display), a speaker and the like, or transmits the same from a communication unit 708, or records the same in the hard disk 705 through the input/output interface 710, for example, as needed.

Herein, in this specification, a processing step to write the program to allow the computer to perform various processes is not necessarily required to be processed in chronological order along order described in the flowchart and this also includes the process executed in parallel or individually executed (for example, a parallel process or a process by an object).

Also, the program may be processed by one computer or processed by a plurality of computers. Further, the program may be transferred to a remote computer to be executed.

Also, the embodiment of this technology is not limited to the above-described embodiment and various modifications may be made without departing from the scope of this technology.

That is to say, (the parity check matrix initial value table of) the LDPC code and the like adopted in the digital broadcasting and the like for the mobile terminal described above may be used in the digital broadcasting for the fixed terminal and the like.

REFERENCE SIGNS LIST 11 transmitting device, 12 receiving device, 23 parity interleaver, 24 column twist interleaver, 25 demultiplexer, 31 memory, 32 interchange unit, 54 multiplexer, 55 column twist interleaver, 111 mode adaptation/multiplexer, 112 padder, 113 BB scrambler, 114 BCH encoder, 115 LDPC encoder, 116 bit interleaver, 117 QAM encoder, 118 time interleaver, 119 MISO/MIMO encoder, 120 frequency interleaver, 121 BCH encoder, 122 LDPC encoder, 123 QAM encoder, 124 frequency interleaver, 131 frame builder & resource allocation, 132 OFDM generation, 151 OFDM processor, 152 frame management, 153 frequency deinterleaver, 154 QAM decoder, 155 LDPC decoder, 156 BCH decoder, 161 frequency deinterleaver, 162 MISO/MIMO decoder, 163 time deinterleaver, 164 QAM decoder, 165 bit deinterleaver, 166 LDPC decoder, 167 BCH decoder, 168 BB descrambler, 169 null deletion, 170 demultiplexer, 300 edge data storage memory, 301 selector, 302 check node calculation unit, 303 cyclic shift circuit, 304 edge data storage memory, 305 selector, 306 received data memory, 307 variable node calculation unit, 308 cyclic shift circuit, 309 decoded word calculation unit, 310 received data rearrangement unit, 311 decoded data rearrangement unit, 601 encoding processor, 602 storage unit, 611 code rate set unit, 612 initial value table read unit, 613 parity check matrix generation unit, 614 information bit read unit, 615 encoding parity operation unit, 616 controller, 701 bus, 702 CPU, 703 ROM, 704 RAM, 705 hard disk, 706 output unit, 707 input unit, 708 communication unit, 709 drive, 710 input/output interface, 711 removable recording medium, 1001 inverse interchange unit, 1002 memory, 1011 parity deinterleaver, 1101 obtaining unit, 1101 transmitting channel decoding processor, 1103 information source decoding processor, 1111 output unit, 1121 record unit

The invention claimed is:

1. A receiving device for use in an environment where bit error rate can be reduced for a given received signal-to-noise ratio of a digital television broadcast signal, the receiving device comprising:
 a tuner configured to receive a digital television broadcast signal including a low density parity check (LDPC) code word; and circuitry configured to
    decode the LDPC code word; and
    process the decoded LDPC code word, wherein
input bits of data to be transmitted in the digital television broadcast signal are LDPC encoded according to a parity check matrix initial value table of an LDPC code having a
code length is 16200 bits and code rate is one of 4/15, 7/15, and 8/15 to generate the LDPC code word, the LDPC code enabling error correction processing to correct errors generated in a transmission path of the digital television broadcast signal,
the LDPC code word includes information bits and parity bits, the parity bits being processed by the receiving device to recover information bits corrupted by transmission path errors,
the parity check matrix includes an information matrix part corresponding to the information bits and a parity matrix part corresponding to the parity bits,
the information matrix part is represented by the parity check matrix initial value table, and
the parity check matrix initial value table, having each row indicating positions of elements '1' in corresponding 360 columns of the information matrix portion as a subset of information bits used in calculating the parity bits in the LDPC encoding, is as follows for a code rate of 4/15, the parity check matrix initial value table is

---

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480,

--- for a code rate of 7/15, the parity check matrix initial value table is

---

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542

1223 2148 8195
976 2001 5005, and

--- for a code rate of 8/15, the parity check matrix initial value table is

---

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

---

2. The receiving device according to claim 1, wherein
a $2+360\times(i-1)$-th column of the parity check matrix is a column obtained by cyclic shift of a $1+360\times(i-1)$-th column indicated by the parity check matrix initial value table downward by $q=M/360$,
i represents the number of rows of the parity check matrix initial table, and
M represents a parity length.

3. The receiving device according to claim 1, wherein the code rate is 4/15.

4. The receiving device according to claim 1, wherein the code rate is 7/15.

5. The receiving device according to claim 1, wherein the code rate is 8/15.

6. The receiving device according to claim 1, wherein the receiving device is a television receiver.

7. The receiving device according to claim 1, wherein the code length is represented by N, the code rate is represented by r, the information bits have a length K equal to $N\times r=8460$ bits, and
the information matrix part is a matrix of dimension $(N-K)\times K$ and the parity matrix part is a matrix of dimension $(N-K)\times(N-K)$.

8. The receiving device according to claim 1, wherein the parity matrix part has a stepwise structure, in which elements of "1" are arranged in a stepwise manner.

9. A method for use in an environment where bit error rate can be reduced for a given received signal-to-noise ratio of a digital television broadcast signal, the method comprising:
    receiving, by a tuner, a digital television broadcast signal including a low density parity check (LDPC) code word; and
    decoding the LDPC code word; and processing the decoded LDPC code word, wherein
input bits of data to be transmitted in the digital television broadcast signal are LDPC encoded according to a parity check matrix initial value table of an LDPC code having a code length is 16200 bits and code rate is one of 4/15, 7/5, and 8/15 to generate the LDPC code word, the LDPC code enabling error correction processing to correct errors generated in a transmission path of the digital television broadcast signal,
the LDPC code word includes information bits and parity bits, the parity bits being processed by a receiving device implementing the receiving method to recover information bits corrupted by transmission path errors,
the parity check matrix includes an information matrix part corresponding to the information bits and a parity matrix part corresponding to the parity bits,
the information matrix part is represented by the parity check matrix initial value table, and
the parity check matrix initial value table, having each row indicating positions of elements '1' in corresponding 360 columns of the information matrix portion as a subset of information bits used in calculating the parity bits in the LDPC encoding, is as follows for a code rate of 4/15, the parity check matrix initial value table is

---

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480,

--- for a code rate of 7/15, the parity check matrix initial value table is

---

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242
1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and

--- for a code rate of 8/15, the parity check matrix initial value table is

---

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

---

10. The method according to claim 9, wherein
a 2+360×(i−1)-th column of the parity check matrix is a column obtained by cyclic shift of a 1+360×(i−1)-th column indicated by the parity check matrix initial value table downward by q=M/360,
i represents the number of rows of the parity check matrix initial table, and
M represents a parity length.

11. The method according to claim 9, wherein the code rate is 4/15.

12. The method according to claim 9, wherein the code rate is 7/15.

13. The method according to claim 9, wherein the code rate is 8/15.

14. The method according to claim 9, wherein the receiving method is implemented by a television receiver.

15. The method according to claim 9, wherein the code length is represented by N, the code rate is represented by r, the information bits have a length K equal to N×r=8460 bits, and
the information matrix part is a matrix of dimension (N−K)×K and the parity matrix part is a matrix of dimension (N−K)×(N−K).

16. The method according to claim 9, wherein the parity matrix part has a stepwise structure, in which elements of "1" are arranged in a stepwise manner.

17. A transmitting device for generating a digital television broadcast signal, the transmitting device configured to reduce bit error rate for a given received signal-to-noise ratio of a digital television broadcast signal, the transmitting device comprising:
circuitry configured to
receive data to be transmitted in a digital television broadcast signal; and
perform low density parity check (LDPC) encoding by an LDPC encoder circuit on input bits of the received data according to a parity check matrix of an LDPC code in which a code length N is 16200 bits and an encoding rate r is one of 4/15, 7/15, and 8/15 to generate an LDPC code word, the LDPC code enabling error correction processing to correct errors generated in a transmission path of the digital television broadcast signal, the LDPC code word includes information bits and parity bits, the parity bits being processed by the receiving device to recover information bits corrupted by transmission path errors, the parity check matrix includes an information matrix part corresponding to the information bits and a parity matrix part corresponding to the parity bits, the information matrix part is represented by the parity check matrix initial value table, and the parity check matrix initial value table, having each row indicating positions of elements '1' in corresponding 360 columns of the information matrix portion as a subset of information bits used in calculating parity bits in the LDPC encoding, is as follows for a code rate of 4/15, the parity check matrix initial value table is

---

1953 2331 2545 2623 4653 5012 5700 6458 6875 7605 7694 7881 8416 8758 9181 9555 9578 9932 10068 11479 11699
514 784 2059 2129 2386 2454 3396 5184 6624 6825 7533 7861 9116 9473 9601 10432 11011 11159 11378 11528 11598
483 1303 1735 2291 3302 3648 4222 4522 5511 6626 6804 7404 7752 7982 8108 8930 9151 9793 9876 10786 11879
1956 7572 9020 9971
13 1578 7445 8373
6805 6857 8615 11179
7983 8022 10017 11748
4939 8861 10444 11661
2278 3733 6265 10009
4494 7974 10649
8909 11030 11696
3131 9964 10480,

--- for a code rate of 7/15, the parity check matrix initial value table is

---

3 137 314 327 983 1597 2028 3043 3217 4109 6020 6178 6535 6560 7146 7180 7408 7790 7893 8123 8313 8526 8616 8638
356 1197 1208 1839 1903 2712 3088 3537 4091 4301 4919 5068 6025 6195 6324 6378 6686 6829 7558 7745 8042 8382 8587 8602
18 187 1115 1417 1463 2300 2328 3502 3805 4677 4827 5551 5968 6394 6412 6753 7169 7524 7695 7976 8069 8118 8522 8582
714 2713 2726 2964 3055 3220 3334 3459 5557 5765 5841 6290 6419 6573 6856 7786 7937 8156 8286 8327 8384 8448 8539 8559
3452 7935 8092 8623
56 1955 3000 8242

---

1809 4094 7991 8489
2220 6455 7849 8548
1006 2576 3247 6976
2177 6048 7795 8295
1413 2595 7446 8594
2101 3714 7541 8531
10 5961 7484
3144 4636 5282
5708 5875 8390
3322 5223 7975
197 4653 8283
598 5393 8624
906 7249 7542
1223 2148 8195
976 2001 5005, and

--- for a code rate of 8/15, the parity check matrix initial value table is

---

32 384 430 591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
574 1461 1826 2056 2069 2387 2794 3349 3366 4951 5826 5834 5903 6640 6762 6786 6859 7043 7418 7431 7554
14 178 675 823 890 930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
272 1015 7464.

---

* * * * *